(12) United States Patent
Chen et al.

(10) Patent No.: US 12,114,509 B2
(45) Date of Patent: Oct. 8, 2024

(54) FERAM DECOUPLING CAPACITOR

(71) Applicant: Taiwan Semiconductor Manufacturing Co., Ltd., Hsinchu (TW)

(72) Inventors: Tzu-Yu Chen, Kaohsiung (TW); Kuo-Chi Tu, Hsinchu (TW); Fu-Chen Chang, New Taipei (TW); Chih-Hsiang Chang, Taichung (TW); Sheng-Hung Shih, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 125 days.

(21) Appl. No.: 17/712,495

(22) Filed: Apr. 4, 2022

(65) Prior Publication Data

US 2022/0231034 A1    Jul. 21, 2022

Related U.S. Application Data

(62) Division of application No. 16/780,418, filed on Feb. 3, 2020, now Pat. No. 11,296,099.

(60) Provisional application No. 62/881,133, filed on Jul. 31, 2019.

(51) Int. Cl.
*H01L 21/00* (2006.01)
*G11C 11/22* (2006.01)
*H01L 49/02* (2006.01)
*H10B 53/10* (2023.01)
*H10B 53/30* (2023.01)

(52) U.S. Cl.
CPC .......... *H10B 53/30* (2023.02); *G11C 11/221* (2013.01); *H01L 28/56* (2013.01); *H01L 28/75* (2013.01); *H10B 53/10* (2023.02)

(58) Field of Classification Search
CPC ...... H10B 53/30; H10B 53/10; G11C 11/221; H01L 128/56; H01L 28/75
See application file for complete search history.

(56) References Cited

U.S. PATENT DOCUMENTS

| | | | |
|---|---|---|---|
| 7,186,569 B2* | 3/2007 | Rinerson | H10B 53/30 438/785 |
| 8,279,008 B2 | 10/2012 | Hsieh et al. | |
| 8,427,240 B2 | 4/2013 | Hsieh et al. | |
| 8,593,206 B2 | 11/2013 | Chen et al. | |
| 8,605,523 B2 | 12/2013 | Tao et al. | |
| 8,610,494 B1 | 12/2013 | Jin et al. | |
| 8,618,631 B2 | 12/2013 | Jin et al. | |
| 8,630,132 B2 | 1/2014 | Cheng et al. | |
| 8,753,952 B2 | 6/2014 | Summerfelt et al. | |
| 8,760,948 B2 | 6/2014 | Tao et al. | |

(Continued)

*Primary Examiner* — Richard A Booth
(74) *Attorney, Agent, or Firm* — Slater Matsil, LLP

(57) ABSTRACT

In an embodiment, a structure includes one or more first transistors in a first region of a device, the one or more first transistors supporting a memory access function of the device. The structure includes one or more ferroelectric random access memory (FeRAM) capacitors in a first inter-metal dielectric (IMD) layer over the one or more first transistors in the first region. The structure also includes one or more metal-ferroelectric insulator-metal (MFM) decoupling capacitors in the first IMD layer in a second region of the device. The MFM capacitors may include two or more capacitors coupled in series to act as a voltage divider.

20 Claims, 39 Drawing Sheets

(56) References Cited

U.S. PATENT DOCUMENTS

| | | |
|---|---|---|
| 9,601,545 B1 | 3/2017 | Tu et al. |
| 2008/0122032 A1* | 5/2008 | Tu .................... H01L 28/55 |
| | | 257/532 |
| 2010/0065944 A1 | 3/2010 | Tu et al. |
| 2012/0092230 A1 | 4/2012 | Hung et al. |
| 2013/0234305 A1 | 9/2013 | Lin et al. |
| 2014/0032871 A1 | 1/2014 | Hsu et al. |
| 2014/0132333 A1 | 5/2014 | Jin et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0217546 A1 | 8/2014 | Yen et al. |
| 2014/0233330 A1 | 8/2014 | Ko et al. |
| 2014/0241077 A1 | 8/2014 | Katoch et al. |
| 2014/0253262 A1 | 9/2014 | Hsieh et al. |
| 2014/0253391 A1 | 9/2014 | Yen |
| 2014/0269114 A1 | 9/2014 | Yang et al. |

\* cited by examiner

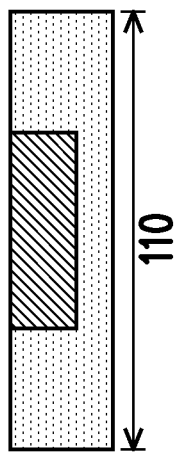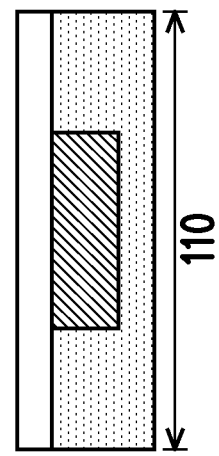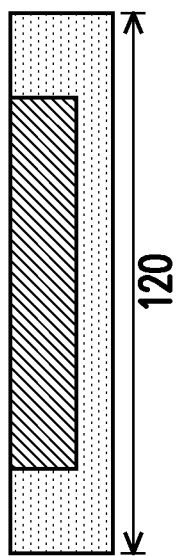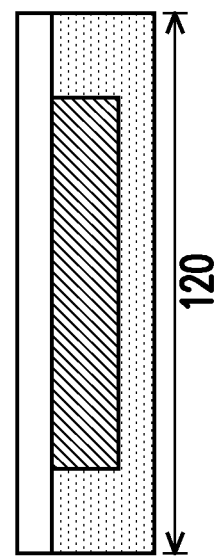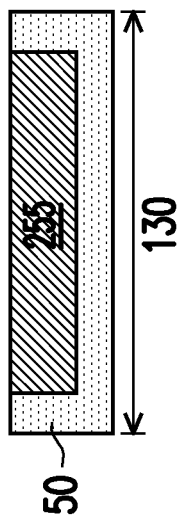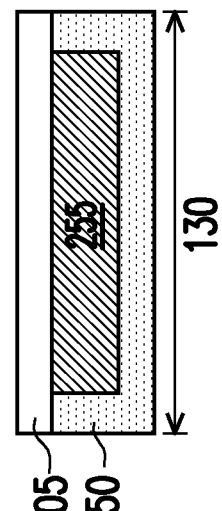
FIG. 17
FIG. 18

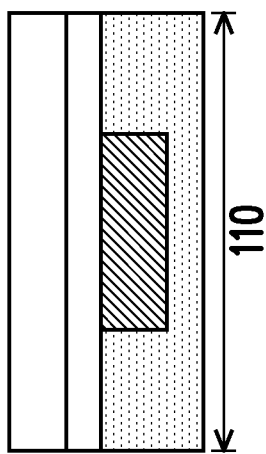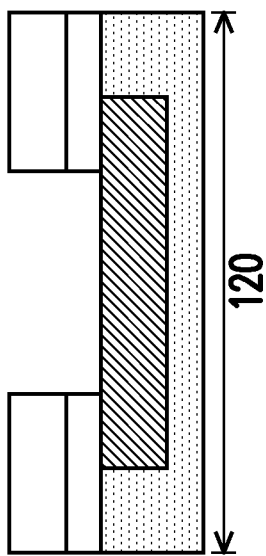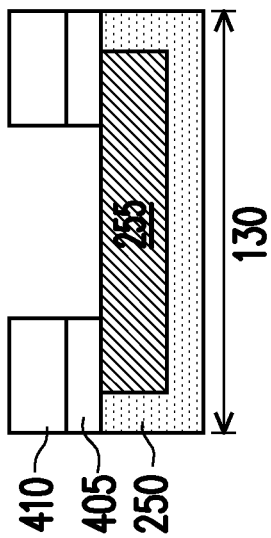
FIG. 19
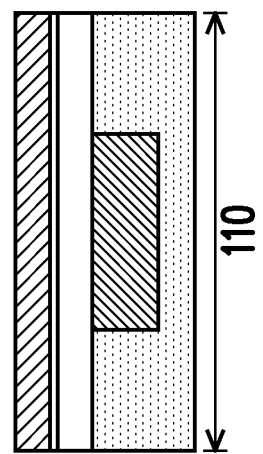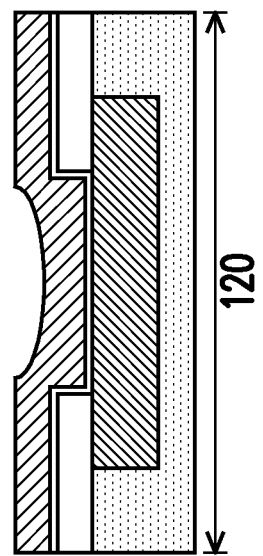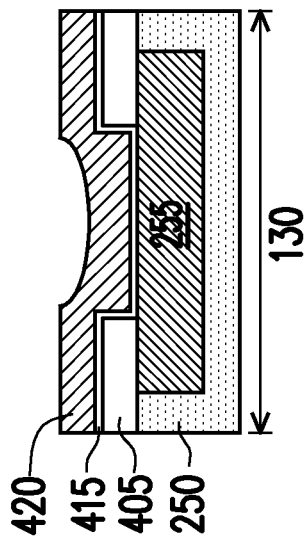
FIG. 20

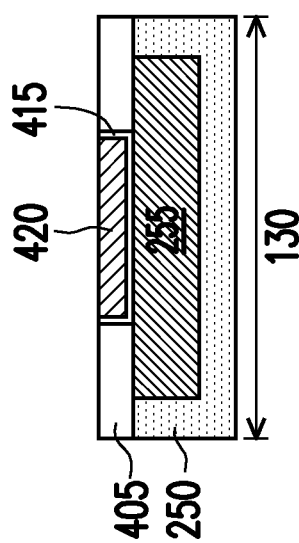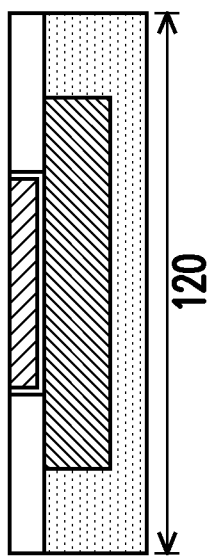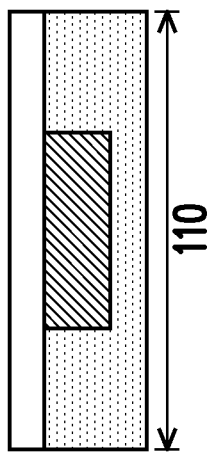
FIG. 21
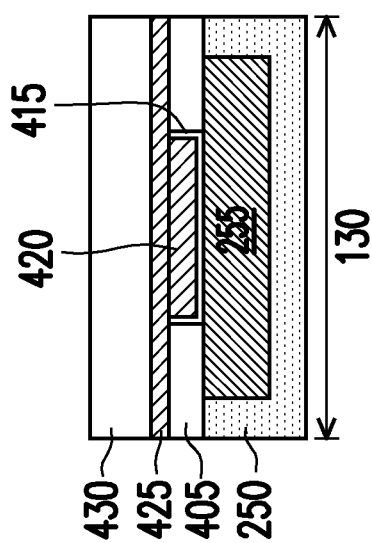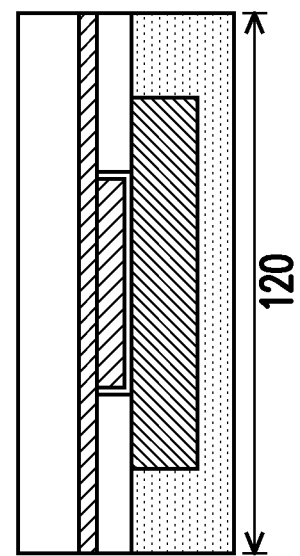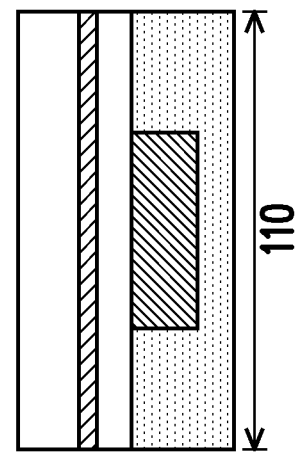
FIG. 22

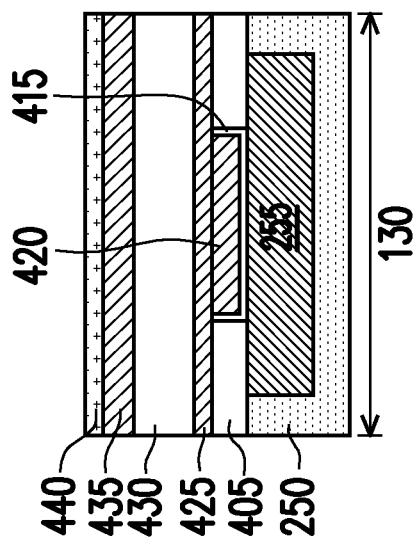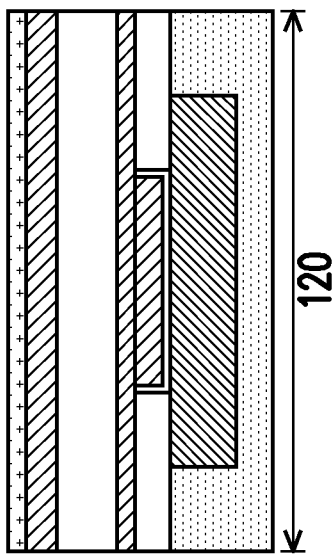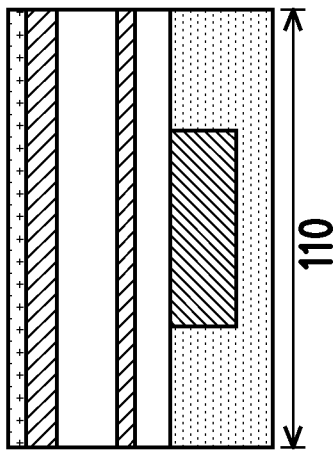
FIG. 23
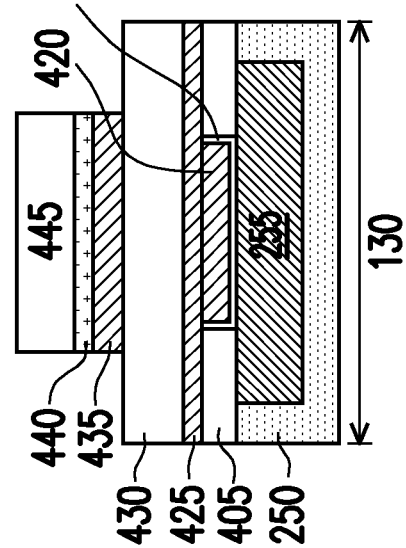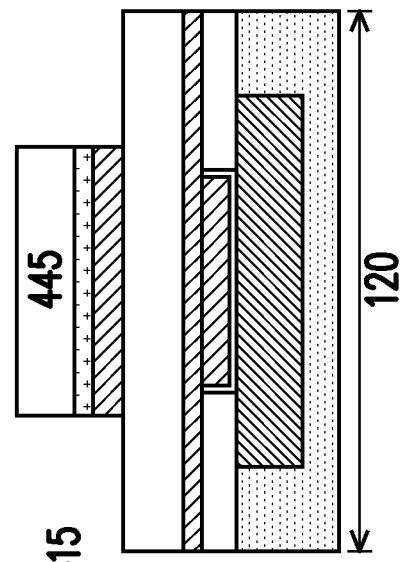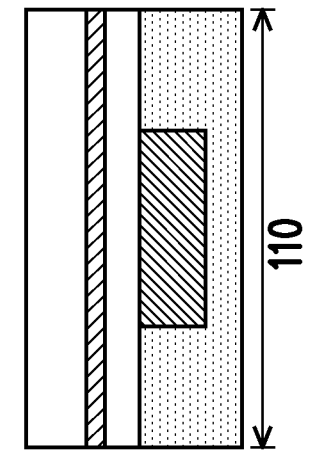
FIG. 24

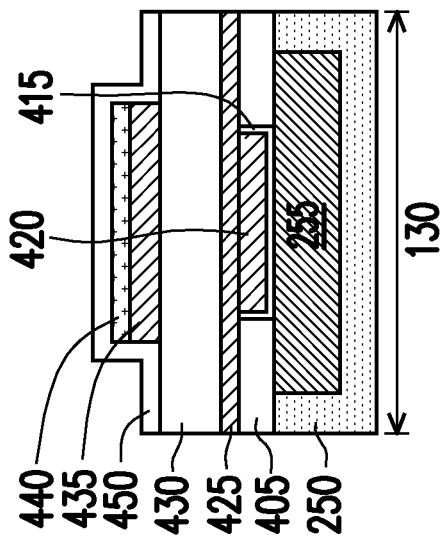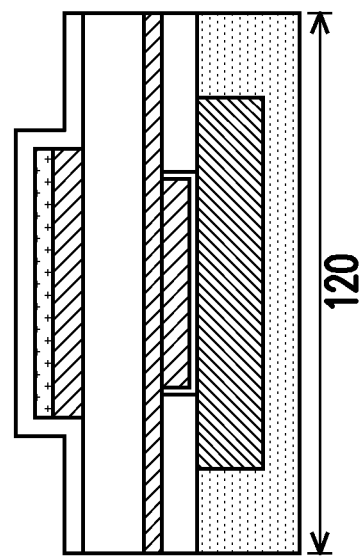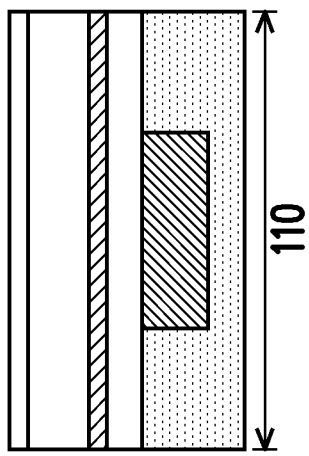
FIG. 25
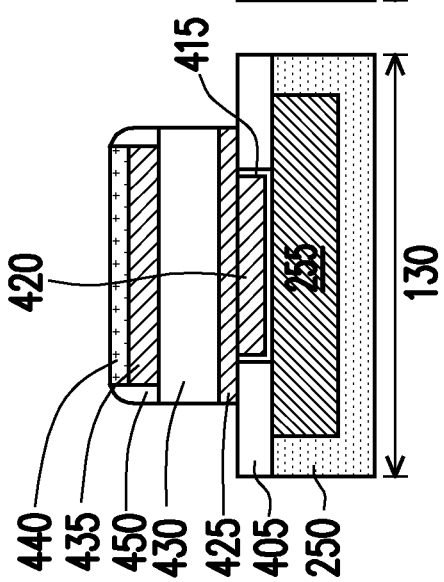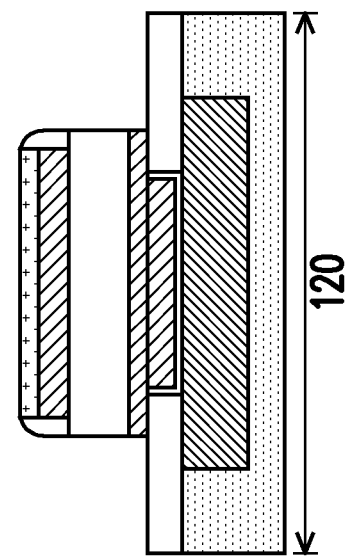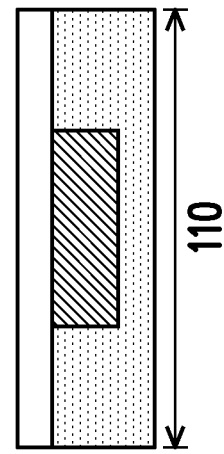
FIG. 26

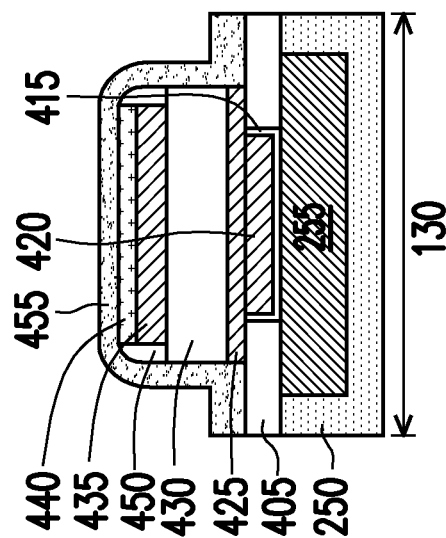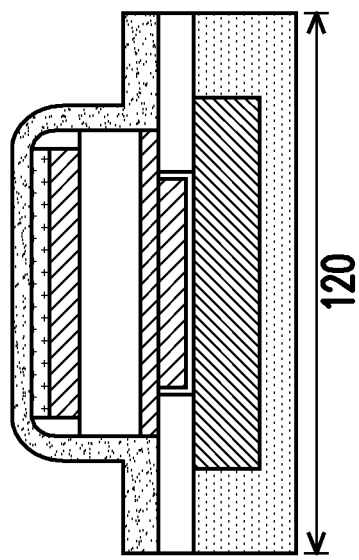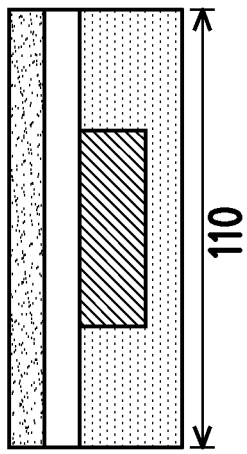
FIG. 27
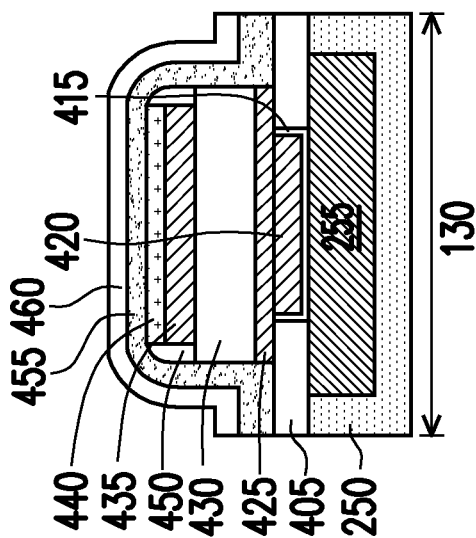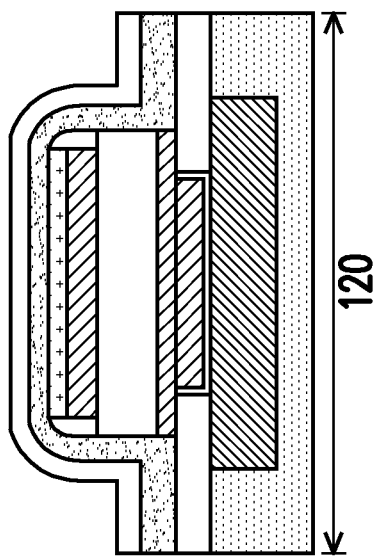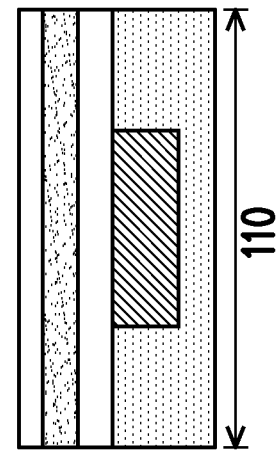
FIG. 28

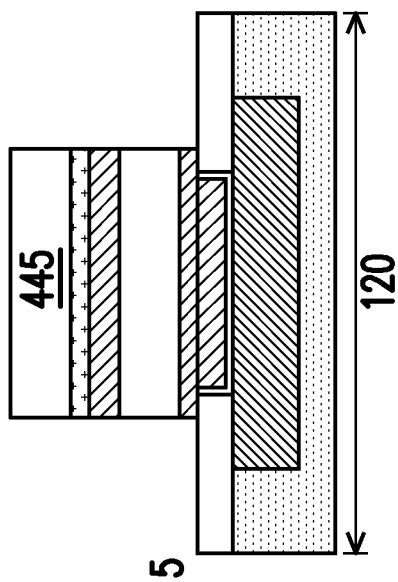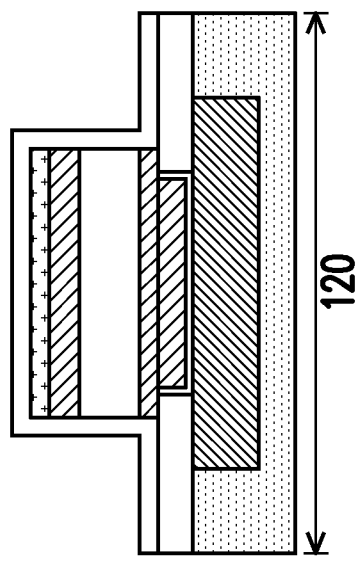
FIG. 40
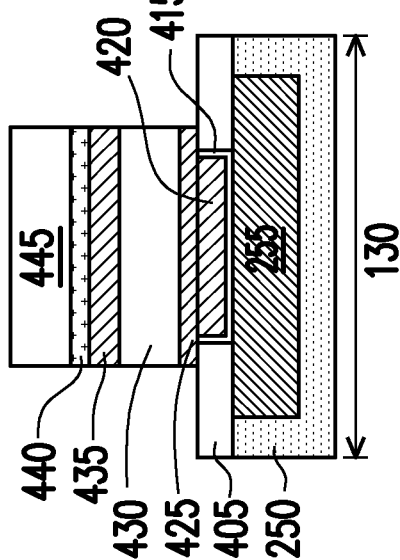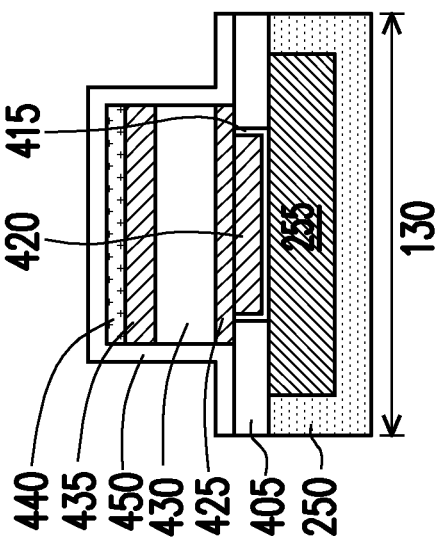
FIG. 41

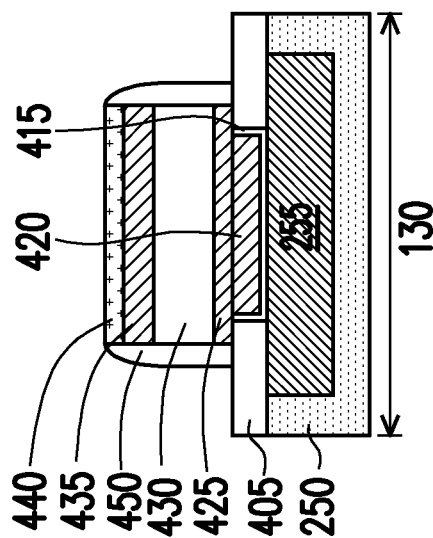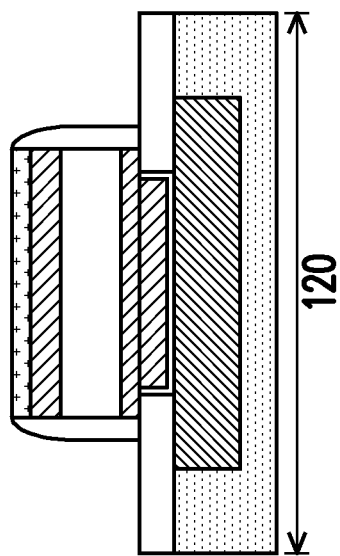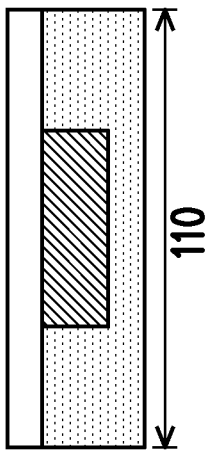
FIG. 42
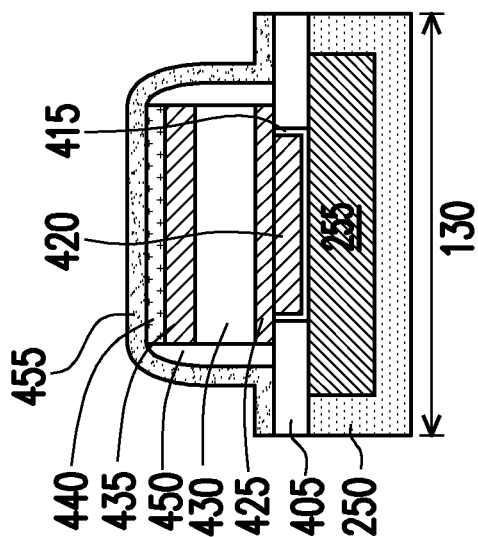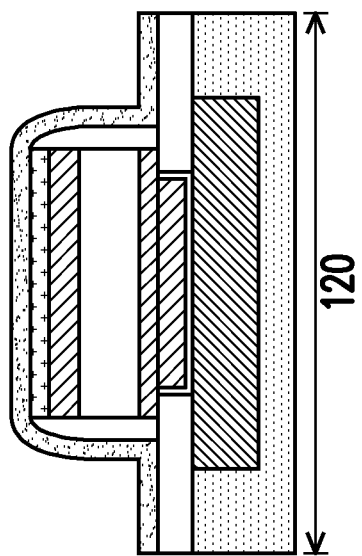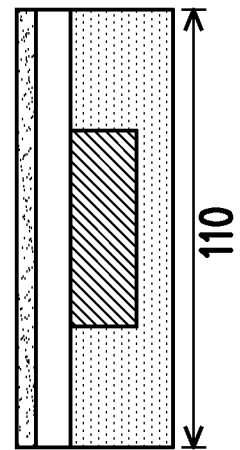
FIG. 43

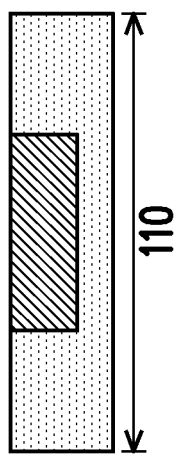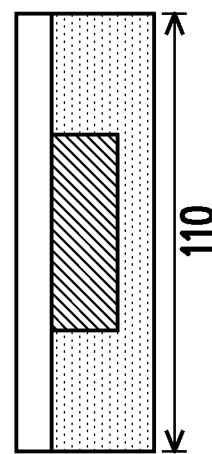
FIG. 46
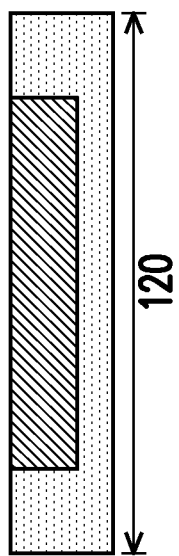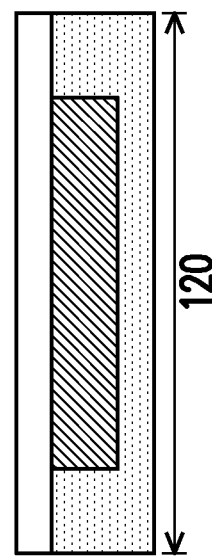
FIG. 47

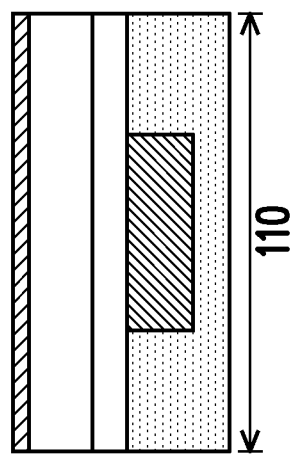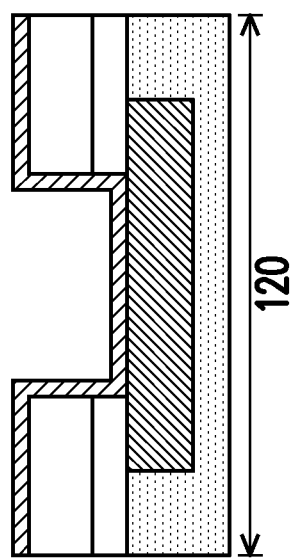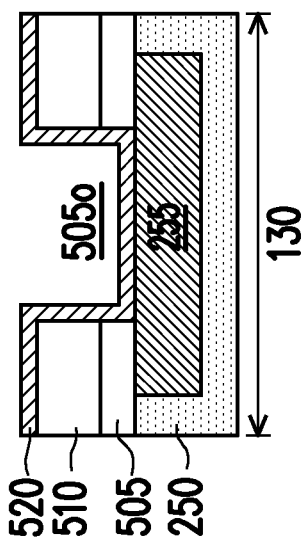
FIG. 50
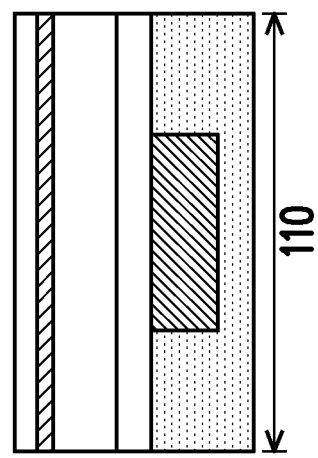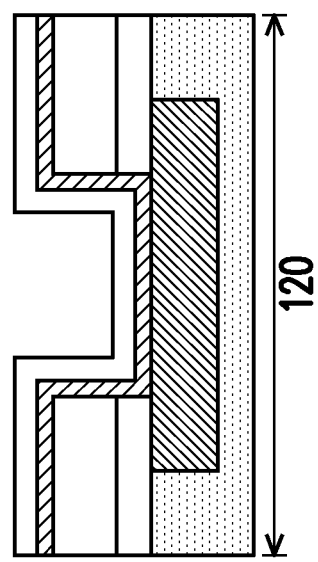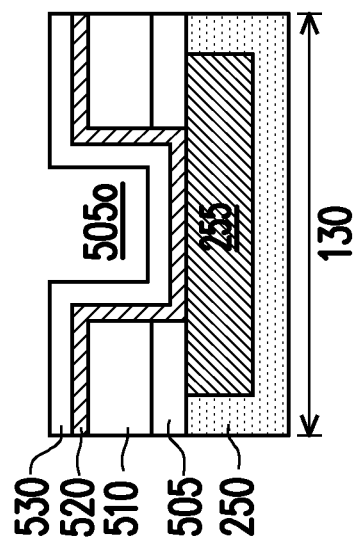
FIG. 51

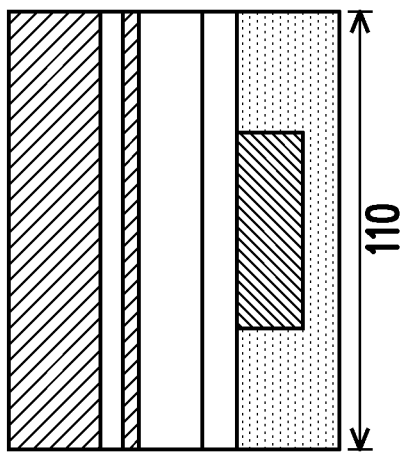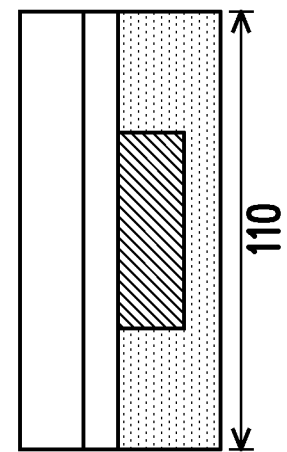
FIG. 52
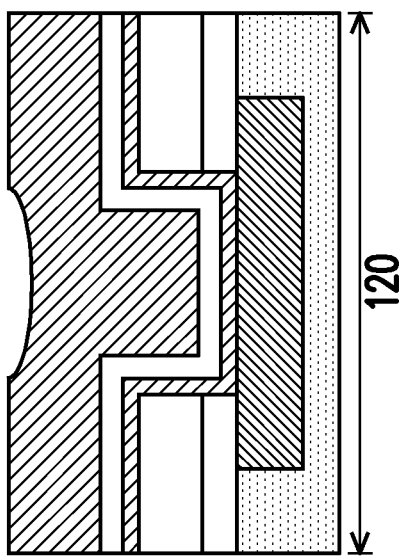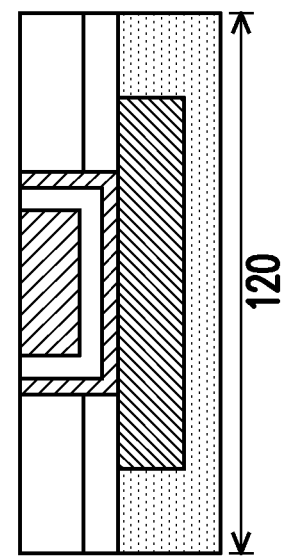
FIG. 53

FERAM DECOUPLING CAPACITOR

PRIORITY CLAIM AND CROSS-REFERENCE

This application is a divisional of U.S. patent application Ser. No. 16/780,418, filed on Feb. 3, 2020, which claims the benefit of U.S. Provisional Patent Application No. 62/881,133, entitled "FeRAM Decoupling Capacitor," filed on Jul. 31, 2019, which application is incorporated herein by reference.

BACKGROUND

Metal-insulator-Metal (MiM) capacitors have been widely used in functional circuits such as mixed signal circuits, analog circuits, Radio Frequency (RF) circuits, Dynamic Random Access Memories (DRAMs), embedded DRAMs, and logic operation circuits. In system-on-chip applications, different capacitors for different functional circuits have to be integrated on a same chip to serve different purposes. For example, in mixed-signal circuits, capacitors are used as decoupling capacitors and high-frequency noise filters. For DRAM and embedded DRAM circuits, capacitors are used for memory storage, while for RF circuits, capacitors are used in oscillators and phase-shift networks for coupling and/or bypassing purposes. For microprocessors, capacitors are used for decoupling. The traditional way to combine these capacitors on a same chip is to fabricate them in different metal layers.

Decoupling capacitors are used to decouple some parts of electrical networks from others. Noise caused by certain circuit elements is shunted through the decoupling capacitors, hence reducing the effect of the noise-generating circuit elements on adjacent circuits. In addition, Decoupling capacitors are also used in power supplies, so that the power supplies may accommodate the variations in current-draw, so that the variation in power supply voltage is minimized. When the current-draw in a device changes, the power supply itself cannot respond to the change instantaneously. The decoupling capacitors thus may act as power storages to maintain power supply voltages in response to the current-draw at frequencies ranging from hundreds of kilo-hertz to hundreds of mega-hertz.

Typically, a random access memory (RAM) includes memory cells that each store a bit "0" or "1" of data when a write operation is performed thereon that can be retrieved later by performing a read operation. In RAMs, the amount of time to write data thereto is about the same as the amount of time to read data therefrom. A RAM can be volatile or non-volatile. The volatile RAM requires power to retain data stored therein. As opposed to the volatile RAM, the non-volatile RAM ensures data retention even after the power is removed. The memory cells of the volatile RAM, such as a dynamic RAM (DRAM), each include a capacitor that is either in a charged state or a discharged state. These two states represent the two bits of data. However, the capacitor always discharges and will eventually lose its charge, unless the DRAM is periodically refreshed

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17 through 34 illustrate intermediate steps of forming an MFM decoupling capacitor of a decoupling capacitor structure and an FeRAM structure of an FeRAM cell region of a SOC, in accordance with some embodiments.

FIGS. 40 through 45 illustrate intermediate steps of forming an MFM decoupling capacitor of a decoupling capacitor structure and an FeRAM structure of an FeRAM cell region of a SOC, in accordance with some embodiments.

FIGS. 46 through 54 and FIG. 55 illustrate intermediate steps of forming an MFM decoupling capacitor of a decoupling capacitor structure and an FeRAM structure of an FeRAM cell region of a SOC, in accordance with some embodiments.

DETAILED DESCRIPTION

Figure 1:
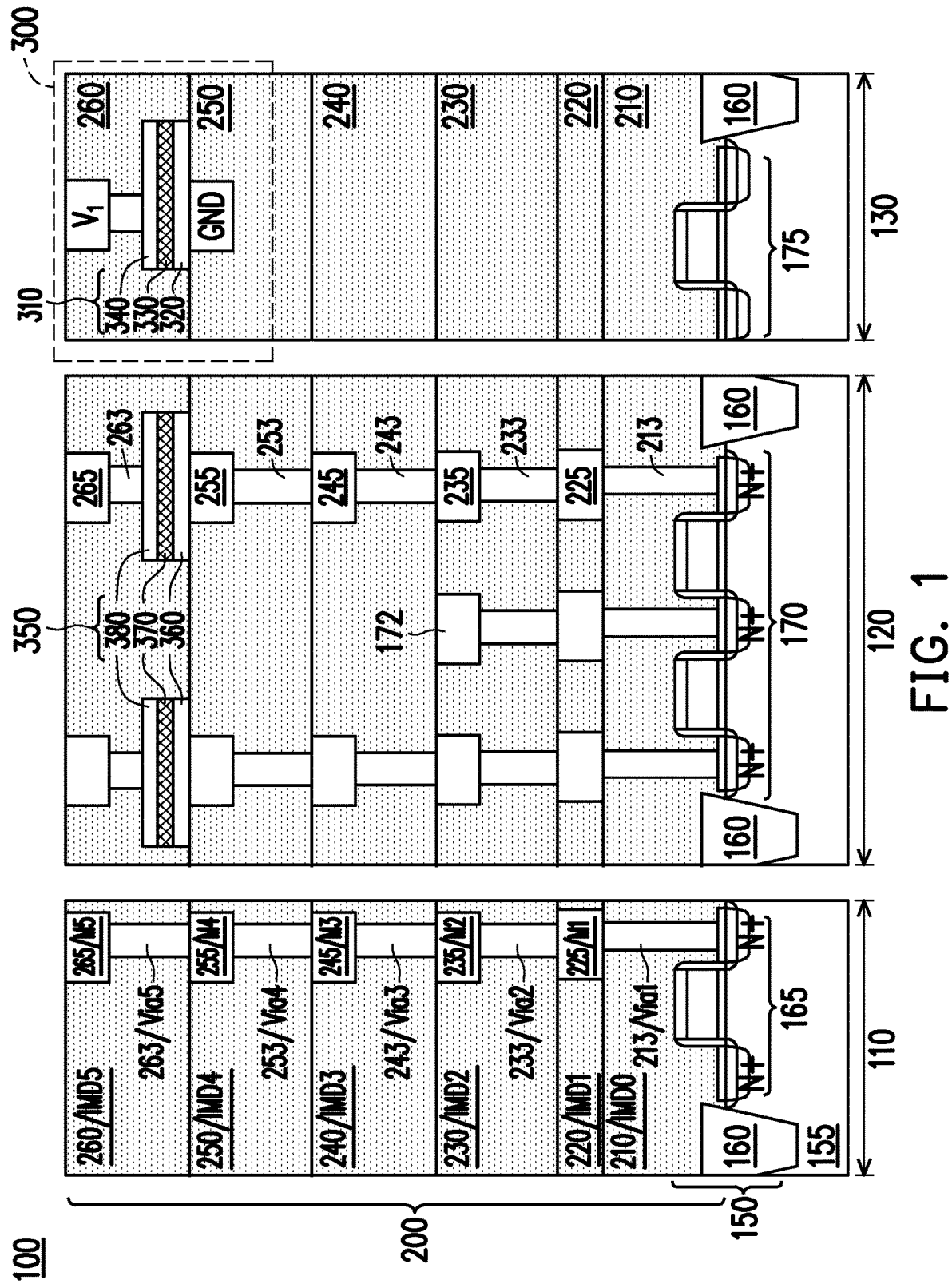
FIG. 1 illustrates a system-on-chip (SOC), in accordance with some embodiments, which may include a plurality of regions.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a memory and a decoupling capacitor. Embodiments of the present disclosure may be used in conjunction with a system on chip (SOC) or other device which includes an embedded memory device. Embodiments include a memory device which includes an array of ferroelectric random access memory (FeRAM) cells. Each of the FeRAM cells includes a metal-ferroelectric insulator-metal (MFM) capacitor and an access transistor. In some embodiments, the access transistor may include a metal-oxide-semiconductor (MOS) transistor which includes a substrate, a pair of source and drain regions, and a gate disposed above the substrate and between the source and drain regions. The MFM capacitor is a particular type of metal-insulator-metal (MIM) capacitor and includes a ferroelectric thin film disposed between two metal electrodes. Even if the disclosure refers to an SOC, it should be understood that embodiments of the present disclosure may be used in conjunction with any FeRAM device.

Initially, the ferroelectric thin film of the MFM capacitor has no polarity. However, when the access transistor is switched by a write signal, a write voltage is applied to the ferroelectric thin film material of the MFM capacitor and a forward or reverse polarity is established in the ferroelectric thin film such that one side thereof is positive and another side thereof is negative. Thereafter, when a read voltage is applied to the gate material of the MFS transistor, a relatively high drain current, e.g., about 8 mA to about 20 mA, or a relatively low or approximately no drain current, e.g., 0 mA to about 0.1 mA, flows through a channel between the source and drain regions. These two drain currents represent bits "0" and "1" of data, whereby data are stored in a FeRAM.

In embodiments, a MFM decoupling capacitor is formed simultaneously with the MFM capacitor of the FeRAM cell, and has the same structure configuration as the MFM capacitor of the FeRAM cell. By forming the MFM capacitor of the FeRAM cell and the MFM decoupling capacitor simultaneously and with the same materials, time and money are saved compared to forming them separately and/or with different materials.

In some embodiments, however, a modern MFM capacitor's dielectric layer reliability (such as time-dependent dielectric breakdown TDDB) may limit the MFM decoupling capacitor application space. For example, MFM capacitor reliability guarantees stress voltage must remain under 0.8 V. But the design power input level may be over these criteria, which would lead to premature failure. Embodiments address these issues by including options to incorporate multiple MFM decoupling capacitors in series to divide the input voltage among multiple MFM decoupling capacitors.

Figure 2:
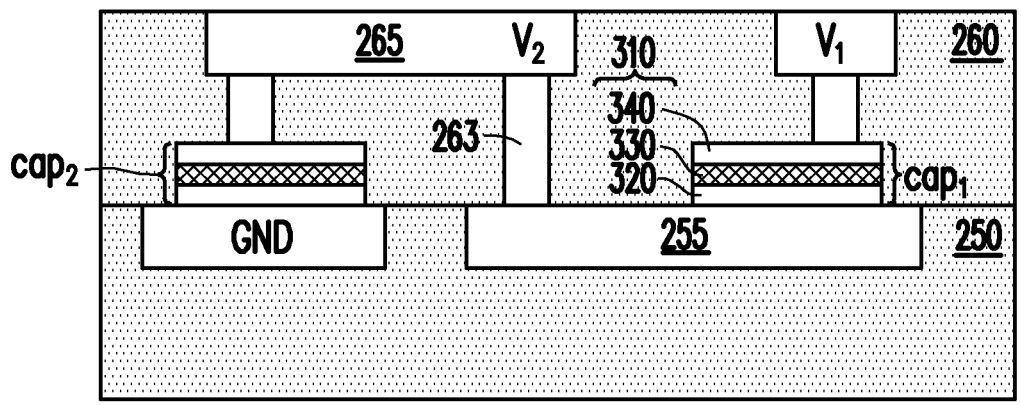
FIGS. 2 through 13 illustrate various embodiments of a decoupling capacitor structure of a SOC.

FIG. 2 notes various aspects, in accordance with embodiments. In embodiments, single or series MFM decoupling capacitors can integrate with embedded FeRAM process which has no extra masks and process. In some embodiments, series connected MFM decoupling capacitors can divide the input signal VDD into 1/n VDD between two decoupling capacitors. As a result, each MFM decoupling capacitor experiences less stress voltage and the application opportunity of the MFM decoupling capacitors may be extended to be a more effective solution. Using series connected MFM decoupling capacitors may also reduce chip area by this integrated approach and thereby reduce cost.

FIG. 1 illustrates a system-on-chip (SOC) 100, in accordance with some embodiments, which may include a plurality of regions fabricated on a single substrate. The structure and operation of the SOC 100 in FIG. 1 will first be described generally, which may be applied to each of the embodiments described below. The SOC 100 may include a logic region and/or peripheral region (for simplicity, referred to as the logic region 110), a FeRAM cell region 120, and a decoupling capacitor region 130. The logic region 110 may include circuitry and peripheral devices, such as the example transistor 165. The logic region 110 may use or control data stored in the FeRAM cell region 120 or perform other functions. It should be understood that the cross-sectional view of FIG. 1 includes features in a single plane for simplicity, but that these features may be formed in other planes. It should also be understood that the illustrated regions need not be contiguous.

The FeRAM cell region 120 may be used to hold a binary piece of data, or a bit, by altering the properties of a ferroelectric insulating layer of a capacitor memory element in such a way so as to alter the resistance of the layer. A bit may be encoded by setting the resistance of the dielectric layer to a relatively high resistance state or a relatively low resistance state, with a value of one assigned to one state and a value of zero assigned to the other state. The FeRAM cell region 120 may include one or more metal-ferroelectic insulator-metal (MFM) structures (referred to as FeRAM structures 350) that serve as memory elements of the FeRAM cell region 120. Each FeRAM structure 350 may include a bottom electrode 360 and top electrode 380, with a ferroelectric insulating layer 370 sandwiched in between the bottom electrode 360 and the top electrode 380. The FeRAM cell region 120 may also include access transistors 170 which are used to read and/or write the charge in the FeRAM structures 350. FIG. 1 also depicts dopant profiles associated with the example transistor 165 and access transistor 170, which are merely examples and non-limiting.

The decoupling capacitor area 130 includes one or more MFM decoupling capacitors 310 which may be formed layer-by-layer simultaneously with the FeRAM structures 350 of the FeRAM cell region 120. The one or more MFM decoupling capacitors 310 may each include a bottom electrode 320 and top electrode 340, with a ferroelectric insulating layer 330 sandwiched in between the bottom electrode 320 and the top electrode 340. In some embodiments, the decoupling capacitor area 130 may be in a dummy area of the SOC 100. In such embodiments, the transistor structure 175 may be a dummy transistor structure. In other embodiments, the decoupling capacitor area 130 may be in an active region and/or peripheral region of the SOC 100. In such embodiments, the transistor structure 175 may be an active device which can be used for logic or peripheral functions of the SOC 100.

The one or more MFM decoupling capacitors 310 are surrounded by a dashed box which represents a decoupling capacitor structure 300. The MFM decoupling capacitor 310 of FIG. 1 is illustrated as one decoupling capacitor of one or more MFM decoupling capacitors 310 of the decoupling capacitor structure 300. Other embodiments include other arrangements of the one or more MFM decoupling capacitors 310 of the decoupling capacitor structure 300. These structures are discussed in greater detail in conjunction with FIGS. 2 through 13.

The decoupling capacitor structure 300 may be used in a circuit of the SOC 100 to provide decoupled voltage for one or more devices of the SOC 100. The decoupling capacitor structure 300 may be connected to other elements of the SOC, such as the example transistor 165, a logic component, or other elements that are not depicted in the Figures, by contact with metallization layers. As depicted in FIG. 1, for example, the MFM decoupling capacitor 310 may be coupled to other features of the SOC 100 by contact with the M5 metallization layer 265 and M4 metallization layer 255 and thus is embedded or disposed within an insulating layer (described in greater detail below) of the interconnect 200. In some embodiments, the decoupling capacitor structure 300 may be used to decouple a voltage signal to or from a separate device formed apart from the SOC 100 and electrically coupled thereto.

Other features depicted in FIG. 1 include shallow-trench isolation (STI) features 160 and an interconnect 200 which is formed over the logic region 110, FeRAM cell region 120, and the decoupling capacitor region 130. Interconnect 200 includes metallization layers, inter-metal dielectric (IMD) layers, and vias coupling the metallization layers to each other and other components. As depicted, the interconnect 200 of SOC 100 is fabricated using five metallization layers, including metallization layer 225 (or M1), metallization layer 235 (or M2), metallization layer 245 (or M3), metallization layer 255 (or M4), and metallization layer 265 (or M5). It should be understood that each of the metallization layers, M1-M5, may extend across the entire width of the SOC 100 according to a routing design to route signals to and from the various devices formed therein. SOC 100 includes layers of metallization vias to couple one metallization layer to another, including via 213 (or Via1), via 233 (or Via2), via 243 (or Via3), via 253 (or Via4), and via 263 (or Via5). Other embodiments may contain more or fewer metallization layers and a corresponding more or fewer number of metallization vias. The logic region 110 is illustrated to include a full metallization stack, including a portion of each of metallization layers M1-M5 connected by metallization vias, with Via1 connecting the stack to a source/drain contact of the depicted example transistor 165. The FeRAM cell region 120 includes a full metallization stack connecting one electrode of the FeRAM structures 350 to a read line coupled to the M5 metallization layer 265 and the other electrode of the FeRAM structures 350 coupled to a source/drain contact of the access transistors 170. The FeRAM cell region 120 also includes a partial metallization stack connecting a source line 172 to another source/drain contact of the access transistors 170. A write line (not shown) may be coupled to a gate contact of the FeRAM cell transistors. The FeRAM structures 350 are depicted as being fabricated in between the top of the M4 layer and the bottom the M5 layer, though other arrangements are contemplated, as discussed in further detail below.

Also included in the interconnect 200 of SOC 100 are a plurality of inter-metal dielectric (IMD) layers. Six IMD layers, including IMD 210 (or IMD0 210), IMD 220 (or IMD1 220), IMD 230 (or IMD2 230), IMD 240 (or IMD3 240), IMD 250 (or IMD4 250), IMD 260 (or IMD5 260), are depicted in FIG. 1 as spanning the logic region 110, the FeRAM cell region 120, and decoupling capacitor area 130. The IMD layers may provide electrical insulation as well as structural support for the various features of the SOC during many fabrication process steps, some of which are discussed herein.

The one or more MFM decoupling capacitors 310 may be fabricated simultaneously with the FeRAM structures 350. For example, after metallization M4 has been patterned and IMD4 has been deposited, the SOC undergoes a planarization process, such as chemo-mechanical planarization (CMP). After the CMP process, a bottom electrodes 360 and bottom electrode 320 are deposited overlaying IMD4 and the exposed portions of M4 in both the FeRAM cell region 120 and the decoupling capacitor region 130. Next, ferroelectric insulating layers 370 and ferroelectric insulating layer 330 are formed from a suitable ferroelectric insulating material. Then, the top electrodes 380 and top electrode 340 are formed over the respective ferroelectric insulating layers 370 and ferroelectric insulating layer 330, using any of the candidate materials as the respective bottom electrodes. After the material layers that form bottom electrodes 320 and 360, ferroelectric insulating layers 330 and 370, and top electrodes 340 and 380 have been deposited, they may be patterned into the one or more MFM decoupling capacitors 310 and FeRAM structures 350 by an etch process using a single mask. Thus, a single mask may be used to form the FeRAM structures 350 and the one or more MFM decoupling capacitors 310. A more detailed discussion regarding fabrication methods is included below.

These fabrication processes may present certain advantages in terms of material costs and time costs during the fabrication of the SOC 100. Additionally, having the one or more MFM decoupling capacitors 310 raised a distance off the substrate of the SOC 100 may allow for the repurposing of the surface area occupied by the transistor structure 175 of FIG. 1. For example, in some embodiments, the substrate surface area of the decoupling capacitor region 130 may instead include additional SOC logic, including a logic transistor, rather than a dummy (unused) structure.

The one or more MFM decoupling capacitors 310 may be used by the SOC 100 to condition power supply lines that supply current to charge and/or discharge active and passive devices included in the SOC. When voltages swing during a clock transition, fluctuations on the power supply lines may introduce noise. The one or more MFM decoupling capacitors 310 act as a charge reservoir to smooth out a certain amount of the introduced noise. The metallization layers, such as M1 through M5, may be used to route signals to and from the one or more MFM decoupling capacitors 310 and may be electrically coupled to any area of the SOC 100. In some embodiments, the one or more MFM decoupling capacitors 310 may be electrically coupled to a device on another device package which is separate from the SOC 100.

FIGS. 2 through 13 illustrate various configurations for the decoupling capacitor structure 300 of FIG. 1 using multiple forward series connected MFM decoupling capacitors. In some embodiments, the reliability of the insulating layer (e.g., ferroelectric insulating layer 330) of a single MFM decoupling capacitor may limit the application field of the one or more MFM decoupling capacitors 310. For example a time-dependent dielectric breakdown (TDDB) test may indicate that a single MFM decoupling capacitor has a limiting lifespan. Other functional and performance criteria may also be implicated. Arranging the one or more MFM decoupling capacitors 310 in a forward series configuration including at least two MFM decoupling capacitors, however, can effectively divide the input voltage signal (VDD) into 1/n VDD between the multiple MFM decoupling capacitors. The discussion of FIGS. 2 through 13 provides structural descriptions for the decoupling capacitor structure 300. Various methods for forming such structures will be discussed below in greater detail with respect to FIGS. 17 through 54. While the decoupling capacitor structure 300 is described in terms of particular metallization layers of the SOC 100, one of skill will realize that the structure could be in any of the metallization layers, an example of which will be discussed with respect to FIGS. 15 and 16, below.

FIG. 2 illustrates a configuration for a decoupling capacitor structure 300 in accordance with some embodiments. In FIG. 2, a MFM decoupling capacitor 310 ($cap_1$) is forward series connected to another MFM decoupling capacitor 310 ($cap_2$). An input voltage $V_1$ can be provided at a portion of the M5 metallization layer 265 which is electrically coupled to the top electrode 340 of $cap_1$. A portion of the M4 metallization layer 255 may be coupled to the bottom electrode 320 of $cap_1$ and may be routed by a via 263 through the ILD5 260 back to another portion (where voltage $V_2$ may be measured) of the M5 metallization layer 265. This portion of the M5 metallization layer 265 may be electrically coupled to the top electrode 340 of $cap_2$, thereby coupling the top electrode 340 of $cap_2$ to the bottom electrode 320 of $cap_1$, providing a series connected circuit. The bottom electrode 320 of $cap_2$ may be coupled to a portion of the M4 metallization layer 255, which may be coupled to ground (GND) (or another voltage signal). The signals for $V_1$ and GND may be reversed.

Because $cap_1$ and $cap_2$ are connected in series, the input voltage provided at $V_1$ is divided by the number of capacitors present, i.e., two. As such, the voltage across $cap_1$ equals the voltage across $cap_2$ equals ½ the input voltage $V_1$. In other words the voltage drop from $V_1$ to $V_2$ equals the voltage drop from $V_2$ to GND, which equals ½ $V_1$. In this manner $cap_1$ and $cap_2$ each effectively act as a capacitor in parallel with a resistor, forming a voltage divider. The circuit diagram illustrated in FIG. 14A, discussed below, provides a circuit representation of the decoupling capacitor structure 300 with two series connected MFM decoupling capacitors 310.

Figure 3:
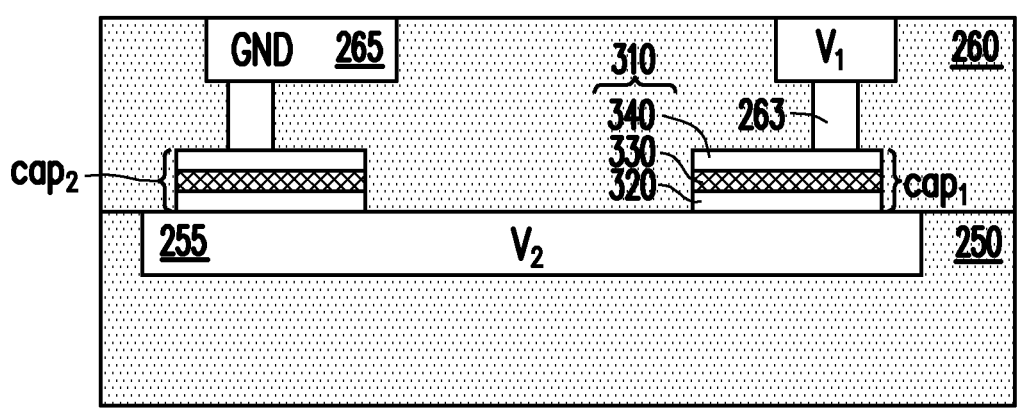

FIG. 3 illustrates a configuration for a decoupling capacitor structure 300 in accordance with some embodiments. In FIG. 3, a MFM decoupling capacitor 310 ($cap_1$) is forward series connected to another MFM decoupling capacitor 310 ($cap_2$). An input voltage $V_1$ can be provided at a portion of the M5 metallization layer 265 which is electrically coupled to the top electrode 340 of $cap_1$. A portion of the M4 metallization layer 255 may be coupled to the bottom electrode 320 of $cap_1$ and may be routed in the M4 metallization layer 255 to the bottom electrode 320 of $cap_2$. The top electrode 340 of $cap_2$ may be coupled to another portion of the M5 metallization layer 265, which may be coupled to ground (GND) (or another voltage signal), providing a series connected circuit. Voltage $V_2$ may be measured at the bottom electrode of cap1 or cap2 or the portion of the M4 metallization layer 255 connecting them. The signals for $V_1$ and GND may be reversed.

Because $cap_1$ and $cap_2$ are connected in series, the input voltage provided at $V_1$ is divided by the number of capacitors present, i.e., two, similar to that described above with respect to FIG. 2.

Figure 4:
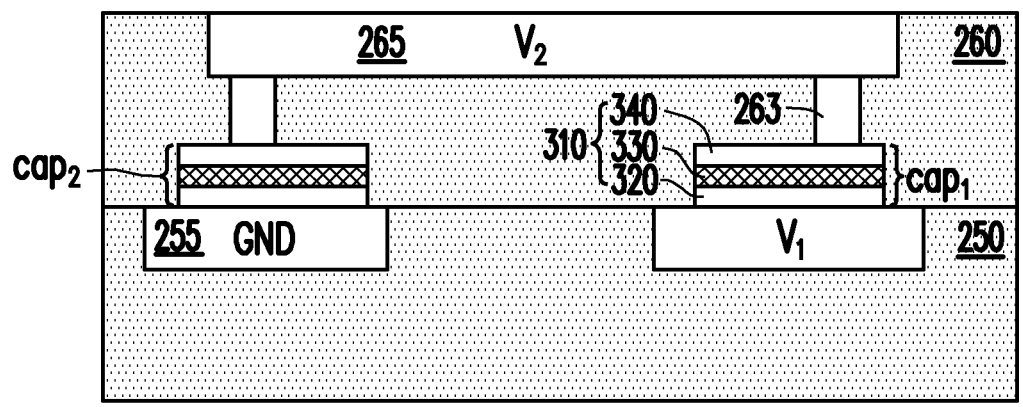

FIG. 4 illustrates a configuration for a decoupling capacitor structure 300 in accordance with some embodiments. In FIG. 4, a MFM decoupling capacitor 310 ($cap_1$) is forward series connected to another MFM decoupling capacitor 310 ($cap_2$). An input voltage $V_1$ can be provided at a portion of the M4 metallization layer 255 which is electrically coupled to the bottom electrode 320 of $cap_1$. A portion of the M5 metallization layer 265 may be coupled to the top electrode 340 of $cap_1$ and may be routed in the M5 metallization layer 265 to the top electrode 340 of $cap_2$. The bottom electrode 320 of $cap_2$ may be coupled to another portion of the M4 metallization layer 255, which may be coupled to ground (GND) (or another voltage signal), providing a series connected circuit. Voltage $V_2$ may be measured at the top electrode of cap1 or cap2 or the portion of the M5 metallization layer 265 connecting them. The signals for $V_1$ and GND may be reversed.

Because $cap_1$ and $cap_2$ are connected in series, the input voltage provided at $V_1$ is divided by the number of capacitors present, i.e., two, similar to that described above with respect to FIG. 2.

Figure 5:
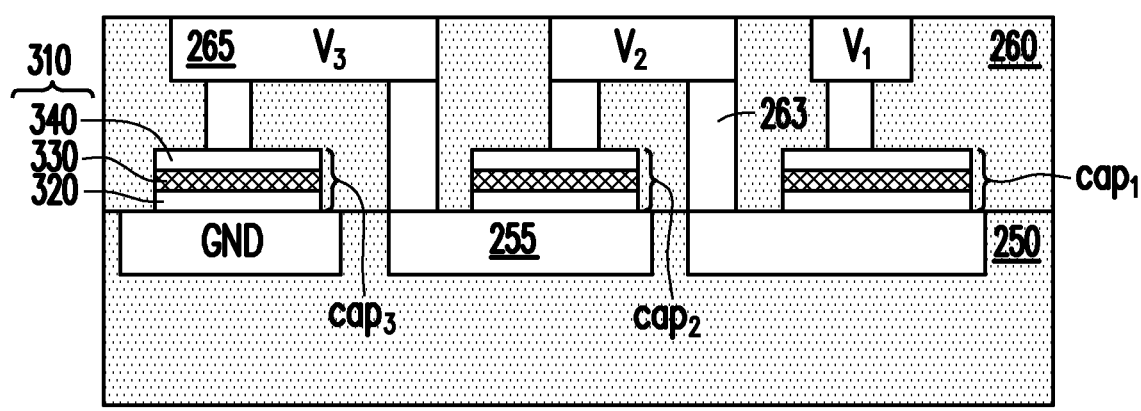

FIG. 5 illustrates a configuration for a decoupling capacitor structure 300 in accordance with some embodiments. In FIG. 5, a MFM decoupling capacitor 310 ($cap_1$) is forward series connected to another MFM decoupling capacitor 310 ($cap_2$) which is forward series connected to another MFM decoupling capacitor 310 ($cap_3$). The structure of the decoupling capacitor structure 300 is similar to that depicted in FIG. 2, except that an additional MFM decoupling capacitor 310 ($cap_3$) is provided and coupled in a similar manner as $cap_1$ and $cap_2$. An input voltage $V_1$ can be provided at a portion of the M5 metallization layer 265 which is electrically coupled to the top electrode 340 of $cap_1$. A portion of the M4 metallization layer 255 may be coupled to the bottom electrode 320 of $cap_1$ and may be routed in the M4 metallization layer 255 to a via 263 which is coupled to a portion of the M5 metallization layer 265. This portion of the M5 metallization layer 265 is coupled to the top electrode 340 of $cap_2$. The bottom electrode 320 of $cap_2$ may be coupled to another portion of the M4 metallization layer 255, which may be coupled to another via 263 which is coupled to another portion of the M5 metallization layer 265. This portion of the M5 metallization layer 265 is coupled to the top electrode 340 of $cap_3$. The bottom electrode 320 of $cap_3$ is coupled to a portion of the M4 metallization layer 255, which may be coupled to ground (GND) (or another voltage signal), providing a series connected circuit. Voltage $V_2$ may be measured at the bottom electrode 320 of $cap_1$ or the top electrode 340 of $cap_2$ or the portion of the M4 metallization layer 255, the M5 metallization layer 265, or the via 263 connecting them. Voltage $V_3$ may be measured at the bottom electrode 320 of $cap_2$ or the top electrode 340 of $cap_3$ or the portion of the M4 metallization layer 255, M5 metallization layer 265, or via 263 connecting them. The signals for $V_1$ and GND may be reversed.

Because $cap_1$, $cap_2$, and $cap_3$ are connected in series in FIGS. 5 through 9, the input voltage provided at $V_1$ is divided by the number of capacitors present, i.e., three. As such, the voltage across $cap_1$ equals the voltage across $cap_2$ equals the voltage across $cap_3$ equals ⅓ the input voltage $V_1$. In other words the voltage drop from $V_1$ to $V_2$ equals the voltage drop from $V_2$ to $V_3$ equals the voltage drop from $V_3$ to GND, which equals ⅓ $V_1$. In this manner $cap_1$, $cap_2$, and $cap_3$ each effectively act as a capacitor in parallel with a resistor, forming a voltage divider circuit. The circuit diagram illustrated in FIG. 14B, discussed below, provides a circuit representation of the decoupling capacitor structure 300 with three series connected MFM decoupling capacitors 310.

Figure 6:
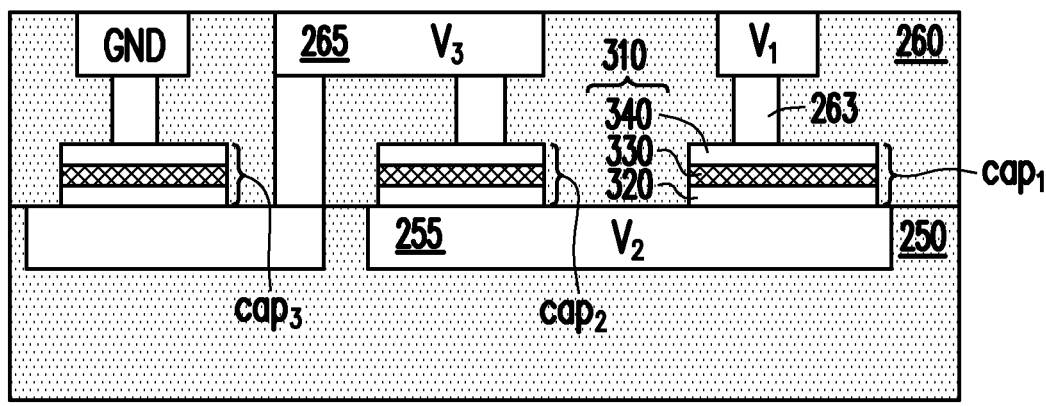

FIG. 6 illustrates a configuration for a decoupling capacitor structure 300 in accordance with some embodiments. In FIG. 6, a MFM decoupling capacitor 310 ($cap_1$) is forward series connected to another MFM decoupling capacitor 310 ($cap_2$) which is forward series connected to another MFM decoupling capacitor 310 ($cap_3$). The structure of the decoupling capacitor structure 300 represents a combination of the embodiments discussed above with respect to FIGS. 2 and 3, where $cap_2$ from FIG. 3 is $cap_1$ from FIG. 2. In FIG. 6, the input signal $V_1$ is coupled to an input similar to that illustrated in FIG. 3.

Figure 7:
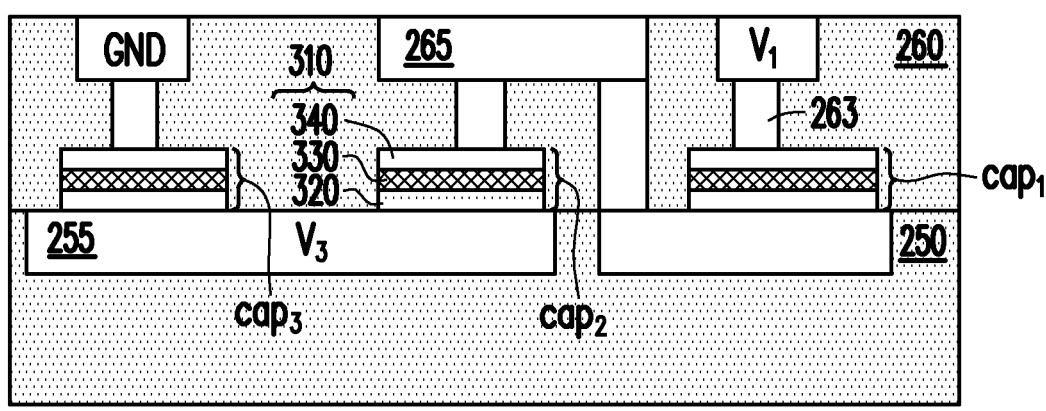

FIG. 7 illustrates a configuration for a decoupling capacitor structure 300 in accordance with some embodiments. The structure of the decoupling capacitor structure 300 in FIG. 7 represents a combination of the embodiments discussed above with respect to FIGS. 2 and 3, similar to FIG. 6, except that the signals for $V_1$ and GND are reversed. In other words, the decoupling capacitor structure 300 of FIG. 7 is a combination of the decoupling capacitor structures 300 of FIGS. 2 and 3 such that $cap_2$ from FIG. 2 is $cap_1$ from FIG. 3. In FIG. 7, the input signal $V_1$ is coupled to an input similar to that illustrated in FIG. 2.

Figure 8:
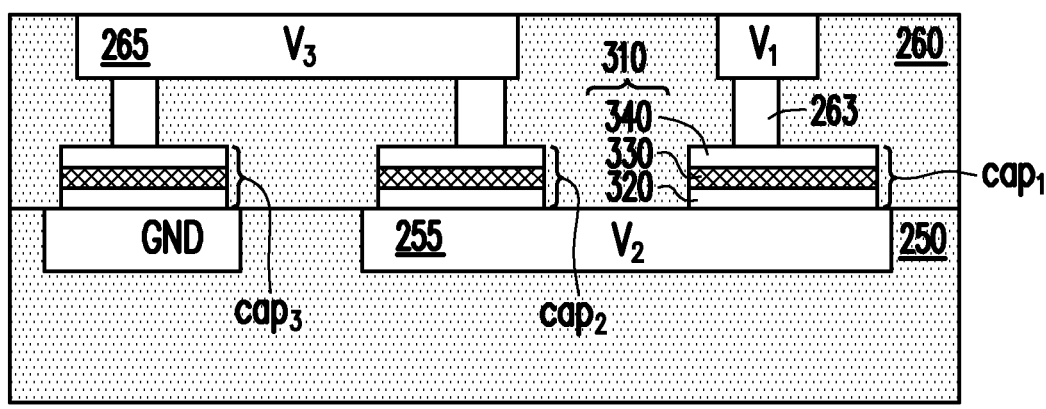

FIG. 8 illustrates a configuration for a decoupling capacitor structure 300 in accordance with some embodiments. In FIG. 8, a MFM decoupling capacitor 310 ($cap_1$) is forward series connected to another MFM decoupling capacitor 310 ($cap_2$) which is forward series connected to another MFM decoupling capacitor 310 ($cap_3$). The structure of the decoupling capacitor structure 300 represents a combination of the embodiments discussed above with respect to FIGS. 3 and 4, where $cap_2$ from FIG. 3 is $cap_1$ from FIG. 4. In FIG. 8, the input signal $V_1$ is coupled to an input similar to that illustrated in FIG. 3.

Figure 9:
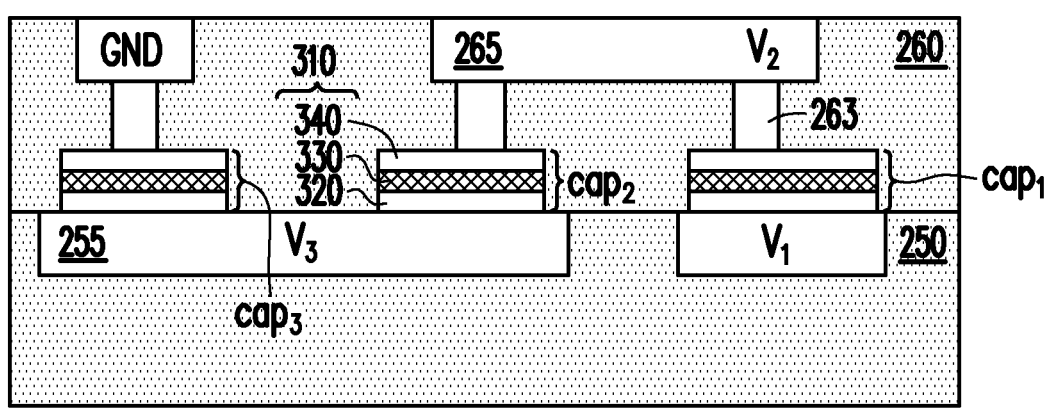

FIG. 9 illustrates a configuration for a decoupling capacitor structure 300 in accordance with some embodiments. The structure of the decoupling capacitor structure 300 in FIG. 9 represents a combination of the embodiments discussed above with respect to FIGS. 3 and 4, similar to FIG. 8, except that the signals for $V_1$ and GND are reversed. In other words, the decoupling capacitor structure 300 of FIG. 9 is a combination of the decoupling capacitor structures 300 of FIGS. 3 and 4 such that $cap_2$ from FIG. 4 is $cap_1$ from FIG. 3. In FIG. 9, the input signal $V_1$ is coupled to an input similar to that illustrated in FIG. 4.

Figure 10:
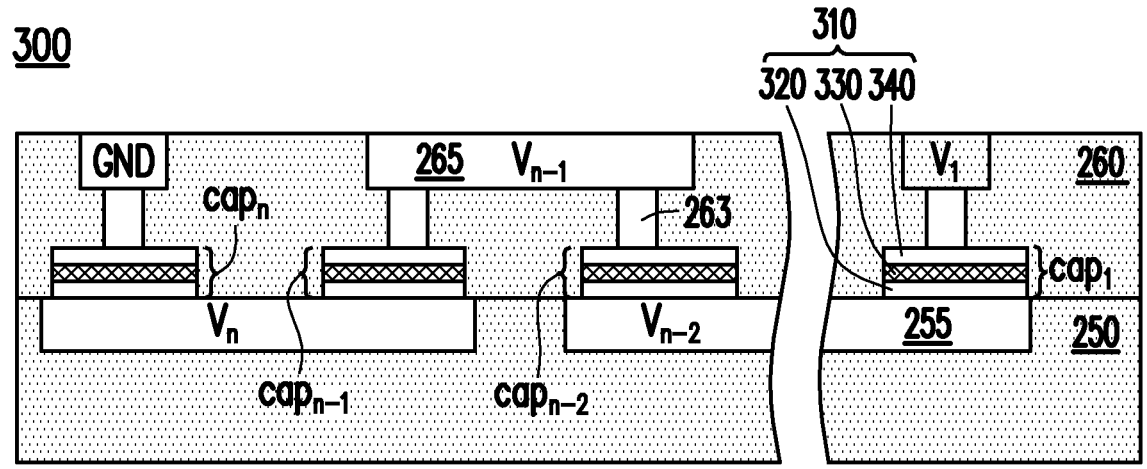
Figure 11:
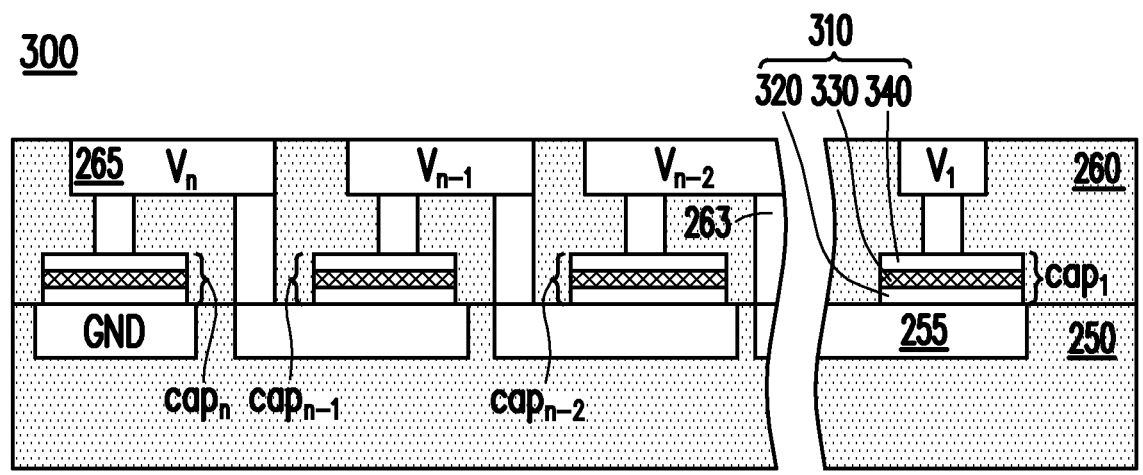

FIGS. 10 and 11 illustrate various configurations for a decoupling capacitor structure 300 in accordance with some embodiments. In FIGS. 10 and 11, a decoupling capacitor structure 300 having n number of MFM decoupling capacitors 310 is illustrated. It should be understood that these may be connected using any of the arrangements described in any of the previously discussed embodiments.

In FIG. 10, the embodiments of FIGS. 3 and 4 are combined in an alternating fashion until a desired number n of MFM decoupling capacitors 310 is provided, where the second capacitor of one, e.g., $cap_2$ of FIG. 3, becomes the first capacitor of the other, e.g., $cap_1$ of FIG. 4, similar to that illustrated in FIGS. 8 and 9. In this manner, any number of capacitors may be combined.

In FIG. 11, the embodiment of FIG. 2 or FIG. 5 is extended to add additional MFM decoupling capacitors 310 in series which are connected in a manner similar to that depicted in FIG. 2, using a via 263 which extends from the M5 metallization layer 265 to the M4 metallization layer 255.

It should be understood that the embodiments illustrated in FIGS. 2, 3, and 4 may be combined or extended without limitation to couple any number of MFM decoupling capacitors 310.

Because $cap_1, \ldots cap_{n-2}, cap_{n-1}$, and $cap_n$ are connected in series in FIGS. 10 and 11, the input voltage provided at $V_1$ is divided by the number of capacitors present, i.e., n. As such, the voltage across all the capacitors are equal, such that, for example, the voltage across $cap_1$ equals the voltage across $cap_{n-2}$ equals the voltage across $cap_{n-1}$ equals the voltage across $cap_n$ equals 1/n the input voltage $V_1$. In other words the voltage drop from $V_1$ to the next series capacitor equals the voltage drop from $V_{n-2}$ to $V_{n-1}$ equals the voltage drop from $V_{n-1}$ to $V_n$ equals the voltage drop from $V_n$ to GND, which equals 1/n $V_1$. In this manner each of the capacitors $cap_1, \ldots cap_{n-2}, cap_{n-1}$, and $cap_n$ each effectively act as a capacitor in parallel with a resistor, forming a voltage divider circuit. The circuit diagram illustrated in FIG. 14C, discussed below, provides a circuit representation of the decoupling capacitor structure 300 with n series connected MFM decoupling capacitors 310.

Figure 12:
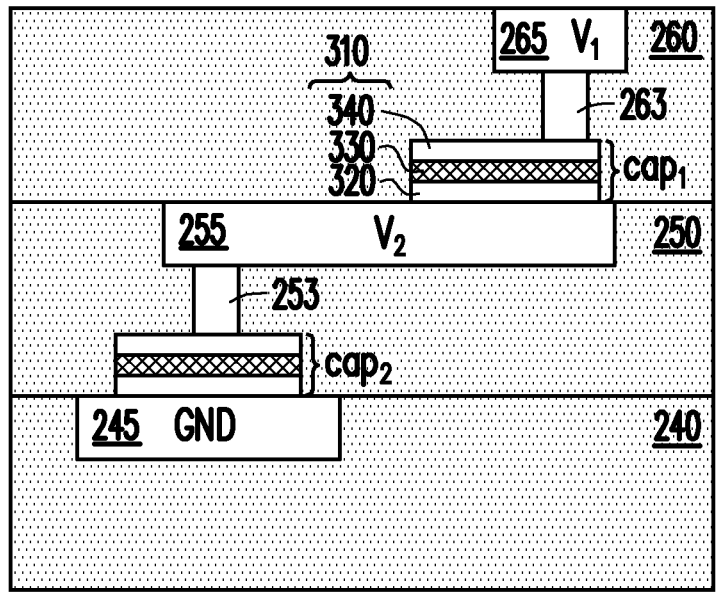
Figure 13:
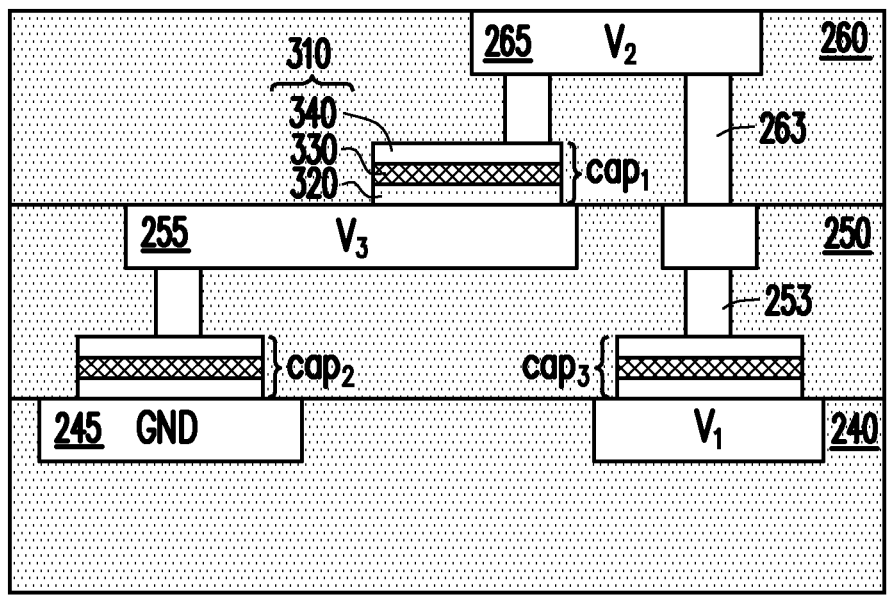

FIGS. 12 and 13 illustrate various configurations for a decoupling capacitor structure 300 in accordance with some embodiments. In FIGS. 12 and 13, MFM decoupling capacitors 310 are provided in multiple IMD layers. For example, MFM decoupling capacitors 310 are provided in IMD4 250 and IMD5 260. Other levels of the multiple IMD layers may be used. One of the advantages of the embodiments described herein is that the MFM decoupling capacitors 310 may be formed at the same time and using the same masks as the FeRAM structures 350. However, in some embodiments, it may be desirable to include additional MFM decoupling capacitors 310 in other IMD layers, such as illustrated in FIGS. 12 and 13. For example FeRAM structures 350 may also be formed in multiple IMD layers at the same time and using the same masks as the MFM decoupling capacitors 310 in respective multiple IMD layers.

In FIG. 12, a MFM decoupling capacitor 310 ($cap_1$) is forward series connected to another MFM decoupling capacitor 310 ($cap_2$). An input voltage $V_1$ can be provided at a portion of the M5 metallization layer 265 which is electrically coupled to the top electrode 340 of $cap_1$ by via 263. A portion of the M4 metallization layer 255 may be coupled to the bottom electrode 320 of $cap_1$ and may be coupled by via 263 through the ILD4 250 to the top electrode 340 of $cap_2$, thereby coupling the top electrode 340 of $cap_2$ to the bottom electrode 320 of $cap_1$, providing a series connected circuit. The bottom electrode 320 of $cap_2$ may be coupled to a portion of the M3 metallization layer 245, which may be coupled to ground (GND) (or another voltage signal). The signals for $V_1$ and GND may be reversed. It should be understood that the particular layers described are for illustration purposes only and the various components may be formed in any of the layers of the interconnect 200 (see FIG. 1).

Because $cap_1$ and $cap_2$ are connected in series, the input voltage provided at $V_1$ is divided by the number of capacitors present, i.e., two. As such, the voltage across $cap_1$ equals the voltage across $cap_2$ equals ½ the input voltage $V_1$. In other words the voltage drop from $V_1$ to $V_2$ equals the voltage drop from $V_2$ to GND, which equals ½ $V_1$. In this manner $cap_1$ and $cap_2$ each effectively act as a capacitor in parallel with a resistor, forming a voltage divider. The circuit diagram illustrated in FIG. 14A, discussed below, provides a circuit representation of the decoupling capacitor structure 300 with two series connected MFM decoupling capacitors 310.

FIG. 13 illustrates a configuration for a decoupling capacitor structure 300 in accordance with some embodiments. In FIG. 13, a MFM decoupling capacitor 310 ($cap_1$) is forward series connected to another MFM decoupling capacitor 310 ($cap_2$) which is forward series connected to another MFM decoupling capacitor 310 ($cap_3$). The structure of the decoupling capacitor structure 300 is similar to that depicted in FIG. 12, except that an additional MFM decoupling capacitor 310 ($cap_3$) is provided in the same layer as $cap_2$. An input voltage $V_1$ can be provided at a portion of the M3 metallization layer 245 which is electrically coupled to the bottom electrode 320 of $cap_3$. The top electrode 340 of $cap_3$ may be coupled to a portion of the M4 metallization layer 255 by via 253 through ILD4 250. This portion of the M4 metallization layer 255 may be coupled to a portion of the M5 metallization layer 265 by via 263 through ILD5. This portion of the M5 metallization layer 265 may be coupled to the top electrode 340 of $cap_1$ by another via 263 in the ILD5 260. The bottom electrode 320 of $cap_1$ may be coupled to another portion of the M4 metallization layer 255, which may be coupled to another via 253 which is coupled to the top electrode 340 of $cap_2$ by another via 253 in ILD4 250. The bottom electrode of $cap_2$ may be coupled to another portion of the M3 metallization layer 245, which may be coupled to ground (GND) (or another voltage signal), providing a series connected circuit. Voltage $V_2$ may be measured at the top electrode 340 of $cap_1$ or the top electrode 340 of $cap_3$ or the portion of the M4 metallization layer 255, M5 metallization layer 265, via 253, or via 263 connecting them. Voltage $V_3$ may be measured at the bottom electrode 320 of $cap_1$ or the top electrode 340 of $cap_2$ or the portion of the M4 metallization layer 255, or via 253 connecting them. The signals for $V_1$ and GND may be reversed.

Because $cap_1$, $cap_2$, and $cap_3$ are connected in series, the input voltage provided at $V_1$ is divided by the number of capacitors present, i.e., three. As such, the voltage across $cap_1$ equals the voltage across $cap_2$ equals the voltage across $cap_3$ equals ⅓ the input voltage $V_1$. In other words, the voltage drop from $V_1$ to $V_2$ equals the voltage drop from $V_2$ to $V_3$ equals the voltage drop from $V_3$ to GND, which equals ⅓ $V_1$. In this manner $cap_1$, $cap_2$, and $cap_3$ each effectively act as a capacitor in parallel with a resistor, forming a voltage divider. The circuit diagram illustrated in FIG. 14B, discussed below, provides a circuit representation of the decoupling capacitor structure 300 with three series connected MFM decoupling capacitors 310.

Figure 14A:
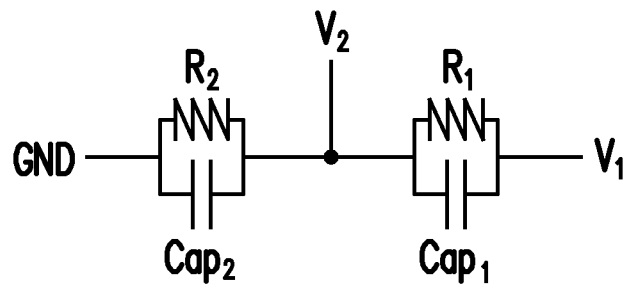
FIGS. 14A, 14B, and 14C illustrate various circuit configurations of a decoupling capacitor structure of a SOC, in accordance with some embodiments.

FIG. 14A illustrates a circuit diagram of two MFM decoupling capacitors 310 coupled in series, in accordance with some embodiments. As illustrated in FIG. 14A, when two MFM decoupling capacitors are used and connected in series, such as discussed above with respect to FIGS. 2-4 and 12, the capacitor will act like a capacitor in parallel with a resistor and the input voltage $V_1$ will divide over each of the capacitors present. In particular, as illustrated in FIG. 14A, capacitor 1 (Cap1) is in parallel with resistor 1 (R1). This parallel unit is in series with another parallel unit just like it where capacitor 2 (Cap2) is in parallel with resistor 2 (R2). The input voltage V1 will divide, so that half of the input voltage V1 is across Cap1/R1 and half the input voltage V1 is across Cap2/R2. In other words, the voltage V2=0.5 V1 (where V1 and V2 are measured with respect to GND). It should be noted that there is no R1 necessary to be formed. The MFM decoupling capacitor 310 will itself behave as both a capacitor and a resistor as current leaks across the ferroelectric insulating layer 330 of the MFM decoupling capacitors 310.

Figure 14B:
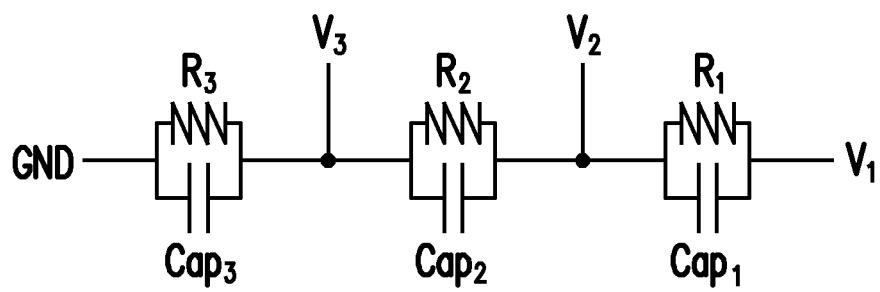

FIG. 14B illustrates a circuit diagram of three MFM decoupling capacitors 310 coupled in series, in accordance with some embodiments. As illustrated in FIG. 14B, when three MFM decoupling capacitors are used and connected in series, such as discussed above with respect to FIGS. 5-9 and 13, the capacitor will act like a capacitor in parallel with a resistor and the input voltage V1 will divide over each of the capacitors present. In particular, as illustrated in FIG. 14B, capacitor 1 (Cap1) is in parallel with resistor 1 (R1). This parallel unit is in series with another parallel unit just like it where capacitor 2 (Cap2) is in parallel with resistor 2 (R2) which is in series with another parallel unit just like it where capacitor 3 (Cap3) is in parallel with resistor 3 (R3). The input voltage V1 will divide, so that ⅓ of the input voltage V1 is across Cap1/R1, ⅓ of the input voltage V1 is across Cap2/R2, and ⅓ of the input voltage V1 is across Cap3/R3. In other words, the voltage V2=⅔ V1 and the voltage V3=⅓ V1 (where V1, V2, and V3 are measured with respect to GND).

Figure 14C:
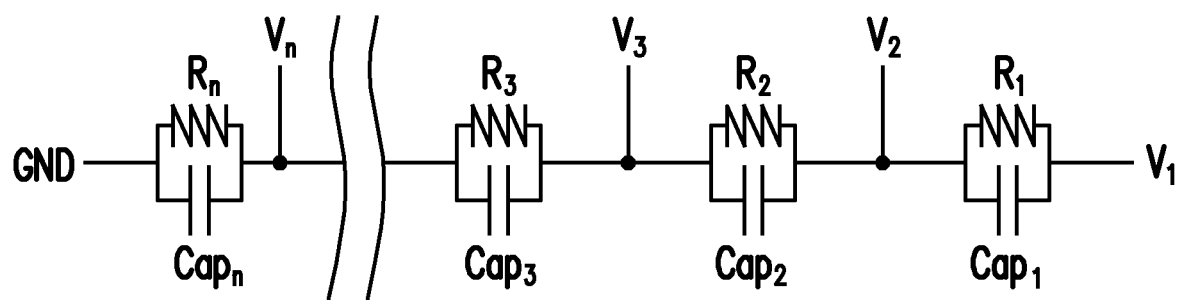

FIG. 14C illustrates a circuit diagram of n MFM decoupling capacitors 310 coupled in series, in accordance with some embodiments. As illustrated in FIG. 14B, when n MFM decoupling capacitors are used and connected in series, such as discussed above with respect to FIGS. 10 and 11, the capacitor will act like a capacitor in parallel with a resistor and the input voltage V1 will divide over each of the capacitors present. In particular, as illustrated in FIG. 14C, capacitor 1 (Cap1) is in parallel with resistor 1 (R1). This parallel unit is in series with another parallel unit just like it where capacitor 2 (Cap2) is in parallel with resistor 2 (R2) which is in series with another parallel unit just like it where capacitor 3 (Cap3) is in parallel with resistor 3 (R3), and so on, which is in series with another like parallel unit where capacitor n (Capn) is in parallel with resistor n (Rn). The input voltage V1 will divide, so that 1/n of the input voltage V1 is across Cap1/R1, 1/n of the input voltage V1 is across Cap2/R2, 1/n of the input voltage V1 is across Cap3/R3, and so on until 1/n of the input voltage V1 is across Capn/Rn. In other words, the voltage V2=(n−1)/n V1, the voltage V3=(n−2)/n V1, and so on until the voltage Vn=1/n V1 (where V1, V2, V3, and Vn are measured with respect to GND).

Figure 15:
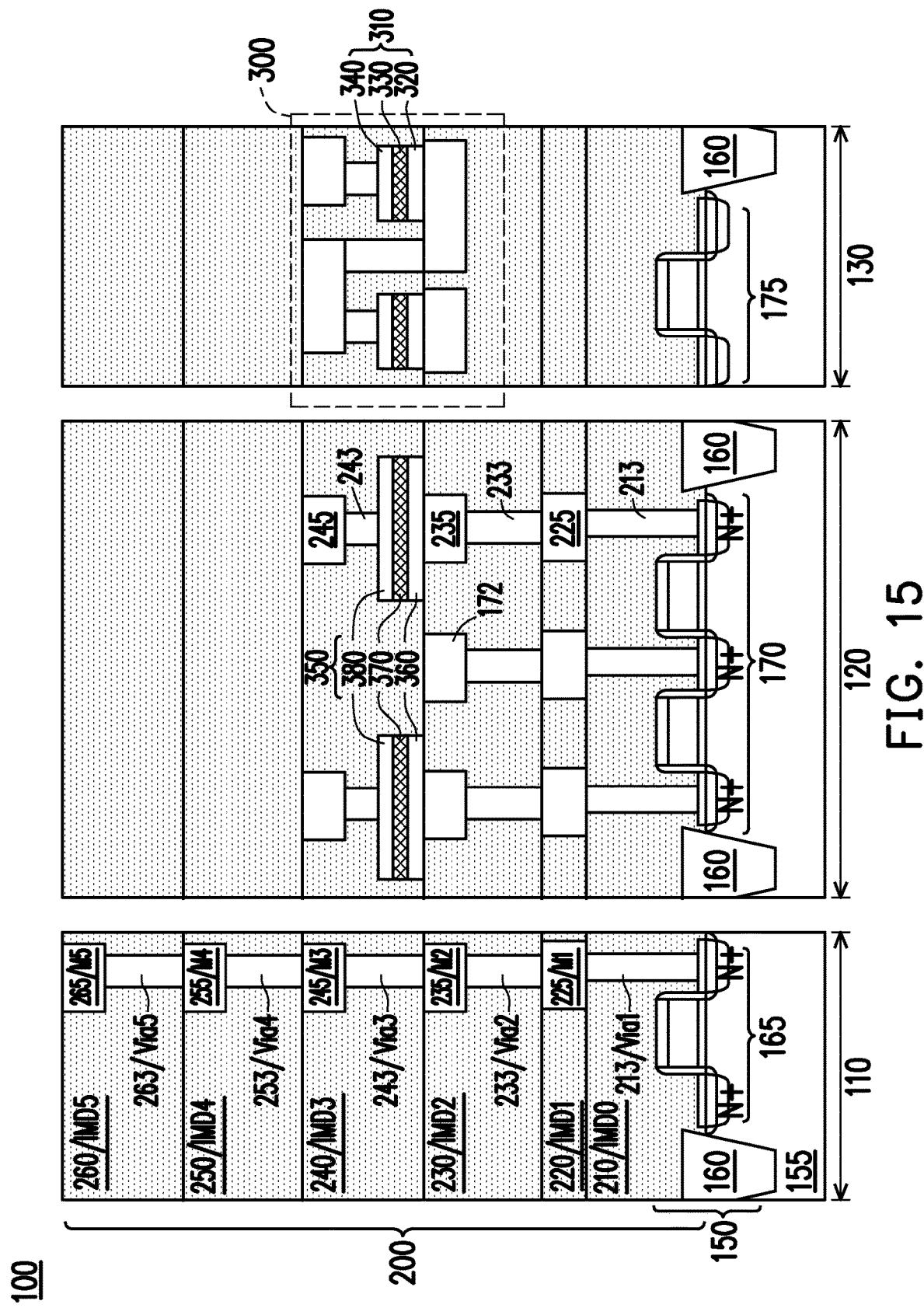
FIGS. 15 through 16 illustrate a SOC, in accordance with some embodiments.
Figure 16:
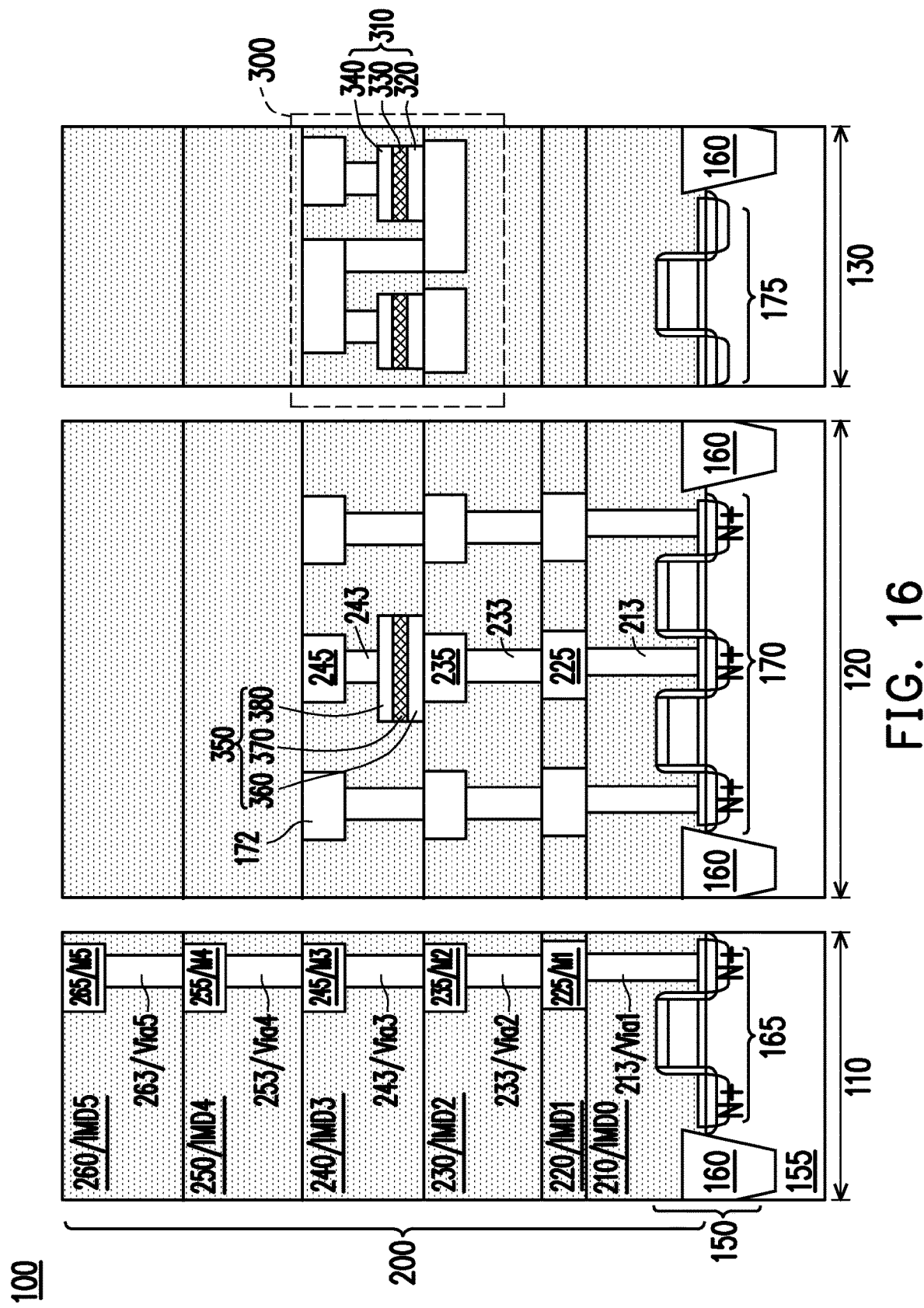

FIGS. 15 and 16 illustrate different alternatives which may be used with any of the above embodiments, in accordance with some embodiments. FIG. 15 illustrates that the decoupling capacitor structure 300 may be formed in a different level of the interconnect 200. For example, FIG. 15 illustrates that the decoupling capacitor structure 300 may be formed in the layer of IMD3 240 and the M3 metallization layer 245. One should understand that another level may be chosen and another arrangement may be chosen from any of the arrangements discussed above for the decoupling capacitor structure 300. The decoupling capacitor structure 300 is formed at the same time as the FeRAM structures 350 of the FeRAM cell region 120. As such the FeRAM structures 350 are also illustrated as being in a different level than illustrated, for example, in FIG. 1.

FIG. 16 illustrates that the FeRAM structure 350 is connected to a common drain of the access transistors 170 of the FeRAM cell region 120 rather than separate drain lines. In such embodiments, the source lines 172 may be in a separate configuration rather than a common configuration, such as illustrated in FIG. 1. Also, similar to that illustrated in FIG. 15, the FeRAM structure 350 and decoupling capacitor structure 300 may be formed in any of the levels of the interconnect 200.

FIGS. 17-34 illustrate intermediate steps in the formation of the FeRAM structure 350 and decoupling capacitor structure 300, in accordance with some embodiments. As noted above, the logic region 110, FeRAM cell region 120, and decoupling capacitor area 130 can be formed in any area of a workpiece. Because the FeRAM structure 350 and decoupling capacitor structure 300 may be formed using the same processes at the same time, the description below is for the formation of a MFM decoupling capacitor 310 of the decoupling capacitor structure 300.

The processes described in FIGS. 17-34 to form SOC 100 may be applied to a workpiece in various processing chambers, including deposition chambers and etching chambers of one or more apparatuses. The workpiece may be, for example, a wafer including a carrier or silicon substrate on which the devices of the SOC 100 are formed, which is subsequently processed to separate into multiple SOC 100 devices.

FIG. 17 illustrates a top portion of a layer of the interconnect 200. As illustrated in FIG. 17, the layer of the interconnect 200 illustrated is the IMD4 250 layer with the metallization layer 255, although other layers of the interconnect 200 may be used. Each of the layers of the interconnect 200 may be formed with a damascene or dual damascene process to form the IMD4 250 layer, metallization layer 255, and the vias Via4 253 (see FIG. 1). The material of the IMD4 250 layer may include any suitable material such a dielectric material having a low dielectric constant (k value) lower than 3.8, lower than about 3.0, or lower than about 2.5, for example. The material of the IMD4 250 layer may include phosphosilicate glass (PSG), borosilicate glass (BSG), borophosphosilicate glass (BPSG), fluorosilicate glass (FSG), a tetraethyl orthosilicate (TEOS) formed silicon oxide, a carbon-containing low-k dielectric material, hydrogen silsesquioxane (HSQ), methylsilsesquioxane (MSQ), or the like. The formation method of the IMD4 250 layer may include Chemical Vapor Deposition (CVD), plasma enhanced CVD (PECVD), atomic layer deposition (ALD), flowable CVD (FCVD), physical vapor deposition (PVD), spin-on coating, or the like.

The metallization layer 255 may include any suitable conductive material such as tungsten, copper, cobalt, aluminum, combinations or alloys thereof, and so forth, and may be formed by any suitable deposition method, including for example, CVD, ALD, PVD, electro-plating, electroless plating, and so forth.

The thickness of the IMD4 250 layer may be between about 50 nm and about 200 nm, such as about 100 nm. The thickness of the metallization layer 255 may be between about 20 nm and about 80 nm, such as about 50 nm, though other values are contemplated and may be used.

In FIG. 18, an insulating layer 405 is deposited over the IMD4 250 layer and metallization layer 255. The insulating layer 405 may be made of any suitable insulating material, such as carbides, nitrides, and oxides, such as silicon carbide, silicon oxide, silicon nitride, silicon oxynitride, and so forth. The insulating layer 405 may be formed using any suitable deposition method. In some embodiments, the insulating layer 405 may be formed by a CVD process, an ALD process, a Plasma Enhance CVD (PECVD) process, or the like. The insulating layer 405 may optionally be used as illustrated to elevate the bottom electrode 320 (see FIG. 34) of the subsequently formed MFM decoupling capacitor 310 from being formed directly on the metallization layer 255. The insulating layer 405 may be deposited to a thickness between about 5 nm and about 30 nm, such as about 15 nm, though other values are contemplated and may be used.

In FIG. 19, a photoresist layer 410 is deposited over the insulating layer 405 and patterned using acceptable photo patterning techniques. The photoresist layer 410 may be formed using any suitable photo patternable material and may be deposited using any acceptable techniques such as by a spin-on technique. After the photoresist layer 410 is patterned to form an opening therein, the pattern of the patterned photoresist layer 410 is transferred to the insulating layer 405 by any suitable etching technique to form an opening therein, where the opening exposes a portion of the metallization layer 255. Following the formation of the opening in the insulating layer 405, the photoresist layer 410 may be removed by any suitable technique, such as by an ashing process.

In FIG. 20, an adhesion layer 415 is deposited over the upper surface of the insulating layer 405 and in the opening of the insulating layer 405 such that the adhesion layer 415 lines the opening of the insulating layer 405. That is, the adhesion layer 415 extends down sidewalls of the opening of the insulating layer 405 and along an upper surface of exposed portion of the metallization layer 255. The adhesion layer 415 may be made of any suitable conductive material, such as titanium nitride, tantalum nitride, titanium, tantalum, a combination thereof, or the like. The conductive material of the adhesion layer 415 may be formed by any suitable deposition process, such as by PECVD or other methods such as High-Density Plasma CVD (HDPCVD), ALD, low pressure CVD (LPCVD), physical vapor deposition (PVD), and the like. The adhesion layer 415 may be deposited to a thickness between about 3 nm and about 20 nm, such as about 10 nm, though other values are contemplated and may be used.

Following the deposition of the adhesion layer 415, a via 420 may be deposited. The via 420 may include any suitable conductive material, such as titanium nitride, tantalum nitride, titanium, tantalum, aluminum, tungsten, cobalt, copper, or the like. The via 420 may be the same material as the adhesion layer 415 or may be a different material. For example, in some embodiments the adhesion layer 415 may include tantalum nitride and the via 420 may include titanium nitride. The conductive material of the via 420 may be formed by any suitable deposition process, such as by electro-plating, electroless plating, DC PVD, RFDC PVD, CVD, ALD, pulse DC, PVD, and the like. The via 420 may be deposited to overflow the opening in the insulating layer 405.

In FIG. 21, a planarization process, such as a chemical mechanical polishing (CMP) process may be used to level the upper surfaces of the via 420, adhesion layer 415, and insulating layer 405 with each other.

In FIG. 22, a bottom electrode layer 425 may be deposited over the insulating layer 405 and the via 420. In some embodiments, the bottom electrode layer 425 may be made of the same material as the via 420. In other embodiments, the bottom electrode layer 425 may be made of a different material than the via 420. The material of the bottom electrode layer 425 may be selected from the same candidate materials as the via 420 and may be deposited using a technique similar to those described with respect to the via 420. The bottom electrode layer 425 may be deposited to a thickness between about 2 nm and about 30 nm, such as about 10 nm, though other values are contemplated and may be used.

Following the deposition of the bottom electrode layer 425, a ferroelectric insulating layer 430 may be deposited over the bottom electrode layer 425. The ferroelectric insulating layer 430 may use any suitable dielectric material for an FeRAM insulating layer, such as lead zirconate titanate (PZT), hafnium oxide ($HfO_2$), hafnium zirconium oxide (HZO), silicon doped hafnium oxide (Si:HfO or HSO), silicon doped hafnium zirconium oxide, strontium bismuth tantalate ($SrBi_2Ta_2O_9$(SBT)), lead zirconate titanate (Pb($Zr_xTi_{1-x}$)$O_3$ ($0 \leq x \leq 1$), or any other suitable dielectric materials. The ferroelectric insulating layer 430 may be formed any suitable technique, such as by CVD process, an ALD process, a Plasma Enhance CVD (PECVD) process, or the like. The ferroelectric insulating layer 430 may be deposited to a thickness between about 1 nm and about 15 nm, such as about 10 nm, though other values are contemplated and may be used.

In FIG. 23, a top electrode layer 435 may be deposited over the ferroelectric insulating layer 430. The top electrode layer 435 may be formed using materials and techniques similar to the bottom electrode layer 425. The top electrode layer 435 may be deposited to a thickness between about 2 nm and about 30 nm, such as about 10 nm, though other values are contemplated and may be used. Following the formation of the top electrode layer 435 a capping layer 440 is formed over the top electrode layer 435. The capping layer 440 may be formed to protect the top electrode layer 435 during subsequent processes. The capping layer 440 may be made using materials and processes similar to those described above with respect to the insulating layer 405. In some embodiments, the capping layer 440 may be made, for example, from silicon oxynitride. The capping layer 440 may be deposited to a thickness between about 5 nm and about 50 nm, such as about 10 nm, though other values are contemplated and may be used.

Figure 34:
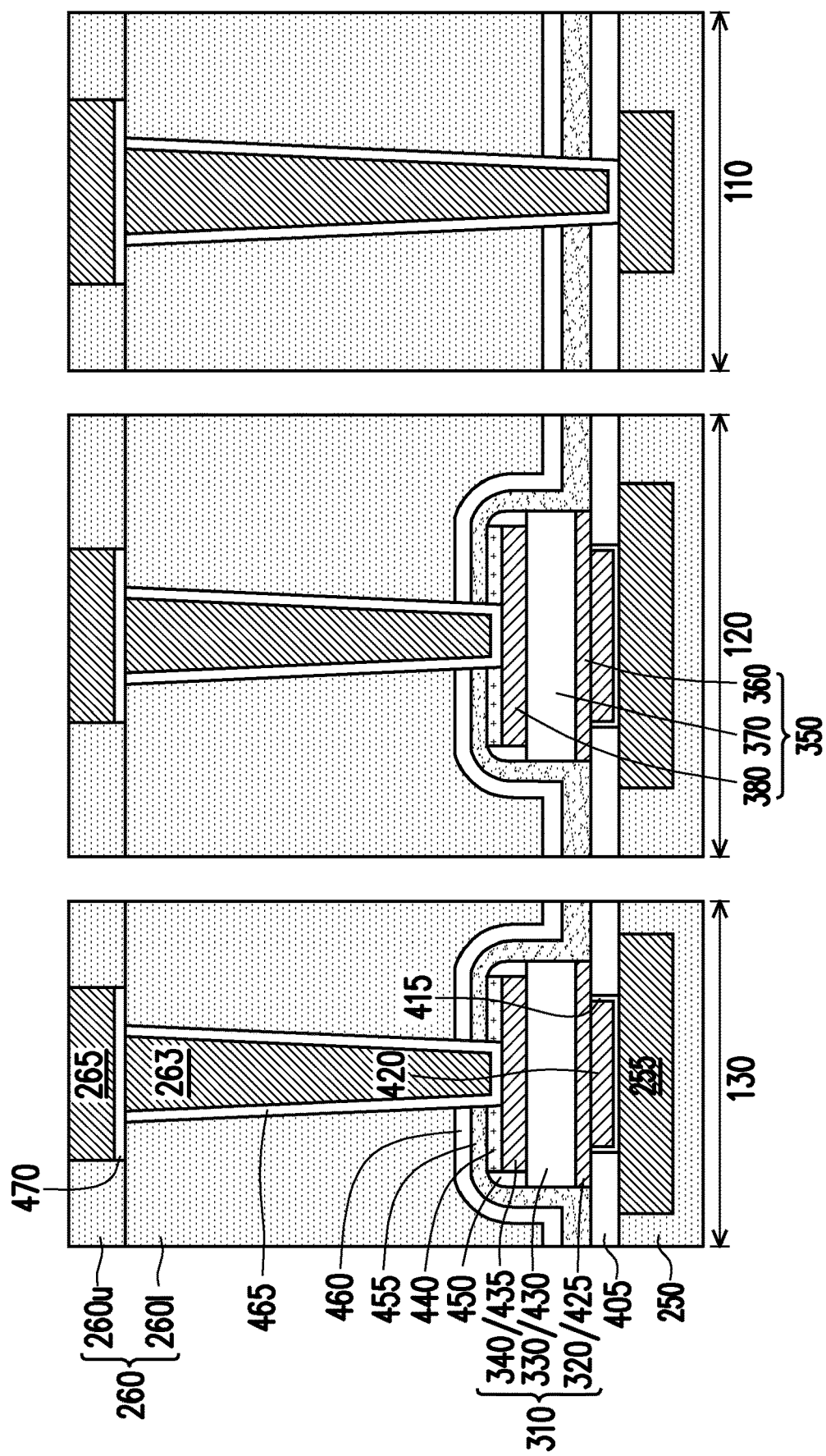

In FIG. 24, a photoresist layer 445 may be formed over the capping layer and patterned to protect an area corresponding to the MFM decoupling capacitor 310 (see FIG. 34). An etching technique may be used to remove portions of the capping layer 440 which are exposed from the photoresist layer 445, thereby exposing portions of the top electrode layer 435. The photoresist layer 445 and/or capping layer 440 may be used in a further etching technique to remove portions of the top electrode layer 435 which are exposed from the capping layer 440. The photoresist layer 445 may be consumed in this process. If any of the photoresist layer 445 remains, the photoresist layer 445 may be removed by any suitable technique, such as by an ashing process. Any suitable etching techniques may be used to remove the portions of the capping layer 440 and the portions of the top electrode layer 435, such as a wet etch or dry etch process.

In FIG. 25, a spacer layer 450 is deposited over the capping layer 440 and along an upper surface of the ferroelectric insulating layer 430. The spacer layer 450 may be formed using materials and processes similar to those discussed above with respect to the insulating layer 405. The spacer layer 450 may be deposited to a thickness between about 5 nm and about 50 nm, such as about 10 nm, though other values are contemplated and may be used. In some embodiments, the spacer layer 450 may be formed using, for example, silicon nitride. To maintain the capping layer 440 during a subsequent etching process of the spacer layer 450, the material of the spacer layer 450 should be different than the material of the capping layer 440.

In FIG. 26, an anisotropic etching technique, such as a reactive ion etch (RIE) or dry etch, may be used to remove horizontal portions of the spacer layer 450. The spacer layer 450 along with the capping layer 440 may then be used as an etch mask to etch the ferroelectric insulating layer 430 and bottom electrode layer 425 to remove portions of the ferroelectric insulating layer 430 and bottom electrode layer 425 not protected by the spacer layer 450 and capping layer 440. As a result, the bottom electrode 320, ferroelectric insulating layer 330, and top electrode 340 of an MFM decoupling capacitor 310 is formed (see FIG. 34), the bottom electrode 320 corresponding to the bottom electrode layer 425, the dielectric layer 430 corresponding to the ferroelectric insulating layer 330, and the top electrode 340 corresponding to the top electrode layer 435. As a result, the upper surface of the insulating layer 405 is exposed adjacent to the bottom electrode layer 425 of the bottom electrode 320.

In FIG. 27, a protective layer 455 may be deposited over the upper surface of the insulating layer 405, over the spacer layer 450 and capping layer 440, and along sidewalls of the spacer layer 450, the ferroelectric insulating layer 430, and the bottom electrode layer 425 of the bottom electrode 320 (see FIG. 34). The protective layer 455 may be formed using materials and techniques such as those discussed above with respect to the insulating layer 405. The protective layer 455 may be deposited to a thickness between about 5 nm and about 50 nm, such as about 10 nm. As such, the protective layer 455 sandwiches the MFM decoupling capacitor 310 (see FIG. 34) between the protective layer 455 and the insulating layer 405.

In FIG. 28, an etch stop layer 460 may be deposited over the protective layer 455. Etch stop layer 460 may comprise a nitride, oxide, carbide, carbon-doped oxide, and/or combinations thereof. In some embodiments, etch stop layer 460 may also include metal or semiconductor material, such as an oxide, nitride, or carbide of a metal or semiconductor material. Such materials may include, for example, aluminum nitride, aluminum oxide, silicon oxide, silicon carbide, silicon nitride, silicon carbide, and the like. The etch stop layer 460 may include multiple layers of the same or different material. Etch stop layer 460 may be formed by any suitable method, such as by Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like. In some embodiments, etch stop layer 460 may be a TEOS formed silicon oxide layer. The etch stop layer 460 may be deposited to a thickness between about 5 nm and about 50 nm, such as about 10 nm, though other values are contemplated and may be used.

In FIGS. 29 through 34, the IMD5 260 layer, the via 263, and the M5 metallization layer 265 are be formed. In one embodiment, a lower portion 2601 of the IMD5 260 layer is formed first, a via opening formed therein exposing the top electrode 340 of the MFM decoupling capacitor 310, the via 263 formed in the via opening 263o, the M5 metallization layer 265 formed, and the IMD5 260 layer extended to the top of the M5 metallization layer 265. In another embodiment, such as illustrated in FIGS. 35-39, the IMD5 260 layer is formed first, a pattern opening is formed therein, then a via opening is formed at bottom portions of the pattern opening, then the vias 263 and the M5 metallization layer 265 are formed.

Figure 29:
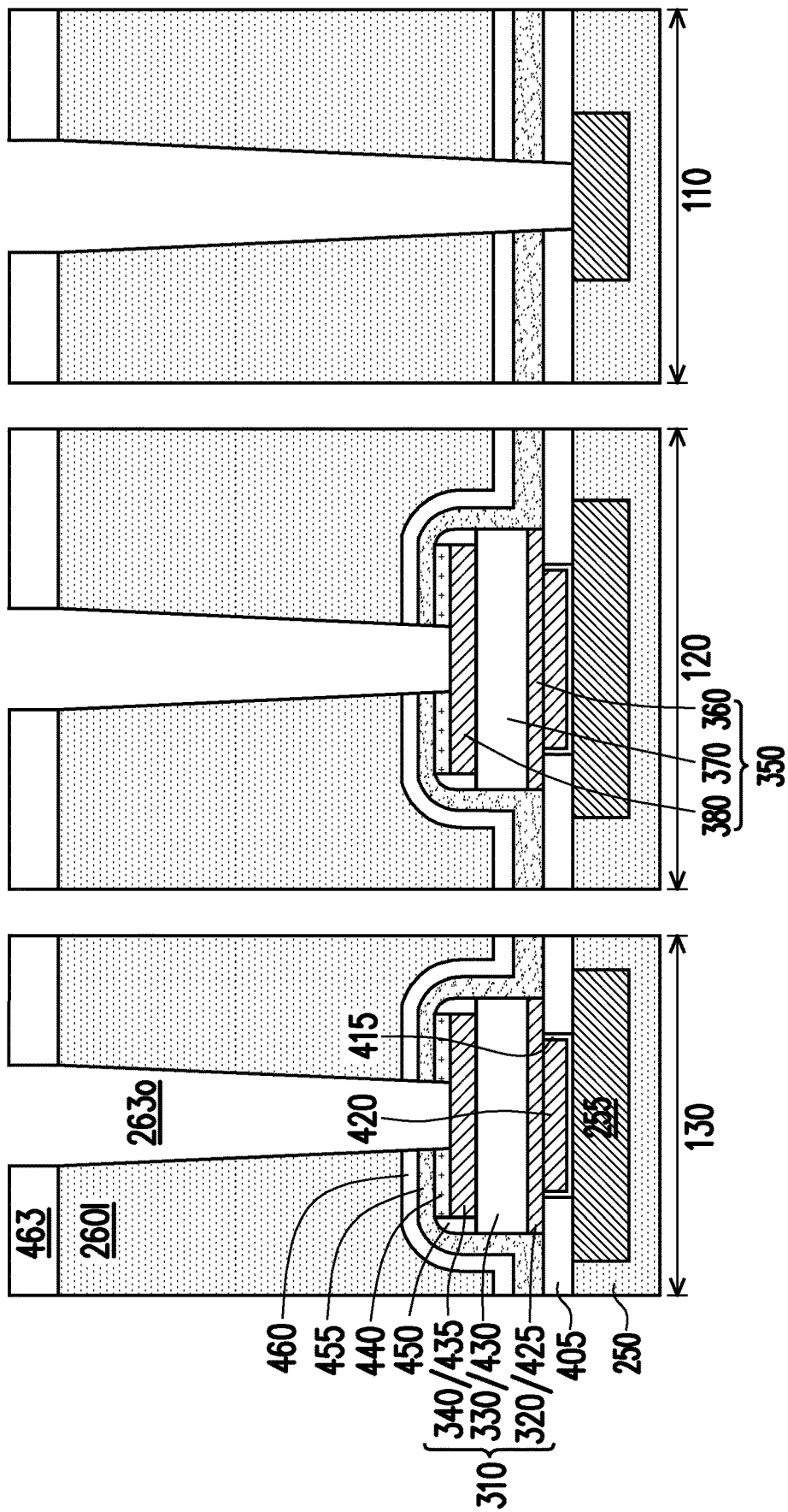

In FIG. 29, the lower portion 2601 of the IMD5 260 (see FIG. 34) layer may be formed using materials and processes similar to that discussed above with respect to the IMD4 250 layer. The lower portion 2601 of the IMD5 260 layer may be deposited to a thickness between about 50 nm and about 200 nm, such as about 100 nm, though other values are contemplated and may be used. Following the formation of the lower portion 2601 of the IMD5 260 layer, a photomask 463 may be used to pattern via openings 263o corresponding to the subsequently formed vias 263 in the lower portion 2601 of the IMD5 260 layer. The via openings 263o may be formed using any suitable technique, such as an etching process. The etch stop layer 460 may be used to provide an etch stop for forming the via openings. Then, the via openings 263o may be extended through the etch stop layer 460, the protective layer 455, and capping layer 440 by successive etching processes to expose a portion of the top electrode 340.

Figure 30:
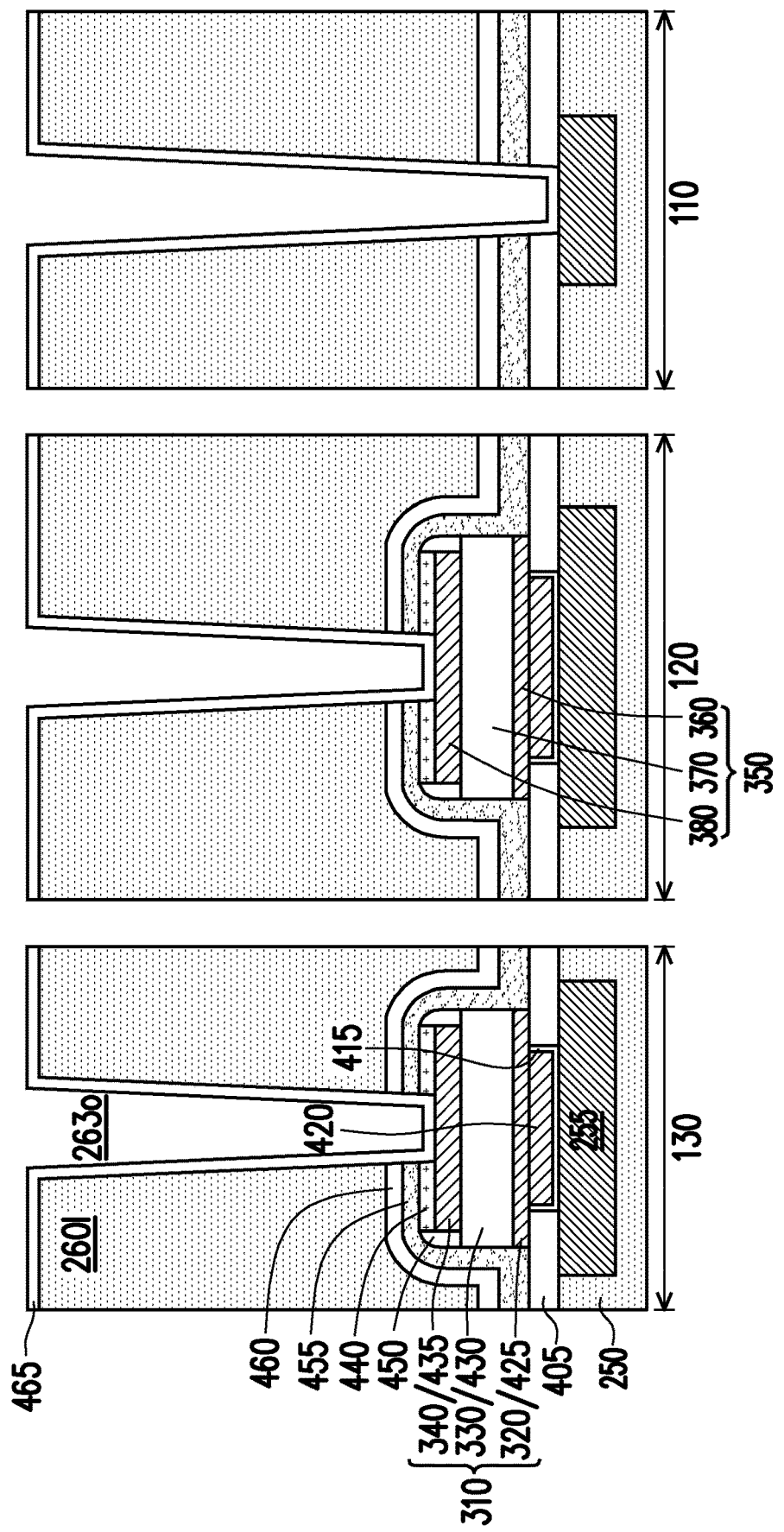
Figure 31:
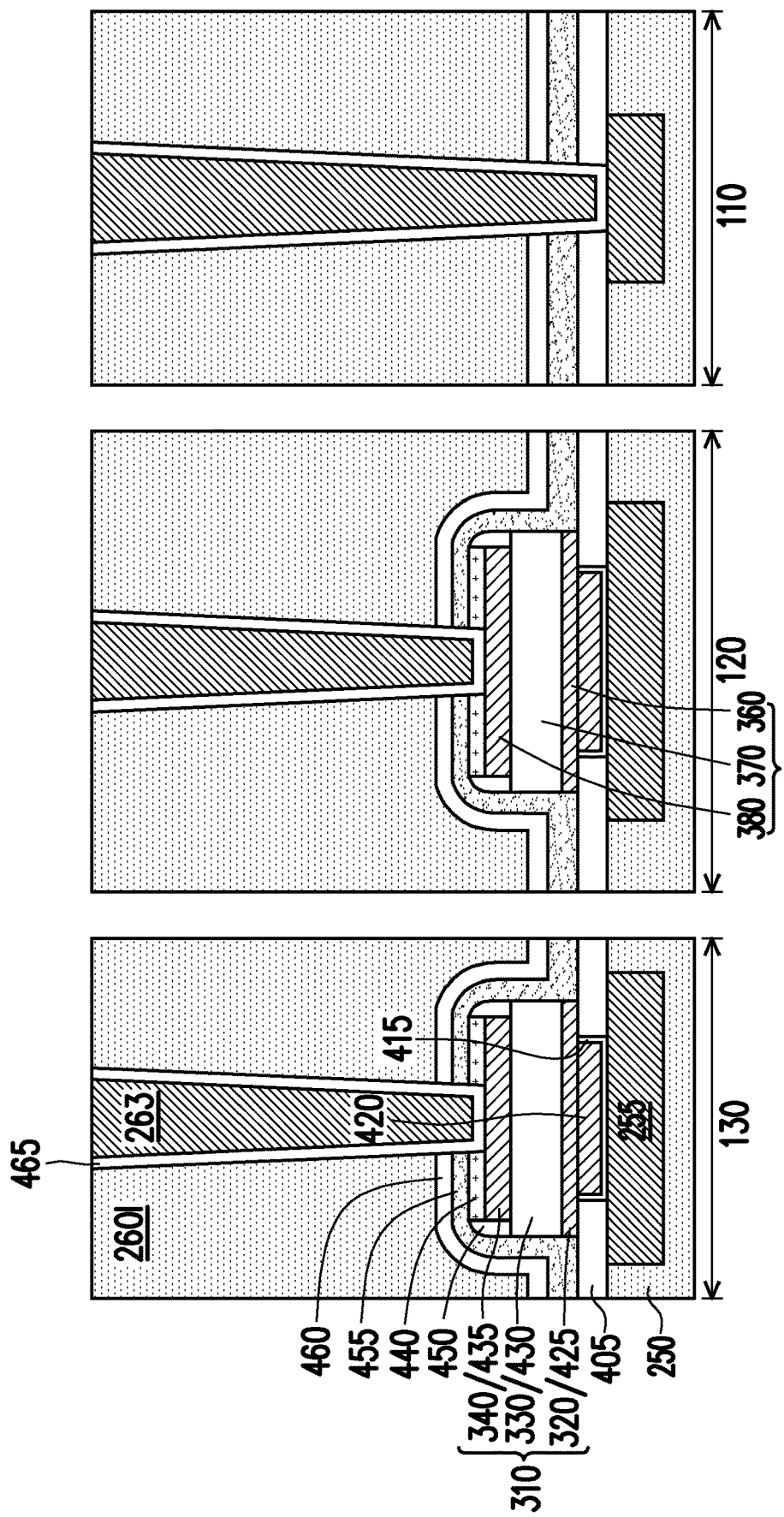

In FIG. 30, an adhesion layer 465 may be used to line the via openings 263o and may be formed using materials and processes similar to those described above with respect to the adhesion layer 415 of FIG. 20. In FIG. 31, the via 263 may be formed using materials and processes similar to those discussed above with respect to the via 420. An upper surface of the lower portion 2601 of the IMD5 260 layer may be planarized to level the upper surface of the lower portion 2601 of the IMD5 260 layer with an upper surface of the via 263.

Figure 32:
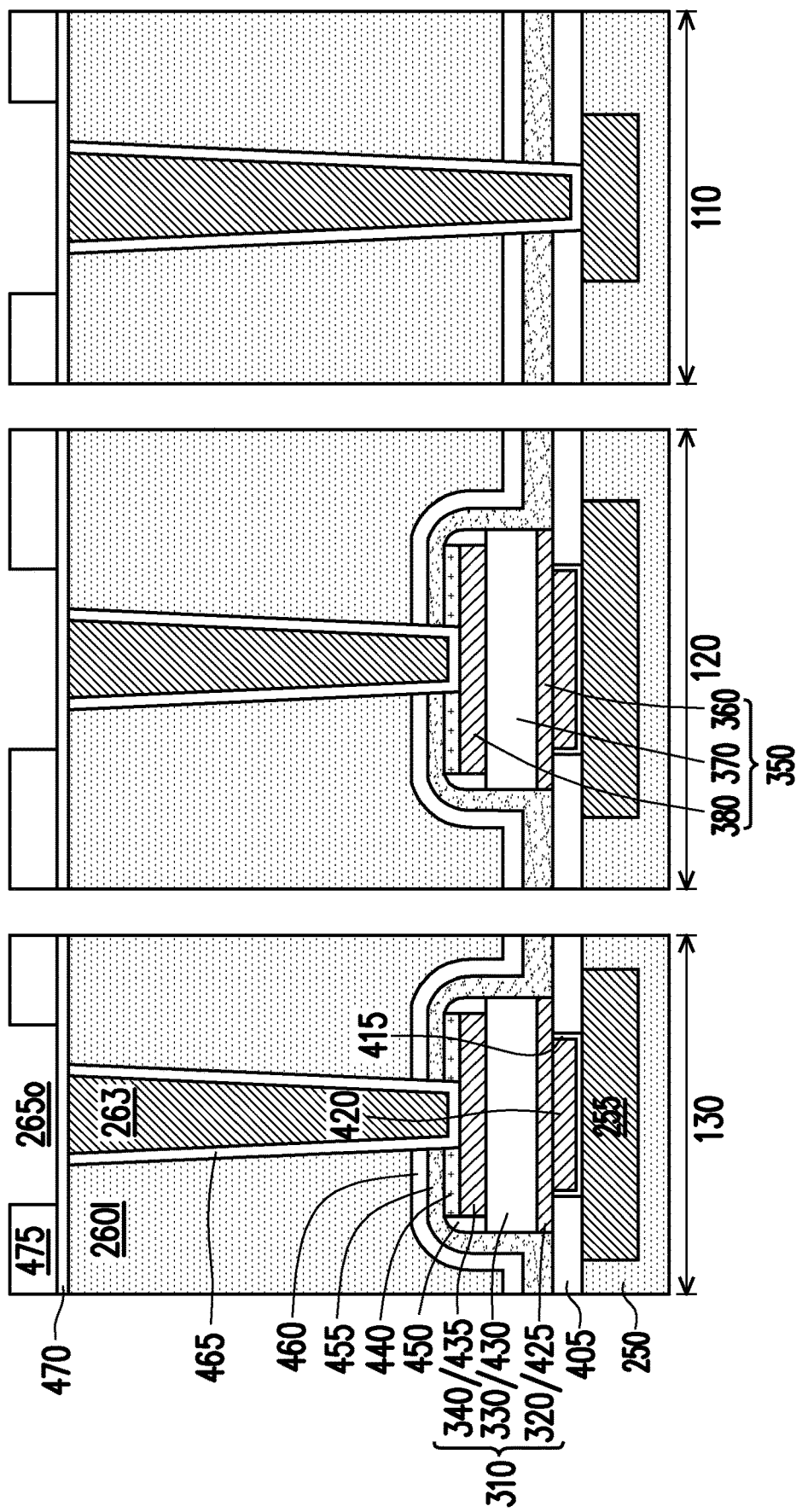

In FIG. 32, a seed layer 470 may then be deposited over the upper surface of the lower portion 2601 of the IMD5 260 layer and the upper surface of the via 263. A photoresist 475 may then be deposited over the seed layer and patterned to expose portions of the seed layer 470 corresponding to a pattern of the M5 metallization layer 265.

Figure 33:
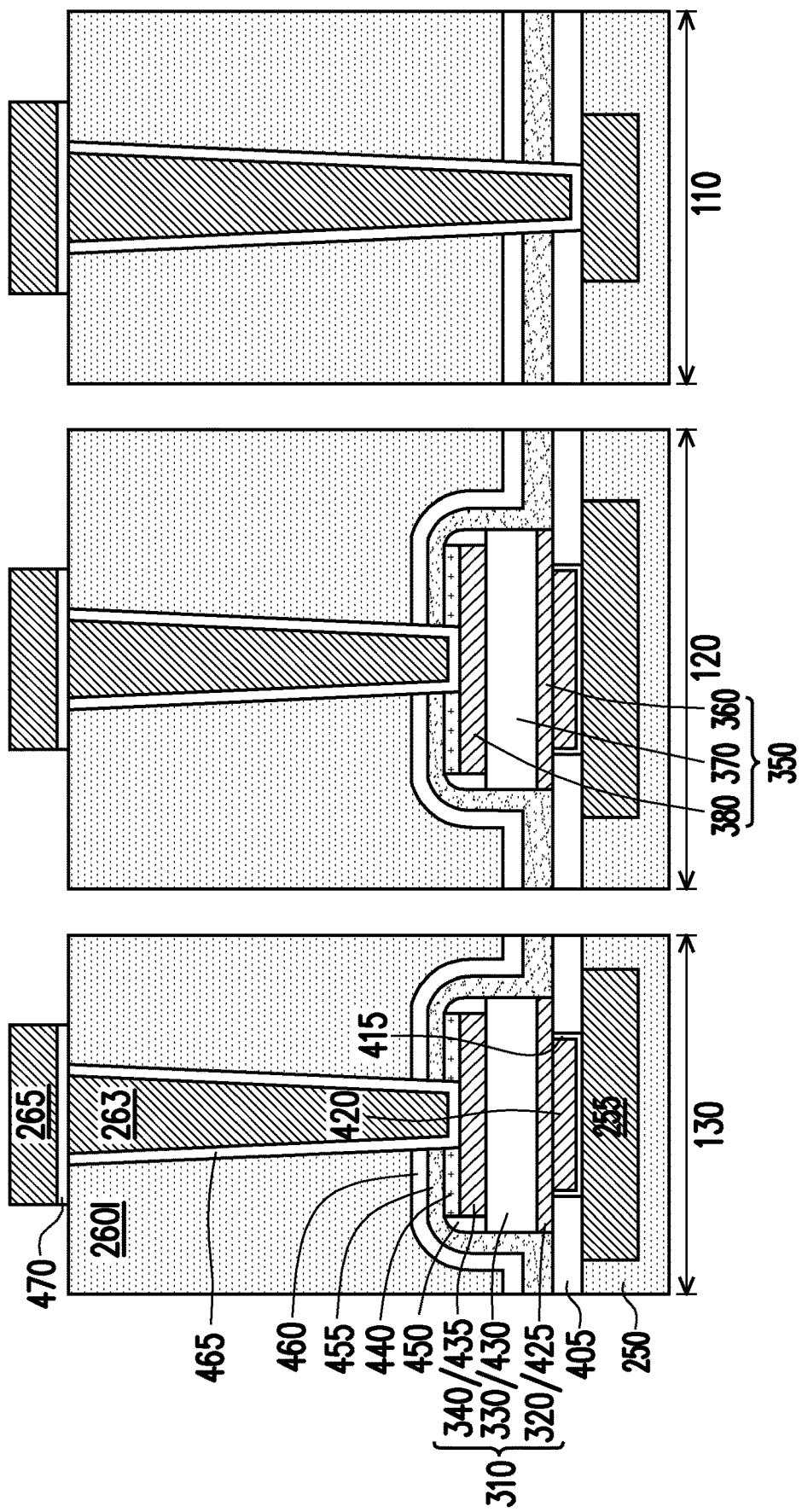

In FIG. 33, the M5 metallization layer 265 may then be deposited in the openings on the seed layer 470 using materials and processes similar to those described above with respect to the metallization layer 255. The metallization layer 255 may be deposited to a thickness between about 20 nm and about 80 nm, such as about 50 nm, though other values are contemplated and may be used. The photoresist may then be removed thereby exposing portions of the seed layer 470 not covered by the M5 metallization layer 265. The exposed portions of the seed layer 470 may then be removed by an etching process.

In FIG. 34, an upper portion 260u of the IMD5 260 layer may be deposited over the lower portion 2601 and the upper surface of the IMD5 260 layer planarized, for example, by a CMP process, to level an upper surface of the IMD5 260 layer with the upper surface of the M5 metallization layer 265.

Figure 35:
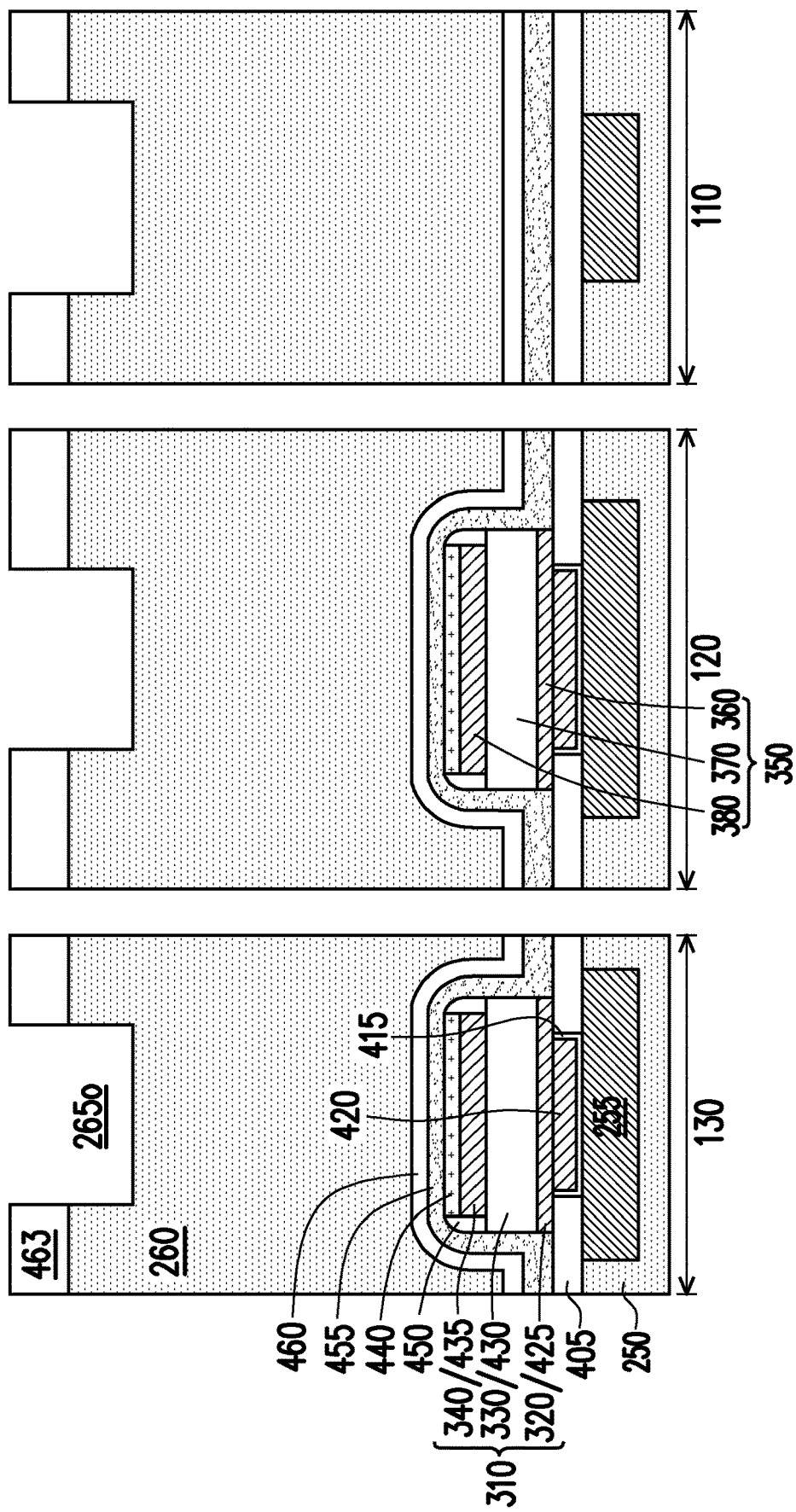
FIGS. 35 through 39 illustrate intermediate steps of forming an MFM decoupling capacitor of a decoupling capacitor structure and an FeRAM structure of an FeRAM cell region of a SOC, in accordance with some embodiments.

FIGS. 35 through 39 the IMD5 260, the vias 263, and the M5 metallization layer 265 are formed, in accordance with some embodiments. In FIG. 35, the material of the IMD5 260 layer may be formed using materials and processes similar to that discussed above with respect to the IMD4 250 layer. The IMD5 260 layer may be deposited to a thickness between about 50 nm and about 200 nm, such as about 100 nm, though other values are contemplated and may be used. Following the formation of the IMD5 260 layer, a photomask 463 may be used to pattern the metallization openings 265o corresponding to the subsequently formed M5 metallization layer 265 in the upper portion of the IMD5 260 layer. The photomask 463 may be patterned using a suitable photo-patterning process. The metallization openings 265o may be formed using any suitable technique, such as an etching process. Following the etching of the metallization openings 265o, the photomask 463 may be removed by any suitable technique, such as by an ashing process.

Figure 36:
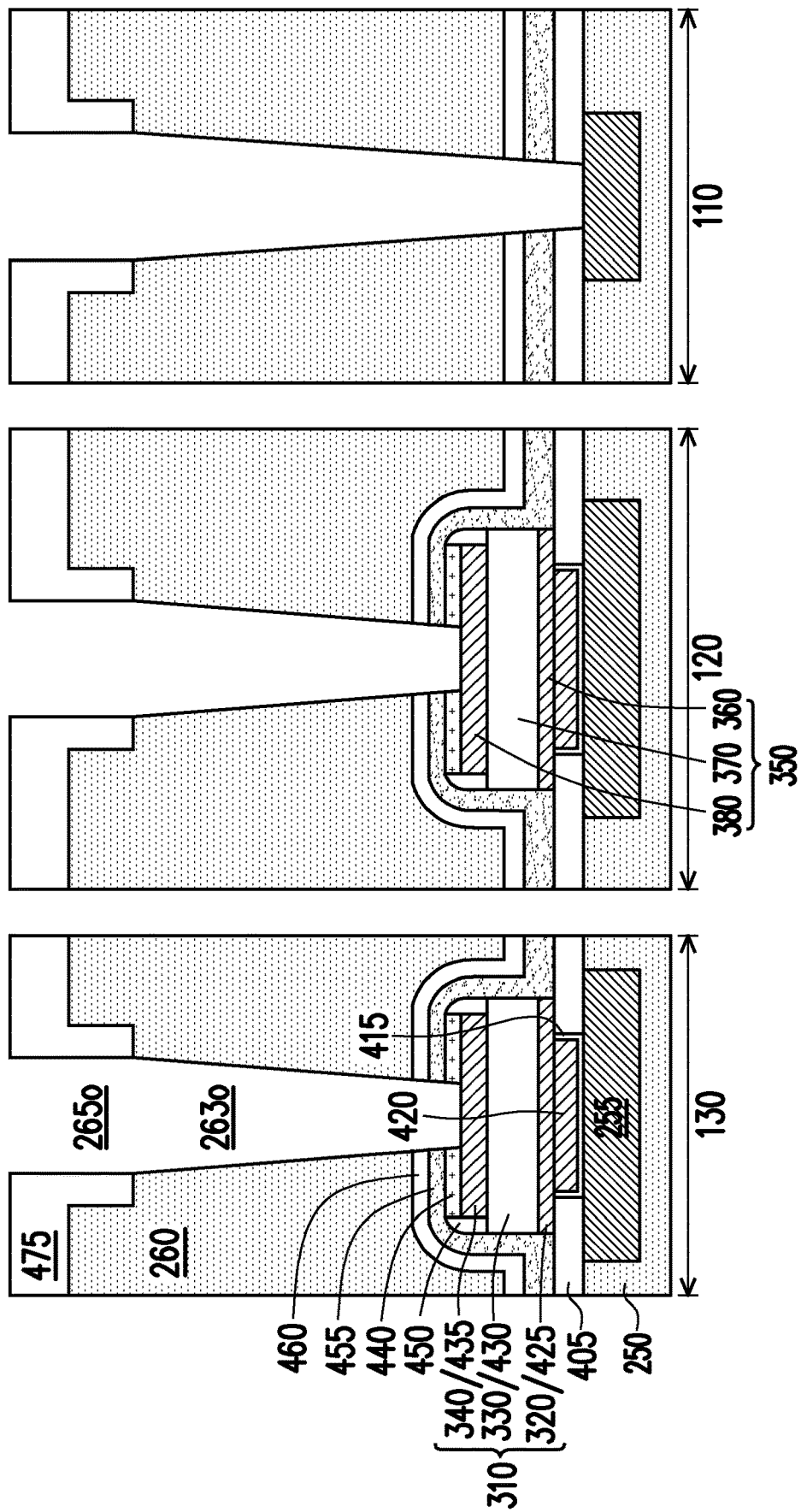

In FIG. 36, a photoresist 475 may be used to pattern via openings 263o corresponding to the subsequently formed vias 263 in a lower portion of the IMD5 260 layer. The photoresist 475 may be patterned using a suitable photo-patterning process. The via openings 263o may be formed using any suitable technique, such as an etching process. The etch stop layer 460 may be used to provide an etch stop for forming the via openings 263o. Then, the via openings 263o may be extended through the etch stop layer 460, the protective layer 455, and capping layer 440 by successive etching processes to expose a portion of the top electrode 340. Following the etching of the via openings 263o, the photoresist 475 may be removed by any suitable technique, such as by an ashing process.

Figure 37:
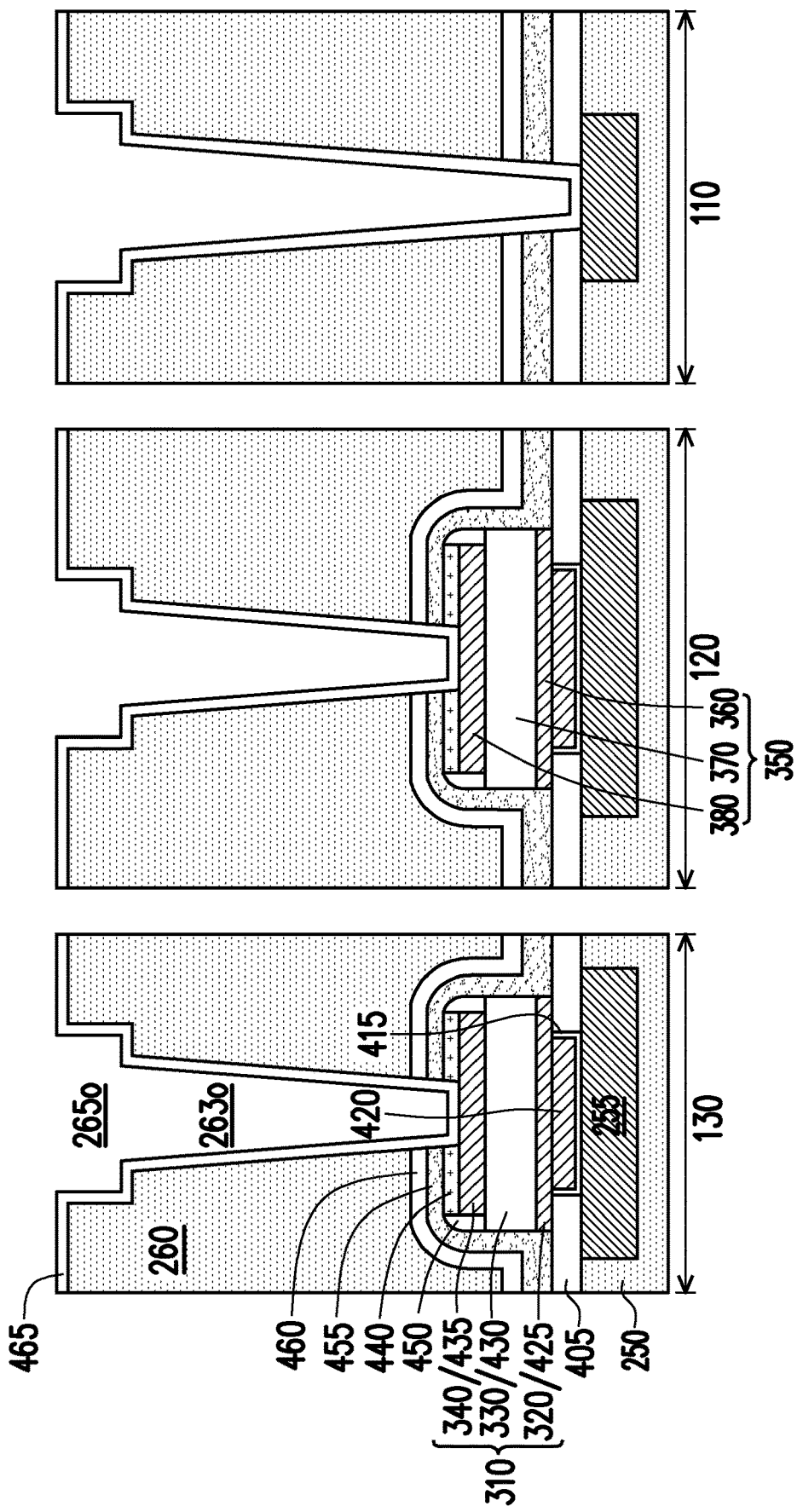
Figure 38:
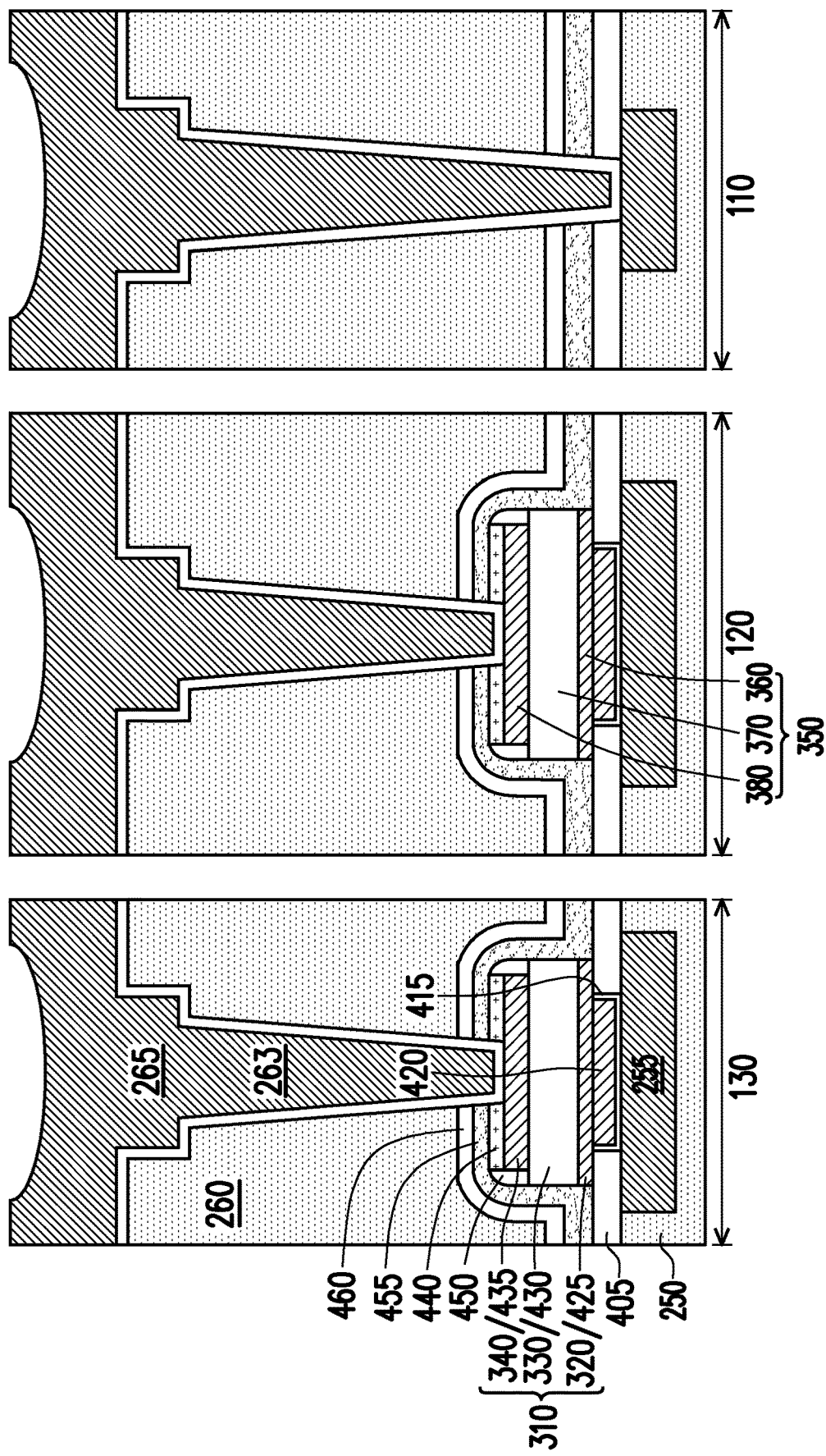

In FIG. 37, an adhesion layer 465 may be used to line the via openings 263o and the metallization opening 265o and may be formed using materials and processes similar to those described above with respect to the adhesion layer 415 of FIG. 20. In FIG. 38, the via 263 may be formed using materials and processes similar to those discussed above with respect to the via 420. The M5 metallization layer 265 may be formed by continuing to deposit the materials of the via 263 until the upper surface of the deposited material fills and extends above the M5 metallization layer 265.

Figure 39:
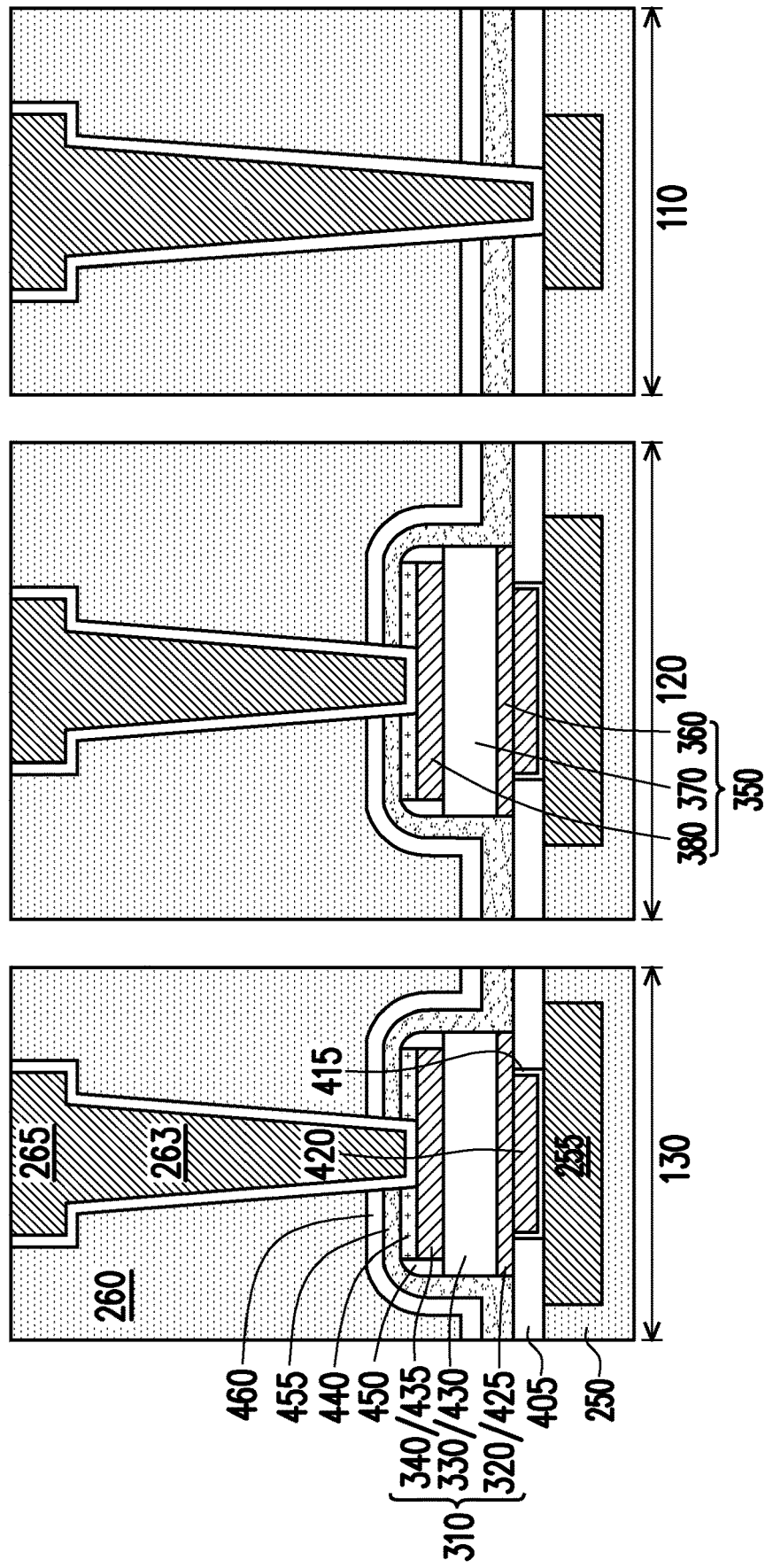

In FIG. 39, an upper surface of the IMD5 260 layer may be planarized to level the upper surface of the IMD5 260 layer with an upper surface of the M5 metallization layer 265.

It should be recognized that the processes and materials described in FIGS. 29 through 39 are merely examples, and the IMD5 260 layer, vias 263, and the M5 metallization layer 265 of the interconnect 200 may be formed using any suitable processes and materials.

FIGS. 40 through 45 illustrate a intermediate steps in the formation of the FeRAM structure 350 and decoupling capacitor structure 300, in accordance with some embodiments.

FIG. 40 illustrates an intermediate step following FIG. 23. In FIG. 40, a photoresist layer 445 may be formed over the capping layer and patterned to protect an area corresponding to the MFM decoupling capacitor 310 (see FIG. 34). An etching technique may be used to remove portions of the capping layer 440 which are exposed from the photoresist layer 445, thereby exposing portions of the top electrode layer 435. The photoresist layer 445 and/or capping layer 440 may be used as a mask in a further etching process to remove portions of the top electrode layer 435 which are exposed from the capping layer 440. The photoresist layer 445 and/or capping layer 440 may be used as a mask in a still further etching process to remove portions of the ferroelectric insulating layer 430 which are exposed from the capping layer 440. The photoresist layer 445 and/or capping layer 440 may be used as a mask in another etching process to remove portions of the bottom electrode layer 425 which are exposed from the capping layer 440. The photoresist layer 445 may be consumed in these etching processes. If any of the photoresist layer 445 remains, the photoresist layer 445 may be removed by any suitable technique, such as by an ashing process. Any suitable etching processes may be used to remove the portions of the capping layer 440, the portions of the top electrode layer 435, the portions of the ferroelectric insulating layer 430, and the portions of the bottom electrode layer 425, such as a wet etch or dry etch process.

In FIG. 41, a spacer layer 450 is deposited over the capping layer 440 and along an upper surface of the insulating layer 405. The spacer layer 450 may be formed using materials and processes similar to those discussed above with respect to the insulating layer 405 of FIG. 18. In some embodiments, the spacer layer 450 may be formed using, for example, silicon nitride. To maintain the capping layer 440 during a subsequent etching process of the spacer layer 450, the material of the spacer layer 450 should be different than the material of the capping layer 440.

In FIG. 42, an anisotropic etching technique, such as a reactive ion etch (RIE) or dry etch, may be used to remove horizontal portions of the spacer layer 450. As a result, the spacer layer 450 remains on sidewalls of the bottom electrode 320, ferroelectric insulating layer 330, top electrode 340, and capping layer 440 of the MFM decoupling capacitor 310 and FeRAM structures 350 (see FIG. 45). As a result, the upper surface of the insulating layer 405 is exposed adjacent to the spacer layer 450.

In FIG. 43, a protective layer 455 may be deposited over the upper surface of the insulating layer 405, over the spacer layer 450 and capping layer 440, and along sidewalls of the spacer layer 450. The protective layer 455 may be formed using materials and techniques such as those discussed above with respect to the insulating layer 405. As such, the protective layer 455 sandwiches the MFM decoupling capacitor 310 and and FeRAM structures 350 (see FIG. 45) between the protective layer 455 and the insulating layer 405.

Figure 44:
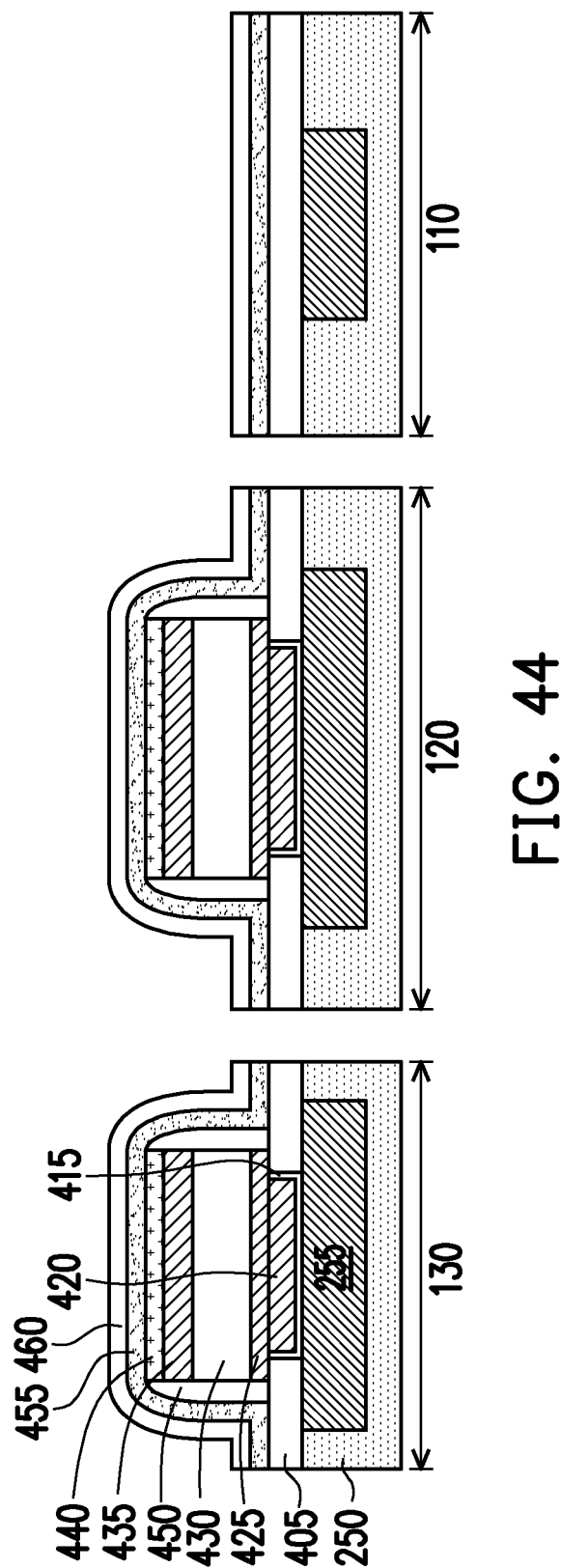

In FIG. 44, an etch stop layer 460 may be deposited over the protective layer 455. Etch stop layer 460 may comprise a nitride, oxide, carbide, carbon-doped oxide, and/or combinations thereof. In some embodiments, etch stop layer 460 may also include metal or semiconductor material, such as an oxide, nitride, or carbide of a metal or semiconductor material. Such materials may include, for example, aluminum nitride, aluminum oxide, silicon oxide, silicon carbide, silicon nitride, silicon carbide, and the like. The etch stop layer 460 may include multiple layers of the same or different material. Etch stop layer 460 may be formed by any suitable method, such as by Plasma Enhanced Chemical Vapor Deposition (PECVD) or other methods such as High-Density Plasma CVD (HDPCVD), Atomic Layer Deposition (ALD), low pressure CVD (LPCVD), physical vapor deposition (PVD), and the like. In some embodiments, etch stop layer 460 may be a TEOS formed silicon oxide layer.

Figure 45:
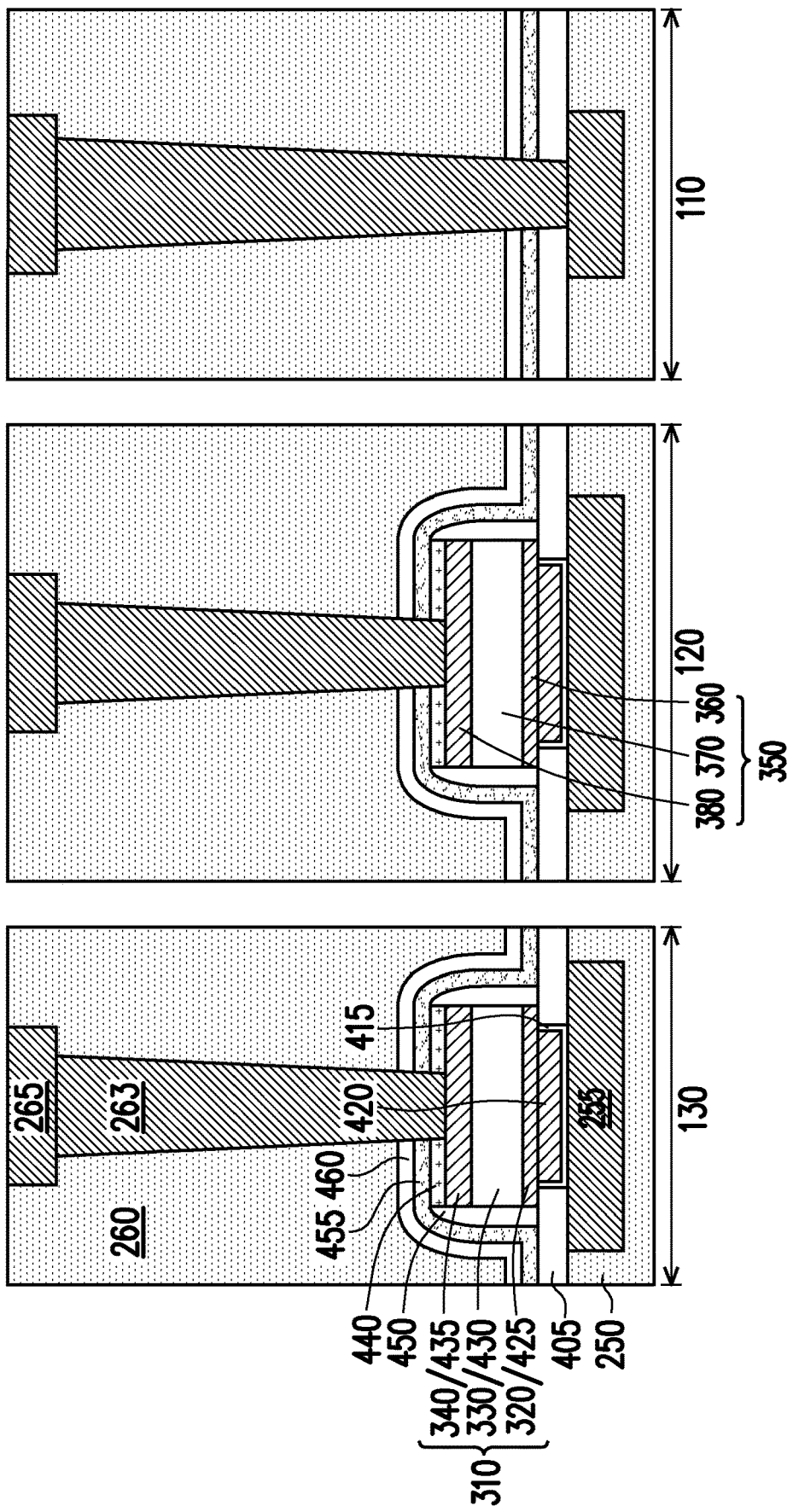

In FIG. 45, the IMD5 260 layer, vias 263, and M5 metallization layer 265 may be formed using any acceptable processes. For example, the IMD5 260 layer, the vias 263, and the M5 metallization layer 265 may be formed using processes described above with respect to FIGS. 29 through 34 or with respect to FIGS. 35 through 39.

FIGS. 46 through 54 illustrate intermediate steps in the formation of an MFM decoupling capacitor 310 and a FeRAM structure 350 (see FIG. 54) of a FeRAM cell region 120, resulting in cup shaped capacitors, in accordance with some embodiments.

FIG. 46 illustrates a top portion of a layer of the interconnect 200. As illustrated in FIG. 46, the layer of the interconnect 200 illustrated is the IMD4 250 layer with the metallization layer 255, although other layers of the interconnect 200 may be used. IMD4 250 and metallization layer 255 may be formed using processes and materials similar to those discussed above with respect to FIG. 17.

In FIG. 47, an insulating layer 505 is deposited over the IMD4 250 layer and metallization layer 255. The insulating layer 505 may be made of any suitable insulating material, such as carbides, nitrides, and oxides, such as silicon carbide, silicon oxide, silicon nitride, silicon oxynitride, and so forth. The insulating layer 505 may be formed using any suitable deposition method. In some embodiments, the insulating layer 505 may be formed by a CVD process, an ALD process, a Plasma Enhance CVD (PECVD) process, or the like. The insulating layer 505 can serve as an etch stop layer in a subsequent etching process. The insulating layer 505 may be deposited to a thickness between about 5 nm and about 20 nm, such as about 10 nm, though other values are contemplated and may be used.

Figure 48:
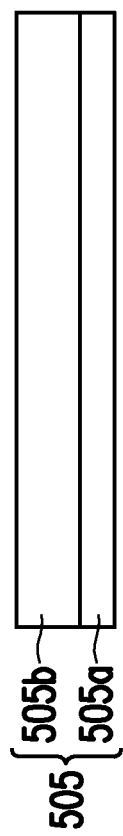

In FIG. 48, in some embodiments, the insulating layer 505 may include multiple layers, such as insulating layer 505a and insulating layer 505b. Both the insulating layer 505a and insulating layer 505b may be made of any suitable insulating material, such as carbides, nitrides, and oxides, such as silicon carbide, silicon oxide, silicon nitride, silicon oxynitride, and so forth. The insulating layer 505a and the insulating layer 505b may be formed using any suitable deposition method. In some embodiments, the insulating layer 505a may be formed by a CVD process, an ALD process, a Plasma Enhance CVD (PECVD) process, or the like and the insulating layer 505b may be formed by a similar process. In some embodiments the material of the insulating layer 505a and the insulating layer 505b may be the same material or may be different materials. In one embodiment, the insulating layer 505b may include a silicon oxide layer formed using a TEOS deposition process. The insulating layer 505a may be deposited to a thickness between about 2 nm and about 10 nm, such as about 5 nm. The insulating layer 505b may be deposited to a thickness between about 3 nm and about 10 nm, such as about 5 nm, though other values are contemplated and may be used.

Figure 49:
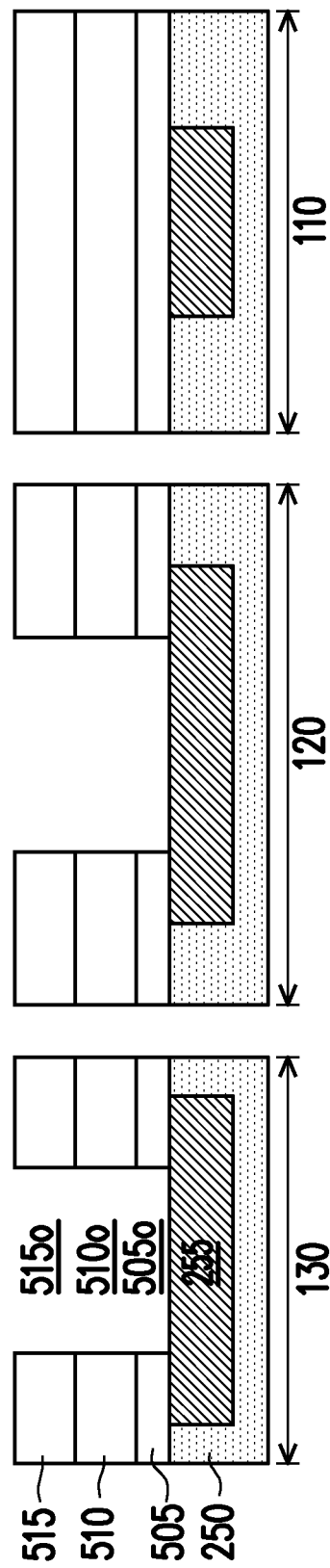

In FIG. 49, an optional spacer layer 510 may be deposited over the insulating layer 505. When the spacer layer 510 is used, the spacer layer 510 provides vertical spacing based on the thicknesses of the layers of the cup shaped capacitor. In some embodiments, rather than deposit a separate spacer layer 510, the insulating layer 505 may instead be made to be thicker. The spacer layer 510 may be formed using materials and processes similar to those discussed with respect to the IMD4 250 layer, including for example, a low-k dielectric material. The spacer layer 510 may be deposited to a thickness between about 5 nm and about 20 nm, such as about 10 nm, though other values are contemplated and may be used. Also illustrated in FIG. 49, a photoresist 515 is deposited over the insulating layer 505 (and spacer layer 510, if used) and patterned using acceptable photo patterning techniques. The photoresist 515 may be formed using any suitable photo-patternable material and may be deposited using any acceptable techniques such as by a spin-on technique. After the photoresist 515 is patterned to form an opening 515o therein, the pattern of the patterned photoresist 515 is transferred to the spacer layer 510 (if used) by any suitable etching technique to form an opening 510o therein. The pattern may also be transferred to the insulating layer 505 to form an opening 505o therein, where the opening 505o exposes a portion of the metallization layer 255. Following the formation of the opening 505o in the insulating layer 505, the photoresist 515 may be removed by any suitable technique, such as by an ashing process.

In FIG. 50, a bottom electrode layer 520 may be deposited over the insulating layer 505 (or over the spacer layer 510, if used) and along the sidewalls and the bottom of the opening 505o. The material of the bottom electrode layer 520 may include any suitable conductive material, such as titanium nitride, tantalum nitride, titanium, tantalum, aluminum, tungsten, cobalt, copper, or the like. The conductive material of the bottom electrode layer 520 may be formed by any suitable deposition process, such as by DC PVD, RFDC PVD, CVD, ALD, pulse DC, PVD, and the like. The bottom electrode layer 425 may be deposited to a thickness between about 2 nm and about 30 nm, such as about 10 nm, though other values are contemplated and may be used.

In FIG. 51, following the deposition of the bottom electrode layer 520, a ferroelectric insulating layer 530 may be deposited over the bottom electrode layer 520 and along the sidewalls and bottom of the opening 505o. The ferroelectric insulating layer 530 may use any suitable dielectric material for an FeRAM insulating layer, such as lead zirconate titanate (PZT), hafnium oxide (HfO2), hafnium zirconium oxide (HZO), silicon doped hafnium oxide (Si:HfO or HSO), silicon doped hafnium zirconium oxide, or any other suitable dielectric materials. The ferroelectric insulating layer 430 may be formed any suitable technique, such as by CVD process, an ALD process, a Plasma Enhance CVD (PECVD) process, or the like. The ferroelectric insulating layer 430 may be deposited to a thickness between about 1 nm and about 15 nm, such as about 10 nm, though other values are contemplated and may be used.

In FIG. 52, a top electrode layer 540 may be deposited over the ferroelectric insulating layer 530. The material of the top electrode layer 540 may include any suitable conductive material, such as titanium nitride, tantalum nitride, titanium, tantalum, aluminum, tungsten, cobalt, copper, or the like. The conductive material of the top electrode layer 540 may be formed by any suitable deposition process, such as by electro-plating, electroless-plating, DC PVD, RFDC PVD, CVD, ALD, pulse DC, PVD, and the like. The conductive material of the top electrode layer 540 may extend above the opening 505o. The top electrode layer 540 may be deposited to a thickness between about 5 nm and about 50 nm, such as about 10 nm, though other values are contemplated and may be used.

In FIG. 53, a planarization process, such as a chemical mechanical polishing (CMP) process may be used to level the upper surfaces of the top electrode layer 540, ferroelectric insulating layer 530, bottom electrode layer 520, and spacer layer 510 (or insulating layer 505, if the spacer layer 510 is not used) with each other. As such the MFM decoupling capacitors 310 and a FeRAM structure 350 (see FIG. 54) of FeRAM cell region 120 are formed.

Figure 54:
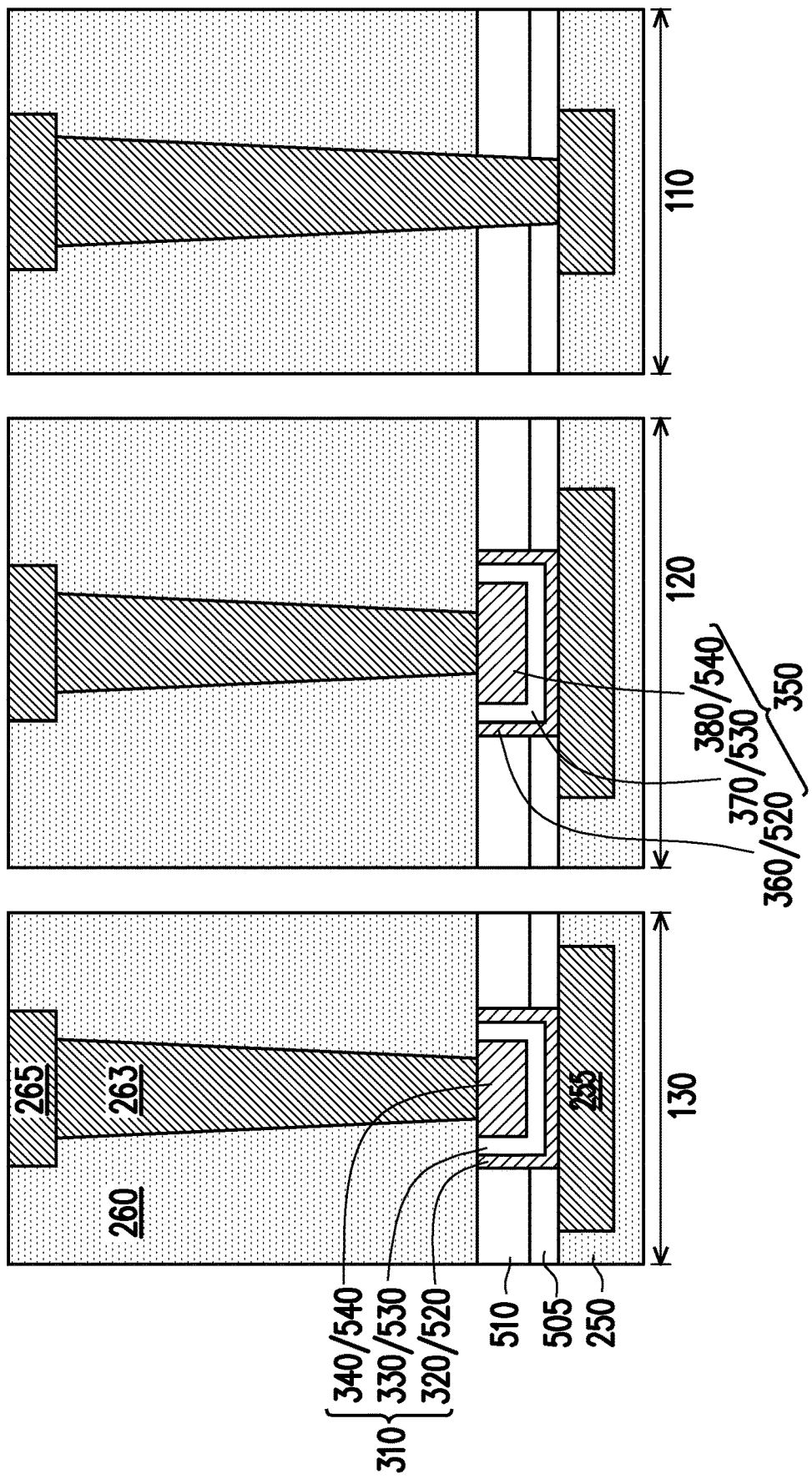
Figure 55:
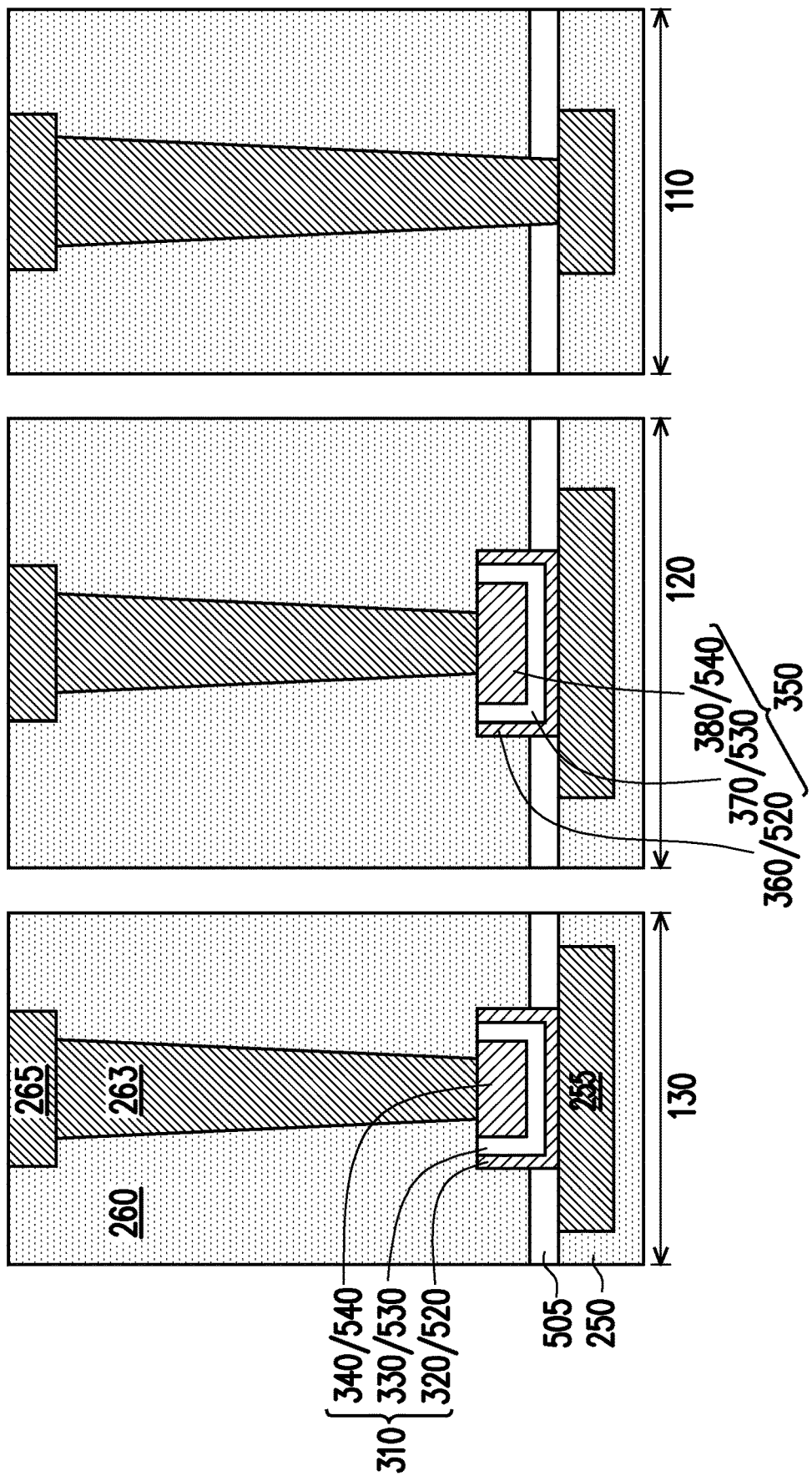

In FIG. 54, the IMD5 260 layer, via 263, and M5 metallization layer 265 are formed, in accordance with some embodiments. The IMD5 260 layer, the via 263, and the M5 metallization layer 265 may be formed using any of the processes and materials described above with respect to FIGS. 29 through 34 or FIGS. 35 through 39 or by any suitable process. In some embodiments, the IMD5 260 layer may be deposited over the spacer layer 510. In other embodiments, the spacer layer 510 may be removed prior to depositing the IMD5 260 layer. For example in FIG. 55, the spacer layer 510 may be removed prior to depositing the IMD5 260 layer. As such, in some embodiments the IMD5 260 layer may continuously extend from an area lateral to the MFM decoupling capacitor 310 and FeRAM structure 350 above and over the MFM decoupling capacitor 310 and FeRAM structure 350.

Figure 56:
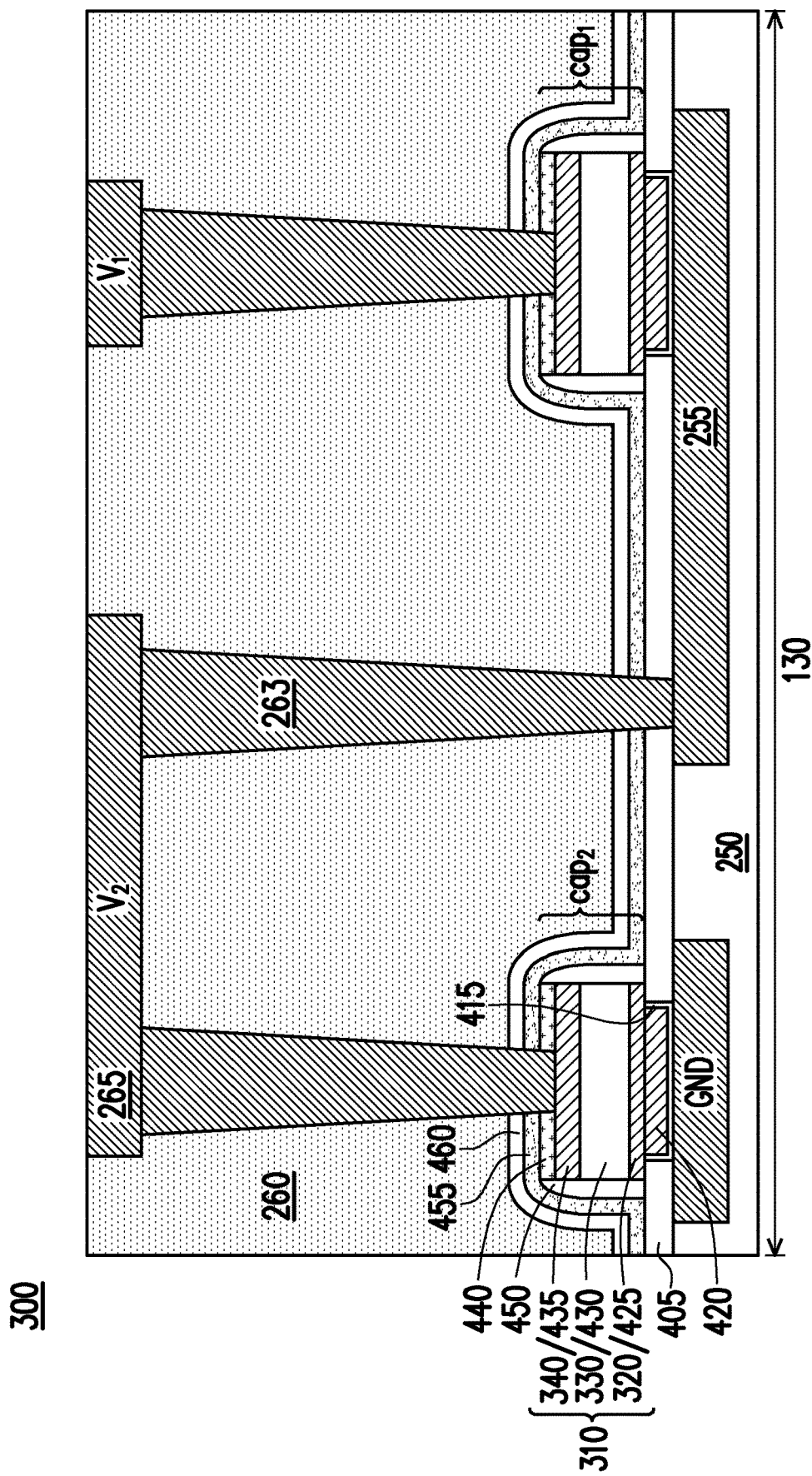
FIG. 56 illustrates a decoupling capacitor structure of a SOC, in accordance with some embodiments.

In FIG. 56, an example decoupling capacitor structure 300 is illustrated in greater detail, in accordance with some embodiments. The example decoupling capacitor structure 300 uses the processes described in FIGS. 40 through 45 with the structure described above with respect to FIG. 2, to form a forward series connected decoupling capacitor structure 300 with two MFM decoupling capacitors 310 coupled together in a series arrangement. In particular, a voltage signal $V_1$ is provided in the M5 metallization layer 265. A via 263 is provided to bring the $V_1$ voltage signal to a top electrode 340 of $cap_1$. The bottom electrode 320 of $cap_1$ is electrically coupled to the metallization layer 255 which provides the voltage signal $V_2$ to a portion of the M5 metallization layer 265 by another via 263 through the ILD5 260 layer. The voltage signal $V_2$ is then provided by another via 263 to the top electrode 340 of $cap_2$. The ground signal GND is electrically coupled to the bottom electrode 320 of $cap_2$.

It should be apparent to one of ordinary skill in the art that the processes described above in the formation of the MFM decoupling capacitors 310 may be used to provide any number of MFM decoupling capacitors which are coupled together in any of the arrangements discussed above, for example, with respect to FIGS. 2 through 13.

Figure 57:
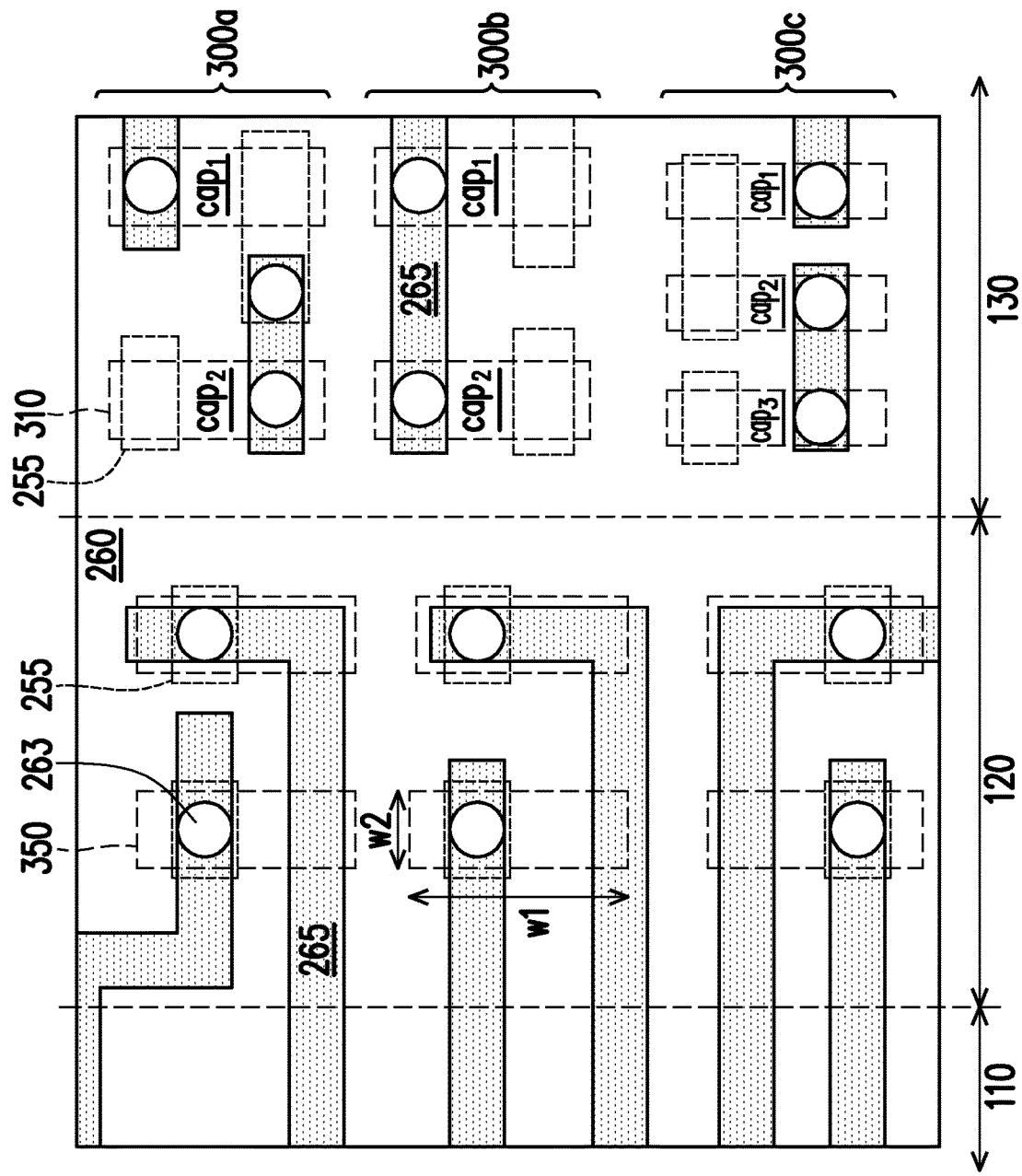
FIG. 57 illustrates a top down view of a layer of an interconnect of an SOC, in accordance with some embodiments.

FIG. 57 illustrates a top down view of a portion of the IMD5 260 layer of the interconnect 200. This view provides a combined view illustration of the M5 metallization layer 265, vias 263, MFM decoupling capacitors 310, FeRAM structures 350, and metallization layer 255. The M5 metallization layer 265 of the interconnect 200 is shown in solid outlines. The metallization layer 255 of the interconnect 200 is shown in double dashed outline. The vias 263 of the interconnect 200 are shown in solid outline circles. The MFM decoupling capacitors 310 and FeRAM structures 350 are shown in single dashed outline. The logic region 110, FeRAM cell region 120, and the decoupling capacitor region 130 are each illustrated, however it should be understood that they may be disposed anywhere within the SOC 100.

FIG. 57 further illustrates three decoupling capacitor structures 300a, 300b, and 300c. The decoupling capacitor structure 300a illustrates two series coupled MFM decoupling capacitors 310 which are coupled in accordance with embodiments similar to that illustrated in FIG. 2. The decoupling capacitor structure 300b illustrates two series coupled MFM decoupling capacitors 310 which are coupled in accordance with embodiments similar to that illustrated in FIG. 4. The decoupling capacitor structure 300c illustrates three series coupled MFM decoupling capacitors 310 which are coupled in accordance with embodiments similar to that illustrated in FIG. 8.

In particular, with regard to decoupling capacitor structure 300a, a portion of the M5 metallization layer 265 is routed to the MFM decoupling capacitor 310 $cap_1$ by via 263. A portion of metallization layer 255 couples $cap_1$ to the M5 metallization layer 265 which is coupled to $cap_2$ by another via 263. With regard to decoupling capacitor structure 300b, a portion of the metallization layer 255 is coupled to the MFM decoupling capacitor 310 $cap_1$ which is coupled to the M5 metallization layer 265 by a via 263. The M5 metallization layer 265 is coupled to the MFM decoupling capacitor 310 $cap_2$ which is coupled to another portion of the metallization layer 255. With regard to decoupling capacitor structure 300c, a portion of the M5 metallization layer 265 is coupled to the MFM decoupling capacitor 310 $cap_1$ by a via 263 which is coupled to a portion of the metallization layer 255. The metallization layer 255 is coupled to the MFM decoupling capacitor 310 $cap_2$ which is coupled to another portion of the M5 metallization layer 265 by another via 263 which is coupled to the MFM decoupling capacitor 310 $cap_3$ by another via 263. MFM decoupling capacitor 310 $cap_3$ is coupled to another portion of the metallization layer 255. These decoupling capacitor structures 300 are examples for illustration purposes only and are not limiting. One of skill will understand that there are many ways to connect the various components together electrically and physically to achieve the results of these components.

FIG. 57 also illustrates several FeRAM structures 350 in FeRAM cell region 120. FeRAM structures 350 are coupled to the M5 metallization layer 265 by vias 263. The FeRAM structures 350 may have a width w1 between about 5 nm and about 50 nm, such as about 10 nm, and a width w2 between about 5 nm and about 50 nm, such as about 10 nm, though other values are contemplated. The MFM decoupling capacitors 310 may have dimensions which also are within these ranges. The MFM decoupling capacitors 310 may have the same dimensions or different dimensions from the dimensions of the FeRAM structures 350.

Although the FeRAM structures 350 and MFM decoupling capacitors 310 are illustrated as having a rectangular shape, it should be understood that they may be any shape, including for example circles, ovals, regular or irregular polygons, squares, and so forth. Similarly, although the vias 263 are illustrated as being circular, it should be understood that they may be any shape, including for example, squares, rectangles, ovals, regular or irregular polygons, and so forth.

It should be understood that the above embodiments may be combined without limitation to form the various MFM decoupling capacitor series configurations noted above.

Embodiments include FeRAM memory cells which are disposed in the layers of an interconnect over memory access transistors. An FeRAM cell uses a type of MIM capacitor (a MFM capacitor) where the insulator layer is a ferroelectric insulator. Embodiments also simultaneously form decoupling capacitors using the same materials in other areas of the chip. These decoupling capacitors can be used to decouple voltage signals connected to a device in a logic area or peripheral area of the device. In order to increase the power handling, some of the decoupling capacitors can be arranged in series so that they act as voltage dividers across each capacitor. These decoupling capacitors can be formed and coupled together as needed with minimal extra cost in steps or materials.

One embodiment is a device including an access transistor in a memory region of the device, a first ferroelectric random access memory (FeRAM) memory element disposed in the memory region of the device in a first inter-metal dielectric (IMD) layer over the access transistor, where the first FeRAM memory element is coupled to the access transistor. The first FeRAM memory element includes a bottom electrode, top electrode over the bottom electrode, and a ferroelectric insulating layer interposed between the top electrode and the bottom electrode. The device also includes one or more metal-ferroelectric insulator-metal (MFM) capacitors disposed in a peripheral region of the device in the first IMD layer of the device, the one or more MFM capacitors each having a same structure as the first FeRAM memory element. In an embodiment, the first FeRAM memory element is electrically coupled to a first source/drain of the access transistor, and further includes a second FeRAM memory element in the first IMD layer of the device electrically coupled to a second source/drain of a second access transistor, and that the second FeRAM memory element has a same structure as the first FeRAM memory element. In an embodiment, the first FeRAM memory element is electrically coupled to a common drain of the access transistor and a second access transistor. In an embodiment, the one or more MFM capacitors include a first MFM capacitor and a second MFM capacitor coupled in series. In an embodiment, the bottom electrode of the first MFM capacitor is electrically coupled to the top electrode of the second MFM capacitor. In an embodiment, the bottom electrode of the first MFM capacitor is electrically coupled to the bottom electrode of the second MFM capacitor. In an embodiment, the top electrode of the first MFM capacitor is electrically coupled to the top electrode of the second MFM capacitor. In an embodiment, the one or more MFM capacitors include a third MFM capacitor coupled in series with the first MFM capacitor and the second MFM capacitor. In an embodiment, the bottom electrode of each of the one or more MFM capacitors includes a sidewall portion and a bottom portion, the sidewall portion surrounding the ferroelectric insulating layer and the top electrode.

Another embodiment is a device including a logic region, the logic region including a logic element; a ferroelectric random access memory (FeRAM) region; a metal-ferroelectric insulator-metal (MFM) decoupling capacitor region; and one or more inter-metal dielectric (IMD) layers spanning over the logic region, the FeRAM region, and the MFM decoupling capacitor region. The device also includes a first FeRAM element in a first IMD layer of the one or more IMD layers in the FeRAM region, the first FeRAM element coupled to a source/drain of a transistor in the FeRAM region. The device further includes a first MFM decoupling capacitor in the first IMD layer in the MFM decoupling capacitor region, the first MFM decoupling capacitor coupled to the logic element, where a structure of the first MFM decoupling capacitor is the same as a structure of the first FeRAM element. In an embodiment, the device includes a second MFM decoupling capacitor in the first IMD layer in the MFM decoupling capacitor region, the second MFM decoupling capacitor electrically coupled in series to the first MFM decoupling capacitor. In an embodiment, a top electrode of the first FeRAM element and a top electrode of the first MFM decoupling capacitor are each electrically coupled to a metallization layer embedded in the first IMD layer. In an embodiment, the first MFM decoupling capacitor includes a bottom electrode, a ferroelectric insulator, and a top electrode, the bottom electrode surrounding sidewalls of the ferroelectric insulator, the ferroelectric insulator surrounding sidewalls of the top electrode. In an embodiment, the first MFM decoupling capacitor includes a bottom electrode, a ferroelectric insulator, and a top electrode, the top electrode having a first width which is narrower than a second width of the ferroelectric insulator.

Another embodiment is a method including depositing a bottom electrode layer over and coupled to a first metallization layer, and depositing a first insulating layer over the bottom electrode layer, where the first insulating layer includes a ferroelectric insulating material. A top electrode layer is deposited over the first insulating layer. The top electrode layer, the first insulating layer, and the bottom electrode layer are separated into a plurality of capacitors, where each of the capacitors includes a top electrode, a ferroelectric insulator, and a bottom electrode. A first capacitor of the plurality of capacitors is electrically coupled to a memory access transistor, the first capacitor storing a memory value, where a second capacitor of the plurality of capacitors is electrically coupled to a logic component. A second insulating layer is deposited over the plurality of capacitors, the second insulating layer laterally surrounding the plurality of capacitors. A second metallization layer is formed over the second insulating layer, the second metallization layer electrically coupled to the top electrode of each of the plurality of capacitors. In an embodiment, a third capacitor of the plurality of capacitors is electrically coupled in series to the second capacitor. In an embodiment, the method further includes that prior to depositing the bottom electrode layer, a third insulating layer is deposited over the first metallization layer, and an opening is patterned in the third insulating layer, the opening exposing a portion of the first metallization layer, where the separating includes performing a planarization process to level an upper surface of the top electrode of the first capacitor with an upper surface of the ferroelectric insulator, an upper surface of the bottom electrode, and an upper surface of the third insulating layer with each other. In an embodiment, the method further includes depositing a capping layer over the top electrode layer; patterning the capping layer and the top electrode layer to form capacitor outlines of the plurality of capacitors; forming a spacer layer over the capacitor outlines; and etching the spacer layer to remove horizontal portions of the spacer layer, where separating the first insulating layer and the bottom electrode layer includes etching the first insulating layer and the bottom electrode layer while using the spacer layer and capping layer as an etch mask. In an embodiment, the method further includes depositing a spacer layer over the top electrode of the first capacitor; etching the spacer layer to remove horizontal portions of the spacer layer, the spacer layer encircling sidewalls of the top electrode, ferroelectric insulator, and bottom electrode of the first capacitor; and depositing a fourth insulating layer over the first metallization layer, the spacer layer, and the top electrode.

Another embodiment is a method including forming an interconnect structure over an access transistor in a memory region over a substrate, the interconnect structure continuing across through a first region over the substrate, the first region being a different region than the memory region. The method also includes forming a first ferroelectric random access memory (FeRAM) memory element disposed in the memory region in a first inter-metal dielectric (IMD) layer of the interconnect structure, the first FeRAM memory element electrically coupled to the access transistor. The method also includes while forming the first FeRAM memory element, simultaneously forming one or more metal-ferroelectric insulator-metal (MFM) capacitors disposed in the first region in the first IMD layer, the one or more MFM capacitors each having a same structure as the first FeRAM memory element. The method also includes coupling a first capacitor of the one or more MFM capacitors to a device disposed over the substrate.

Another embodiment is a method including forming an interconnect over a substrate, the interconnect extending over a memory access transistor disposed in the substrate and over a logic component disposed in the substrate. The method also includes depositing a bottom electrode over and coupled to a first metallization layer of the interconnect. The method also includes depositing a first insulating layer over the bottom electrode, the first insulating layer including a ferroelectric insulating material. The method also includes depositing a top electrode over the first insulating layer. The method also includes separating the bottom electrode, the first insulating layer, and the top electrode into a first capacitor, a second capacitor, and a third capacitor, each of the first capacitor, second capacitor, and third capacitor including respective portions of the bottom electrode, the first insulating layer, and the top electrode. The method also includes depositing a second insulating layer over and laterally surrounding the first capacitor, the second capacitor, and the third capacitor, the second insulating layer including a different material composition than the ferroelectric insulating material, where the first capacitor is electrically coupled to the memory access transistor. The method also includes depositing a second metallization layer over the second insulating layer, where portions of the second metallization layer are coupled to the top electrode of each of the first capacitor, the second capacitor, and the third capacitor, where the third capacitor is electrically coupled to the logic component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a bottom electrode layer over and coupled to a first metallization layer;
    depositing a first insulating layer over the bottom electrode layer, the first insulating layer comprising a ferroelectric insulating material;
    depositing a top electrode layer over the first insulating layer; and
    separating the bottom electrode layer, the first insulating layer, and the top electrode layer into a plurality of capacitors, wherein the step of separating includes
        patterning the top electrode layer in a first patterning step,
        forming spacers on sidewalls of the patterned top electrode layer,
        after forming the spacers, patterning the first insulating layer and the bottom electrode layer in a second patterning step, different from the first patterning step,
        each of the capacitors comprising a bottom electrode, a ferroelectric insulator, and a top electrode.

2. The method of claim 1, wherein a third capacitor of the plurality of capacitors is electrically coupled in series to a the second capacitor.

3. The method of claim 1, further comprising:
    prior to depositing the bottom electrode layer, depositing a third insulating layer over the first metallization layer; and
    patterning an opening in the third insulating layer, the opening exposing a portion of the first metallization layer, and
    forming a conductive via in the opening.

4. The method of claim 1, further comprising:
    depositing a capping layer over the top electrode layer; and
    patterning the capping layer, wherein separating the first insulating layer and the bottom electrode layer comprises etching the first insulating layer and the bottom electrode layer while using the patterned capping layer as an etch mask.

5. The method of claim 1, wherein the step of forming spacers on sidewalls of the patterned top electrode layer, includes:
    depositing a spacer layer over the top electrode of the patterned top electrode layer; and
    etching the spacer layer to remove horizontal portions of the spacer layer, vertical portions of the spacer layer encircling sidewalls of the top electrode.

6. The method of claim 1, further comprising:
    prior to depositing the bottom electrode layer, depositing a third insulating layer over the first metallization layer;
    patterning an opening in the third insulating layer, the opening exposing a portion of the first metallization layer;
    forming an adhesion layer in the opening;
    filling the opening with a conductive material; and
    planarizing the conductive material and the adhesion layer to level an upper surface of the conductive material with an upper surface of the third insulating layer.

7. The method of claim 1, further comprising:
    electrically coupling a first capacitor of the plurality of capacitors to a memory access transistor, electrically coupling a second capacitor of the plurality of capacitors to a logic component, and electrically coupling the top electrode of the second capacitor to a third capacitor of the plurality of capacitors to form a series connected capacitor array.

8. A method comprising:
    forming an access transistor in a memory region of a substrate, and forming a transistor contact having a bottom surface physically contacting the access transistor and being embedded in a first dielectric layer, the first dielectric layer also surrounding a portion of the access transistor;

forming an interconnect structure over the access transistor, the interconnect structure continuing across through a first region over the substrate, the first region being a different region than the memory region, the interconnect structure comprising:

a first metallization layer embedded within a first inter-metal dielectric (IMD) layer, the first metallization layer being above and in physical contact with a topmost surface of the transistor contact, the first IMD layer being above a topmost surface of the first dielectric layer;

a second metallization layer embedded within a second IMD layer, the second IMD layer being above a topmost surface of the first IMD layer;

forming a first ferroelectric random access memory (FeRAM) memory element disposed in the memory region in a third IMD layer of the interconnect structure, the third IMD layer being different from the first IMD layer, the first FeRAM memory element including a bottom electrode having a bottommost surface that is above a topmost surface of the first metallization layer and having a top electrode having a topmost surface that is below a bottommost surface of the second metallization layer, the FeRAM being electrically coupled to the access transistor;

while forming the first FeRAM memory element, simultaneously forming one or more metal-ferroelectric insulator-metal (MFM) capacitors disposed in the first region in the first IMD layer, the one or more MFM capacitors each having a same structure as the first FeRAM memory element; and coupling a first capacitor of the one or more MFM capacitors to a device disposed over the substrate.

9. The method of claim 8, further comprising coupling a first MFM capacitor of the one or more MFM capacitors and a second MFM capacitor of the one or more MFM capacitors in series.

10. The method of claim 9, further comprising a third metallization layer embedded within a third IMD layer interjacent the first metallization layer and the second metallization layer.

11. The method of claim 10, further comprising:
forming a through via in the second IMD layer, the through via physically coupled to the first metallization layer; and
electrically coupling the through via to an upper electrode of the second MFM capacitor.

12. The method of claim 9, further comprising coupling a third MFM capacitor of the one or more MFM capacitors in series with the first MFM capacitor and the second MFM capacitor.

13. A method comprising:
forming an interconnect over a substrate, the interconnect extending over a memory access transistor disposed in the substrate and over a logic component disposed in the substrate;
forming a first metallization layer, the first metallization layer being embedded with a first dielectric layer, the first dielectric layer having a planar topmost surface;
depositing a bottom electrode on the planar topmost surface of the first dielectric layer, the bottom electrode being planar across its full extent, and being over and coupled to a first metallization layer of the interconnect;

depositing a first insulating layer over the bottom electrode, the first insulating layer comprising a ferroelectric insulating material, the first insulating layer being planar across its full extent;

depositing a top electrode over the first insulating layer the top electrode being planar across its full extent;

separating the bottom electrode, the first insulating layer, and the top electrode into a first capacitor, a second capacitor, and a third capacitor, each of the first capacitor, second capacitor, and third capacitor comprising respective portions of the bottom electrode, the first insulating layer, and the top electrode;

depositing a second insulating layer over and laterally surrounding the first capacitor, the second capacitor, and the third capacitor, the second insulating layer comprising a different material composition than the ferroelectric insulating material, wherein the first capacitor is electrically coupled to the memory access transistor; and depositing a second metallization layer over the second insulating layer, wherein portions of the second metallization layer are coupled to the top electrode of each of the first capacitor, the second capacitor, and the third capacitor, wherein the third capacitor is electrically coupled to the logic component.

14. The method of claim 13, wherein the second capacitor is series coupled to the third capacitor by way of the first metallization layer or the second metallization layer.

15. The method of claim 13, further comprising:
prior to depositing the second insulating layer, depositing a protective layer over the first capacitor, the second capacitor, and the third capacitor; and
wherein the step of separating the bottom electrode, the first insulating layer, and the top electrode into a first capacitor, a second capacitor, and a third capacitor includes patterning the top electrode first with a first patterning mask, and after patterning the top electrode, patterning the first insulating layer and the bottom electrode using a second patterning mask.

16. The method of claim 13, further comprising:
prior to separating the bottom electrode, the first insulating layer, and the top electrode into a first capacitor, a second capacitor, and a third capacitor, depositing a capping layer over the top electrode; and
separating the capping layer into a respective portion over the top electrode in each of the first capacitor, the second capacitor, and the third capacitor.

17. The method of claim 13, further comprising:
prior to depositing the second insulating layer, depositing a spacer layer over the first capacitor, the second capacitor, and the third capacitor; and
anisotropically etching the spacer layer to form vertical spacers to laterally surrounding the top electrode of each of the first capacitor, the second capacitor, and the third capacitor.

18. The method of claim 13, further comprising:
prior to depositing the bottom electrode, depositing a third insulating layer over the first metallization layer;
etching a first opening, a second opening, and a third opening in the third insulating layer, each of the first opening, the second opening, and the third opening exposing a conductive element to the first metallization layer; and depositing the bottom electrode, the first insulating layer, and the top electrode to each extend into the first opening the second opening, and the third opening, wherein separating the bottom electrode, the first insulating layer, and the top electrode into the first capacitor, the second capacitor, and the third capacitor comprises performing a planarization process to level an upper surface of the bottom electrode with an upper surface of the third insulating layer.

19. The method of claim 13, further comprising:

forming a via opening through the second insulating layer, the via opening exposing the first metallization layer; and depositing a via metal in the via opening, the via metal electrically coupling the top electrode of the third capacitor with the bottom electrode of the second capacitor.

20. The method of claim 1, wherein:

the step of depositing a bottom electrode layer over and coupled to a first metallization results in a bottom electrode layer having an outer perimeter, wherein the bottom electrode layer is planar across the entire surface defined by the outer perimeter;

the step of depositing a depositing a first insulating layer over the bottom electrode layer results in a first insulating layer having a second outer perimeter, wherein the first insulating layer is planar across the entire surface defined by the second outer perimeter; and the step of depositing a depositing a top electrode layer over the first insulating layer results in a top electrode layer having a third outer perimeter, wherein the first insulating layer is planar across the entire surface defined by the third outer perimeter.

* * * * *

UNITED STATES PATENT AND TRADEMARK OFFICE
CERTIFICATE OF CORRECTION

| | |
|---|---|
| PATENT NO. | : 12,114,509 B2 |
| APPLICATION NO. | : 17/712495 |
| DATED | : October 8, 2024 |
| INVENTOR(S) | : Tzu-Yu Chen et al. |

It is certified that error appears in the above-identified patent and that said Letters Patent is hereby corrected as shown below:

In the Claims

In Column 26, Line 21, Claim 2:
Change "the second capacitor." to --second capacitor.--

Signed and Sealed this
Twenty-sixth Day of November, 2024

Katherine Kelly Vidal
*Director of the United States Patent and Trademark Office*